US012696474B2

(12) United States Patent
Kim et al.

(10) Patent No.: US 12,696,474 B2
(45) Date of Patent: Jul. 28, 2026

(54) SEMICONDUCTOR DEVICE AND METHOD FOR MANUFACTURING THE SAME

(71) Applicant: Samsung Electronics Co., Ltd., Suwon-si (KR)

(72) Inventors: Jin Bum Kim, Suwon-si (KR); Hyo Jin Kim, Suwon-si (KR); Yong Jun Nam, Suwon-si (KR); Sang Moon Lee, Suwon-si (KR); Dong Woo Kim, Suwon-si (KR); In Geon Hwang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 706 days.

(21) Appl. No.: 17/961,818

(22) Filed: Oct. 7, 2022

(65) Prior Publication Data

US 2023/0317849 A1      Oct. 5, 2023

(30) Foreign Application Priority Data

Mar. 31, 2022      (KR) ........................ 10-2022-0040077

(51) Int. Cl.
H10D 30/62 (2025.01)
H10D 30/67 (2025.01)
(Continued)

(52) U.S. Cl.
CPC ..... H10D 30/6211 (2025.01); H10D 30/6735 (2025.01); H10D 62/151 (2025.01); H10D 62/235 (2025.01); H10D 64/017 (2025.01)

(58) Field of Classification Search
CPC .... H10D 84/017; H10D 30/62; H10D 30/501; H10D 30/792; H10D 30/798;
(Continued)

(56) References Cited

U.S. PATENT DOCUMENTS 5,274,258 A      12/1993   Ahn
10,923,598 B2    2/2021    Wang et al.
(Continued)

FOREIGN PATENT DOCUMENTS

DE      102020110169 A1    5/2021
KR      10-2017-0088115 A  8/2017
(Continued)

OTHER PUBLICATIONS

European Search Report dated Sep. 28, 2023 for corresponding European Application No. 23157598.6.
(Continued)

*Primary Examiner* — Julio J Maldonado
*Assistant Examiner* — Nathan Pridemore
(74) *Attorney, Agent, or Firm* — Harness, Dickey & Pierce, P.L.C.

(57)      ABSTRACT

A semiconductor device includes a lower pattern extending in a first direction, and protruding from a substrate in a second direction, a lower insulating pattern on the lower pattern, and in contact with an upper surface of the lower pattern, a channel pattern on the lower insulating pattern, a plurality of gate structures on the lower pattern and spaced apart from each other in the first direction, wherein each of the plurality of gate structures includes a gate electrode and a gate insulating film, and a source/drain pattern disposed on the lower pattern, and connected to the channel pattern. A vertical level of a lowermost portion of the source/drain pattern is lower than a vertical level of a bottom surface of the lower insulating pattern. The gate electrode overlaps the lower insulating pattern in the second direction.

20 Claims, 60 Drawing Sheets

(51) Int. Cl.
  *H10D 62/13* (2025.01)
  *H10D 62/17* (2025.01)
  *H10D 64/01* (2025.01)
(58) Field of Classification Search
  CPC ............. H10D 30/506; H10D 30/6211; H10D 62/151; H10D 62/235; H10D 64/017; H10D 30/6735; H10D 30/014; H10D 30/43; H10D 62/364; H10D 84/0133; H10D 30/6757; H10D 64/256; H10D 62/126; H10D 62/121; H10D 62/116; H10D 84/038; H10D 84/0167; H10D 84/0172; H10D 84/0193; H10D 84/856; H10D 84/0144; H10D 84/0181; H10D 84/0188; H10D 84/85; H10D 30/60; H10D 30/797; H10D 62/021; H10D 62/13; H10D 62/149; H10D 62/371; B82Y 10/00
  See application file for complete search history.

(56) References Cited

U.S. PATENT DOCUMENTS

| | | |
|---|---|---|
| 11,145,765 B2 | 10/2021 | Chung et al. |
| 11,201,225 B2 | 12/2021 | Chiang et al. |

| | | | |
|---|---|---|---|
| 2018/0158952 A1 | 6/2018 | Balakrishnan et al. | |
| 2020/0083219 A1 | 3/2020 | Kang et al. | |
| 2020/0251593 A1* | 8/2020 | Miao | H10D 30/62 |
| 2020/0303521 A1* | 9/2020 | Son | H10D 62/121 |
| 2021/0098311 A1* | 4/2021 | Lin | H10D 84/853 |
| 2021/0135008 A1* | 5/2021 | Chiang | H10D 62/121 |
| 2021/0135011 A1* | 5/2021 | Ju | H01L 21/31055 |
| 2021/0343578 A1 | 11/2021 | Chang et al. | |
| 2021/0376093 A1* | 12/2021 | Chu | H10D 62/121 |

FOREIGN PATENT DOCUMENTS

| | | |
|---|---|---|
| KR | 10-2021-0053158 A | 5/2021 |
| KR | 10-2021-0053161 A | 5/2021 |
| KR | 10-2021-0098309 A | 8/2021 |

OTHER PUBLICATIONS

European Office Action dated Oct. 10, 2023 for corresponding European Application No. 23157598.6.
Office Action dated Oct. 21, 2025 for corresponding Korean Patent Application No. 10-2022-0040077 and English translation thereof.

\* cited by examiner

120_HM
120P
130P
ACT_L
SC_L
ACT_L
SC_L
ACT_L
SC_L
} U_AP
ACT_DL
BBF
BP1
105
100

E                    E

D3
D2
D1

120_HM
120P
130P
ACT_L
SC_L
ACT_L
SC_L
ACT_L
SC_L
ACT_DL
110_V
BP1
105
100

ACT_L

SC_L

ACT_L

SC_L

ACT_L

SC_L

ACT_DL

110P

BP1

105

100

U_AP

A

A

D3

D1

D2

120_HM
120P
130P
ACT_L
SC_L
ACT_L
SC_L
ACT_L
SC_L
ACT_DL
110P
BP1
105
100

ACT_L
SC_L
ACT_L
SC_L
ACT_L
SC_L
ACT_DL
BBF
BP1
105
100

U_AP

F            F

D3
D2
D1

SEMICONDUCTOR DEVICE AND METHOD FOR MANUFACTURING THE SAME

CROSS-REFERENCE TO RELATED APPLICATION

This application claims priority from Korean Patent Application No. 10-2022-0040077 filed on Mar. 31, 2022 in the Korean Intellectual Property Office, and all the benefits accruing therefrom under 35 U.S.C. 119, the contents of which in its entirety are herein incorporated by reference.

BACKGROUND

Technical Field

The present inventive concepts relate to semiconductor devices and methods for manufacturing the same.

Description of Related Art

One of scaling schemes for increasing a density of a semiconductor device includes a multi gate transistor in which a multi-channel active pattern (or silicon body) in a shape of a fin or a nanowire is formed on a substrate and a gate is formed on a surface of the multi-channel active pattern.

Because the multi-gate transistor uses a three-dimensional channel, it is easy to scale the multi-gate transistor. Further, current control ability of the multi-gate transistor may be improved without increasing a gate length of the multi-gate transistor. In addition, the multi-gate transistor may effectively suppress SCE (short channel effect) in which a potential of a channel area is affected by a drain voltage.

SUMMARY

Some example embodiments of the inventive concepts provide a semiconductor device capable of improving element performance and reliability.

Some example embodiments of the inventive concepts provide a method for manufacturing a semiconductor device capable of improving element performance and reliability.

The present inventive concepts are not limited to the above-mentioned example embodiments. Some purposes and advantages according to the present inventive concepts that are not mentioned may be understood based on following descriptions, and may be more clearly understood based on some example embodiments according to the present inventive concepts. Further, it will be easily understood that some purposes and advantages according to some example embodiments of the present inventive concepts may be realized using means shown in the claims and combinations thereof.

According to some example embodiments of the present inventive concepts, a semiconductor device may include a lower pattern extending in a first direction, and protruding from a substrate in a second direction, a lower insulating pattern on the lower pattern, and in contact with an upper surface of the lower pattern, a channel pattern on the lower insulating pattern, a plurality of gate structures on the lower pattern and spaced apart from each other in the first direction, wherein each of the plurality of gate structures includes a gate electrode and a gate insulating film, and a source/drain pattern on the lower pattern, and connected to the channel pattern. The first direction may extend in parallel to the substrate, and the second direction may extend perpendicular to the substrate. A vertical level of a lowermost portion of the source/drain pattern may be lower than a vertical level of a bottom surface of the lower insulating pattern. The gate electrode may overlap the lower insulating pattern in the second direction.

According to some example embodiments of the present inventive concepts, a semiconductor device may include a lower pattern extending in a first direction, a field insulating film covering a sidewall of the lower pattern, a lower insulating pattern on the lower pattern, and in contact with an upper surface of the lower pattern, wherein a vertical level of a bottom surface of the lower insulating pattern is higher than a vertical level of an upper surface of the field insulating film, a plurality of sheet patterns disposed on the lower insulating pattern and arranged in a second direction that extends perpendicular to the first direction, a plurality of gate structures on the lower pattern and spaced apart from each other in the first direction, wherein each of the plurality of gate structures includes a gate electrode and a gate insulating film, and a source/drain pattern between adjacent gate structures of the plurality of gate structure. A width of the upper surface of the lower pattern in a third direction may be greater than or equal to a width of an upper surface of the lower insulating pattern in the third direction, the third direction extending parallel to the lower pattern and extending perpendicular to both the first direction and the second direction. The gate electrode may overlap the lower insulating pattern in the second direction.

According to some example embodiments of the present inventive concepts, a semiconductor device may include a first lower pattern in an area in which a PMOS (p-channel metal oxide semiconductor) is formed, wherein the first lower pattern extends in a first direction, a second lower pattern in an area in which a NMOS (n-channel metal oxide semiconductor) is formed, wherein the second lower pattern extends in the first direction and is spaced from the first lower pattern in a second direction, a first lower insulating pattern on the first lower pattern, and in contact with an upper surface of the first lower pattern, a second lower insulating pattern on the second lower pattern, and in contact with an upper surface of the second lower pattern, a plurality of first sheet patterns on the first lower insulating pattern and arranged in a third direction, a plurality of second sheet pattern on the second lower insulating pattern and arranged in the third direction, a plurality of gate structures on the first lower pattern and the second lower pattern, and spaced apart from each other in the first direction, wherein each of the plurality of gate structures includes a gate electrode and a gate insulating film, a first source/drain pattern on the first lower pattern, and connected to the first sheet patterns, and a second source/drain pattern on the second lower pattern, and connected to the plurality of second sheet patterns. A width of the first lower insulating pattern in the first direction may be smaller than or equal to a width of the second lower insulating pattern in the first direction. The second direction may extend perpendicular to the first direction, and the third direction may extend perpendicular to both the first direction and the second direction According to some example embodiments of the present inventive concepts, a method for fabricating a semiconductor device may include forming a lower pattern, a lower buffer pattern and an upper pattern structure on a substrate, wherein the upper pattern structure includes a plurality of sacrificial patterns and a plurality of active patterns stacked alternately with each other, wherein the lower buffer pattern is between the lower pattern and the upper pattern structure, forming a plurality of dummy gate electrodes on the upper pattern structure, after forming the plurality of dummy gate electrodes, replacing the lower buffer pattern with a lower insulating line pattern, forming a gate spacer on the plurality of dummy gate electrodes to form a dummy gate structure, forming a source/drain recess in the upper pattern structure and the lower insulating line pattern using the dummy gate structure as a mask, wherein a bottom surface of the source/drain recess is defined by the lower pattern, forming a source/drain pattern filling the source/drain recess and connected to the plurality of active patterns, and after forming the source/drain pattern, removing the plurality of sacrificial patterns to form a sheet pattern connected to the source/drain pattern.

BRIEF DESCRIPTION OF DRAWINGS

The above and other aspects and features of the present inventive concepts will become more apparent by describing in detail illustrative embodiments thereof with reference to the attached drawings, in which:

FIGS. 34, 35, 36, 37, 38, 39, 40, 41, 42, 43, 44, 45, 46, 47, 48, 49, and 50 are diagrams of structures of intermediate steps for illustrating a method for manufacturing a semiconductor device according to some example embodiments;

DETAILED DESCRIPTION

Figure 1:
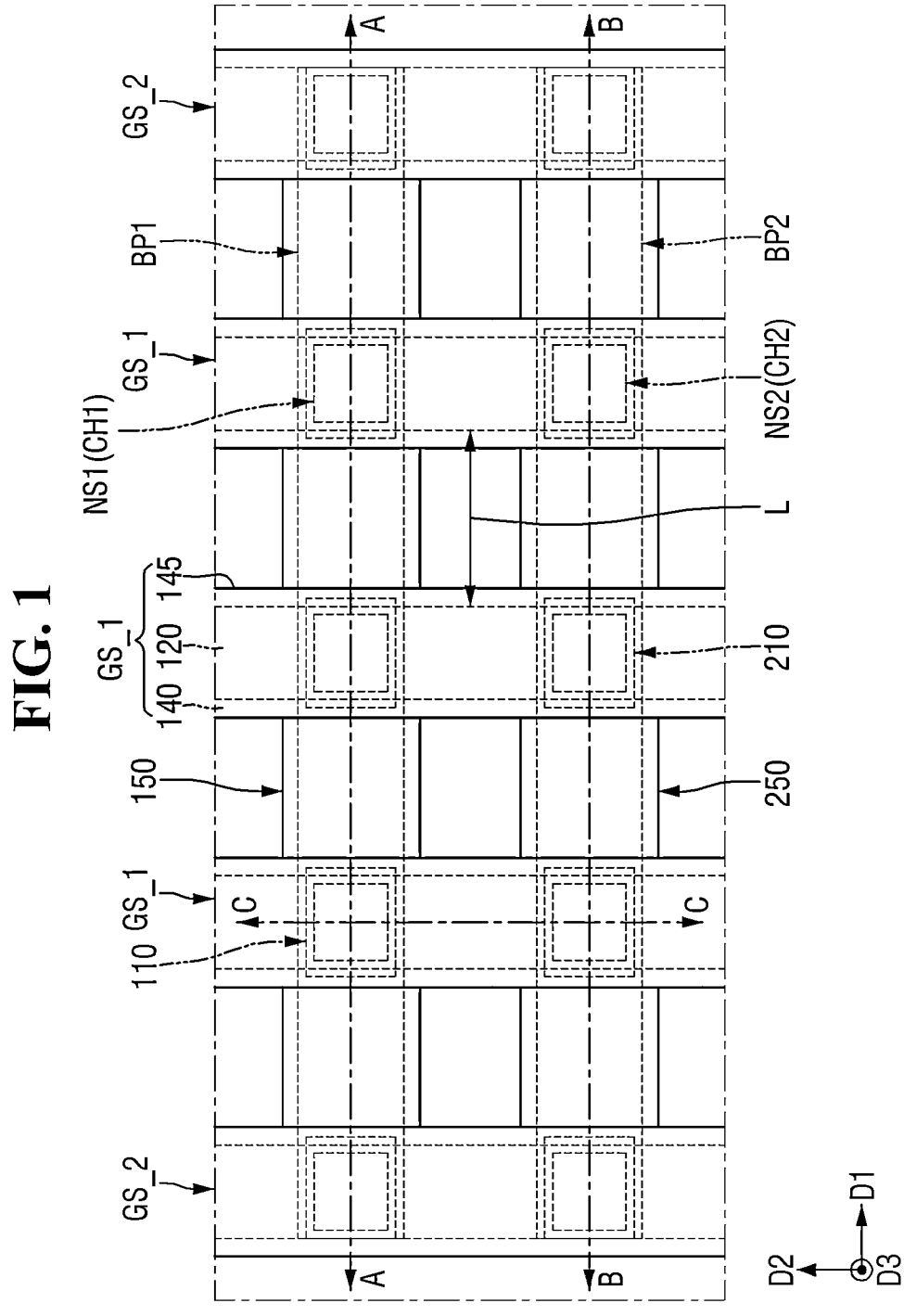
FIG. 1 is a schematic plan view for illustrating a semiconductor device according to some example embodiments.

Hereinafter, some example embodiments will be described in detail with reference to the accompanying drawings.

It will be understood that when an element is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, when an operation is described to be performed "by" performing additional operations, it will be understood that the operation may be performed "based on" the additional operations, which may include performing said additional operations alone or in combination with other further additional operations.

As described herein, an element that is described to be "spaced apart" from another element, in general and/or in a particular direction (e.g., vertically spaced apart, laterally spaced apart, etc.) and/or described to be "separated from" the other element, may be understood to be isolated from direct contact with the other element, in general and/or in the particular direction (e.g., isolated from direct contact with the other element in a vertical direction, isolated from direct contact with the other element in a lateral or horizontal direction, etc.). Similarly, elements that are described to be "spaced apart" from each other, in general and/or in a particular direction (e.g., vertically spaced apart, laterally spaced apart, etc.) and/or are described to be "separated" from each other, may be understood to be isolated from direct contact with each other, in general and/or in the particular direction (e.g., isolated from direct contact with each other in a vertical direction, isolated from direct contact with each other in a lateral or horizontal direction, etc.).

In the drawings related to a semiconductor device according to some example embodiments, for example, a fin-type transistor (FinFET) including a channel area of a fin-type pattern shape and a transistor including a nano wire or a nano sheet are illustrated. However, the present inventive concepts are not limited thereto. The technical idea of the present inventive concepts may be applied to a transistor (2D material based FET) based on 2D material and a heterostructure thereof.

Further, the semiconductor device according to some example embodiments may include a tunneling transistor (tunneling FET) or a three-dimensional (3D) transistor. The semiconductor device according to some example embodiments may include a bipolar junction transistor, a lateral double diffusion transistor (LDMOS), and the like.

Referring to FIG. 1 to FIG. 7, a description of a semiconductor device according to some example embodiments will be made.

Figure 2:
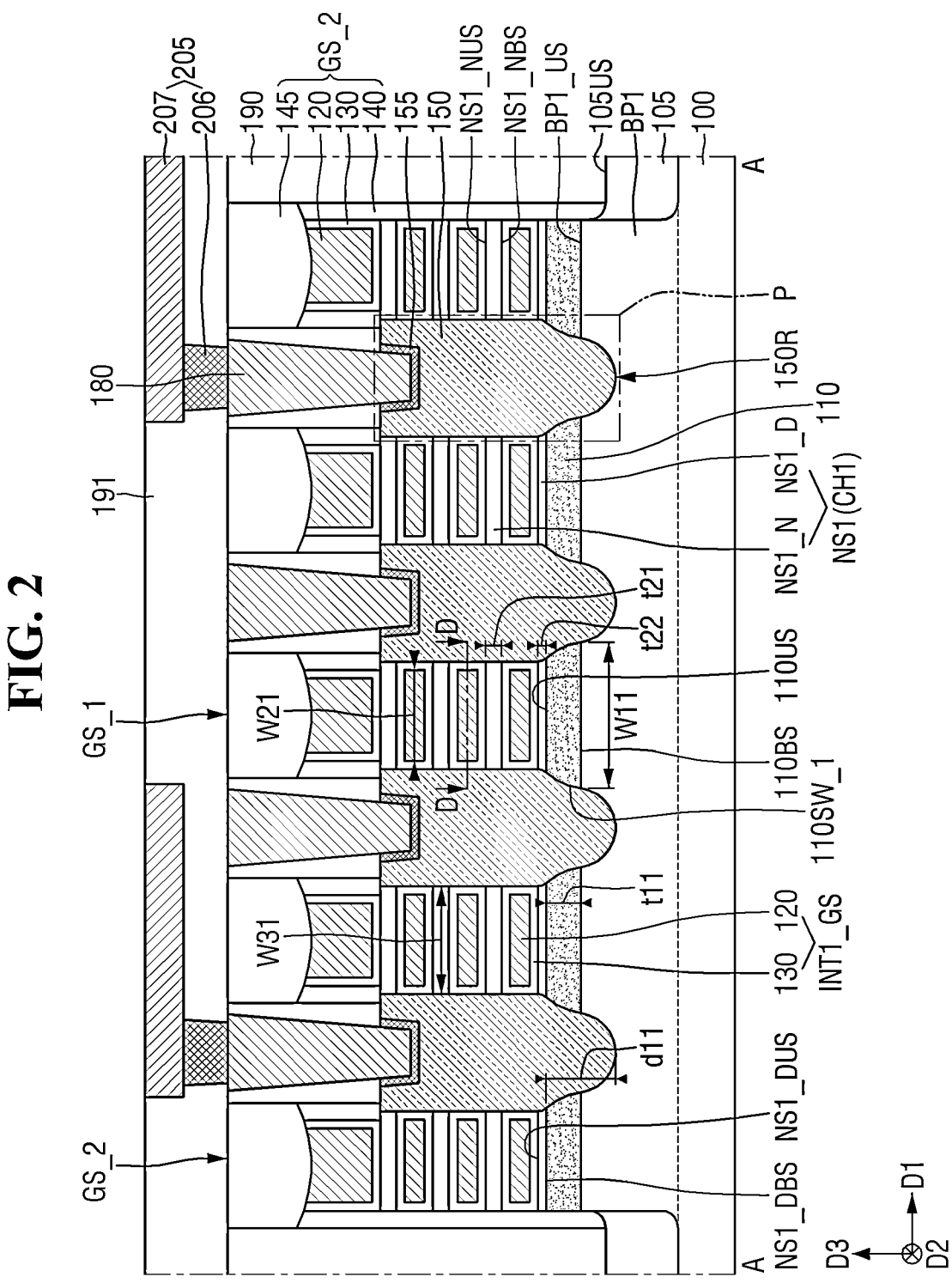
FIGS. 2, 3, and 4 are cross-sectional views taken along cross-sectional view lines A-A, B-B, and C-C of FIG. 1, respectively.
Figure 3:
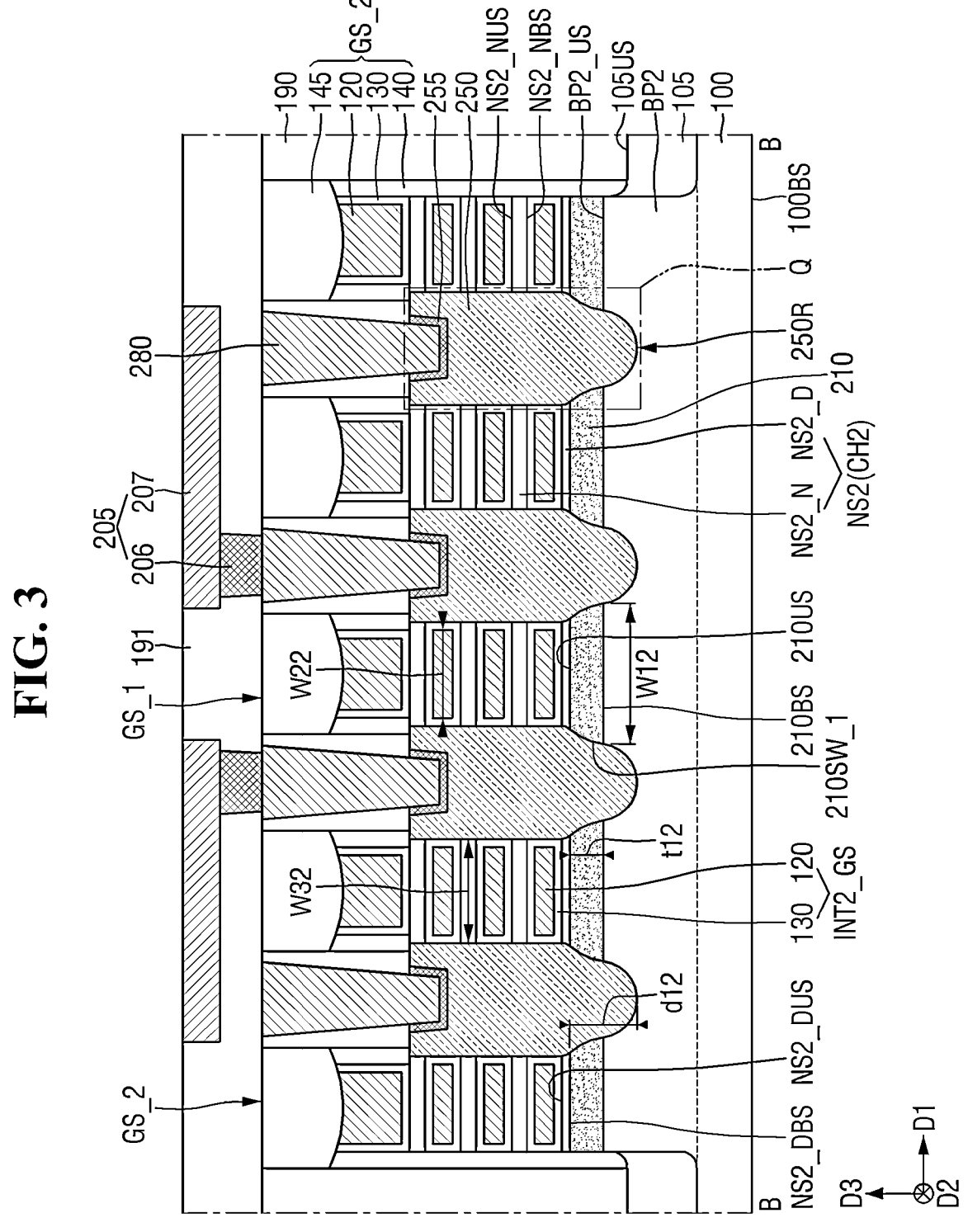
Figure 4:
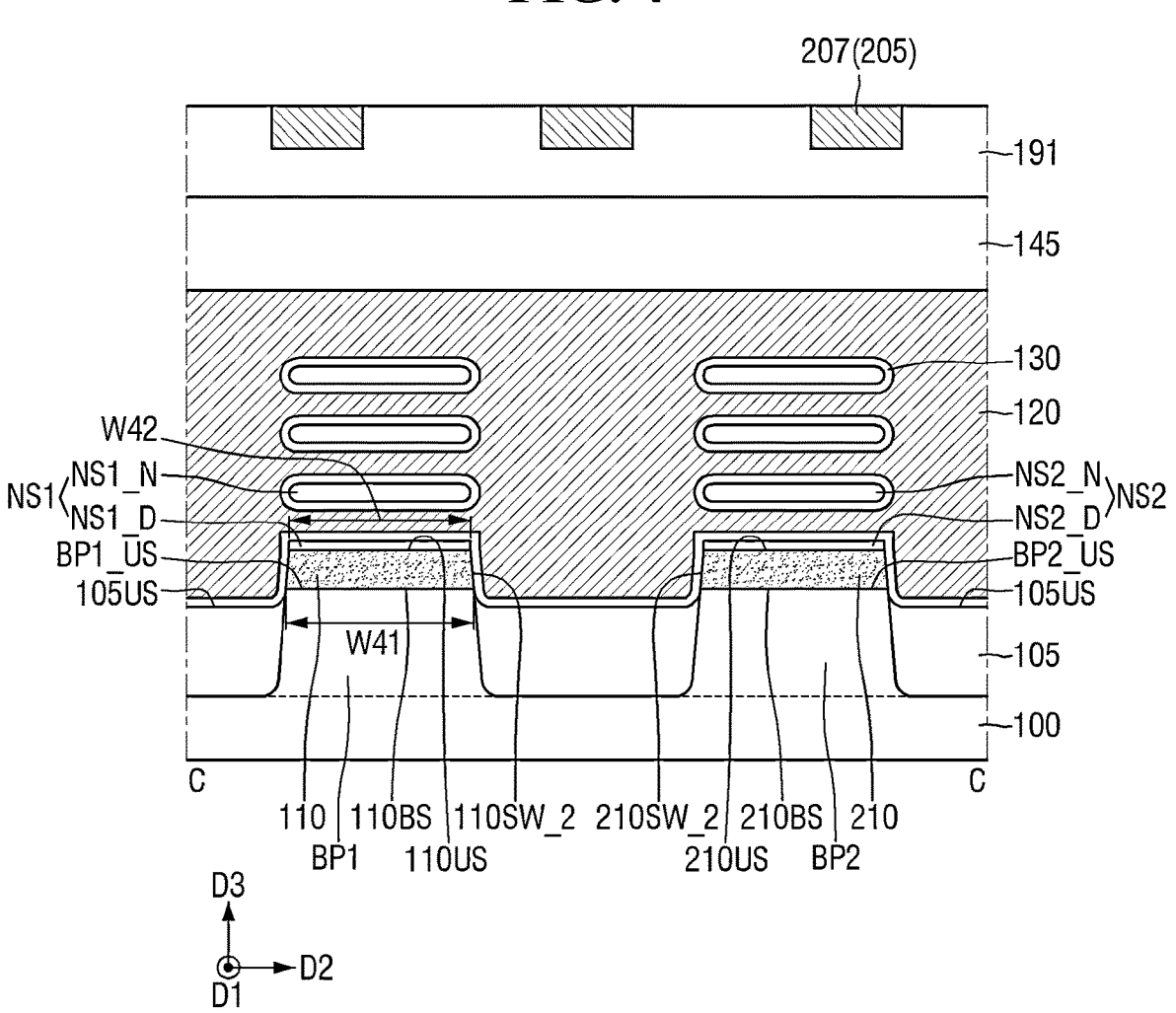
Figure 5:
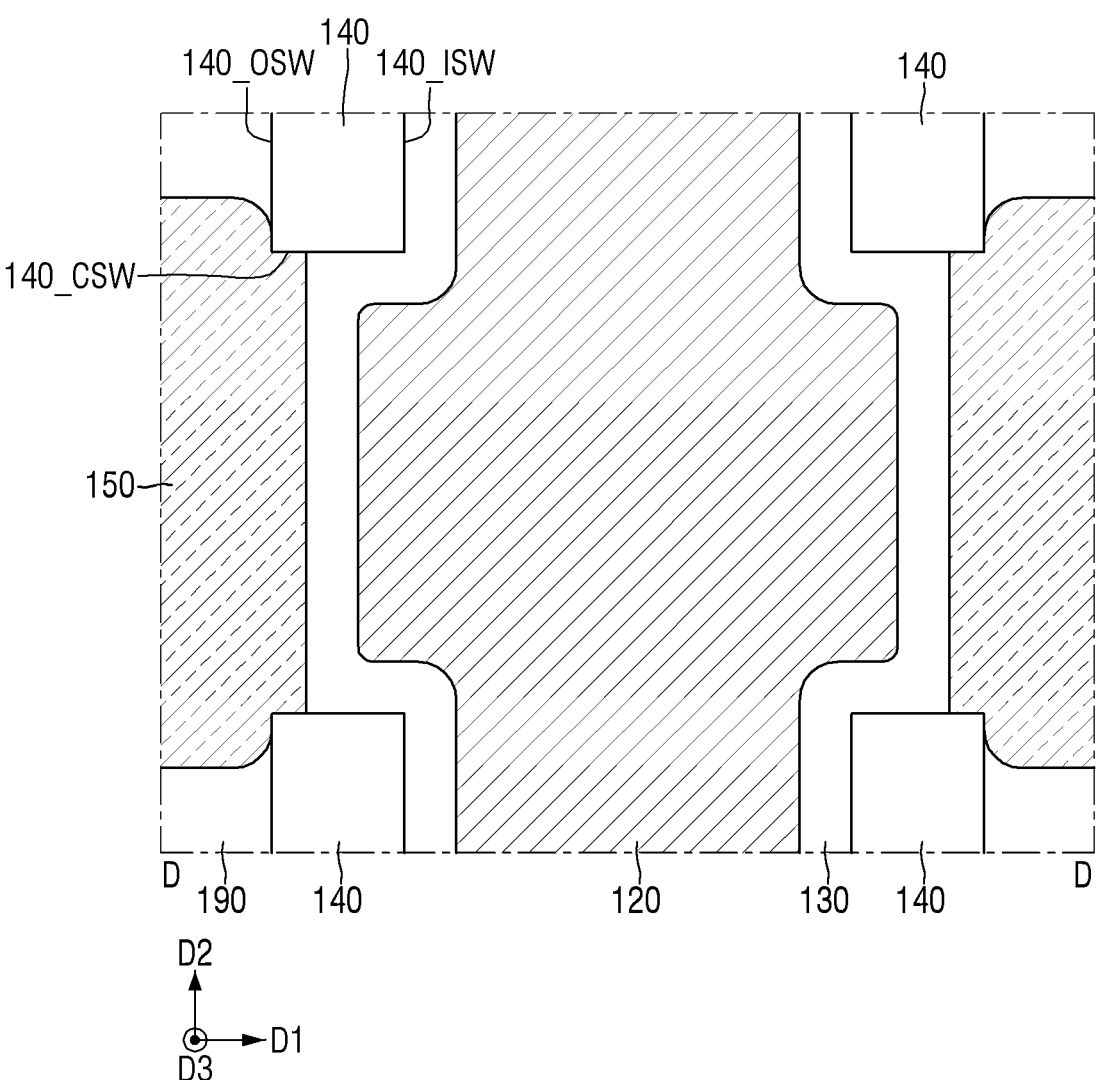
FIG. 5 is a top view of a portion as cut along cross-sectional view line D-D of FIG. 2.
Figure 6:
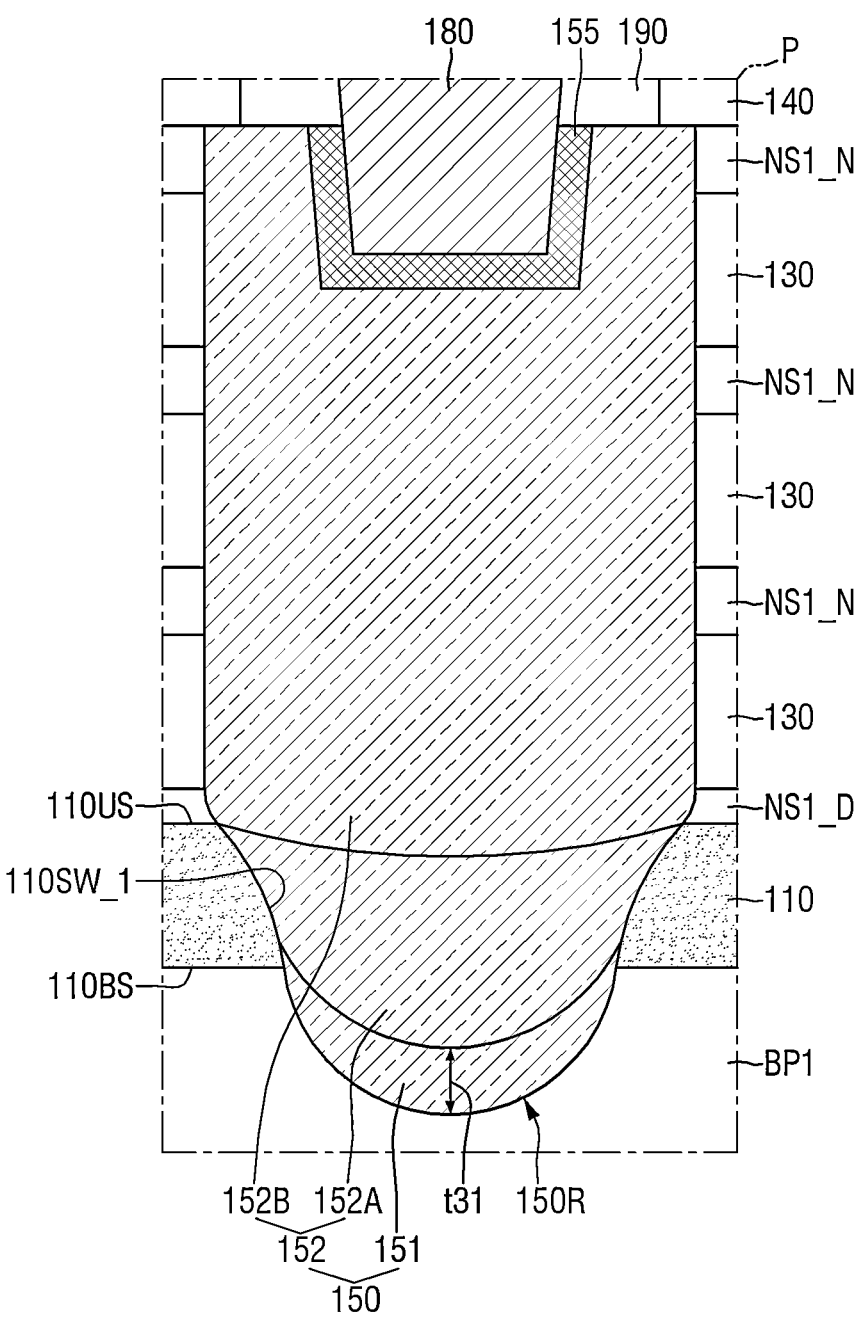
FIG. 6 is an enlarged view of region P of FIG. 2.
Figure 7:
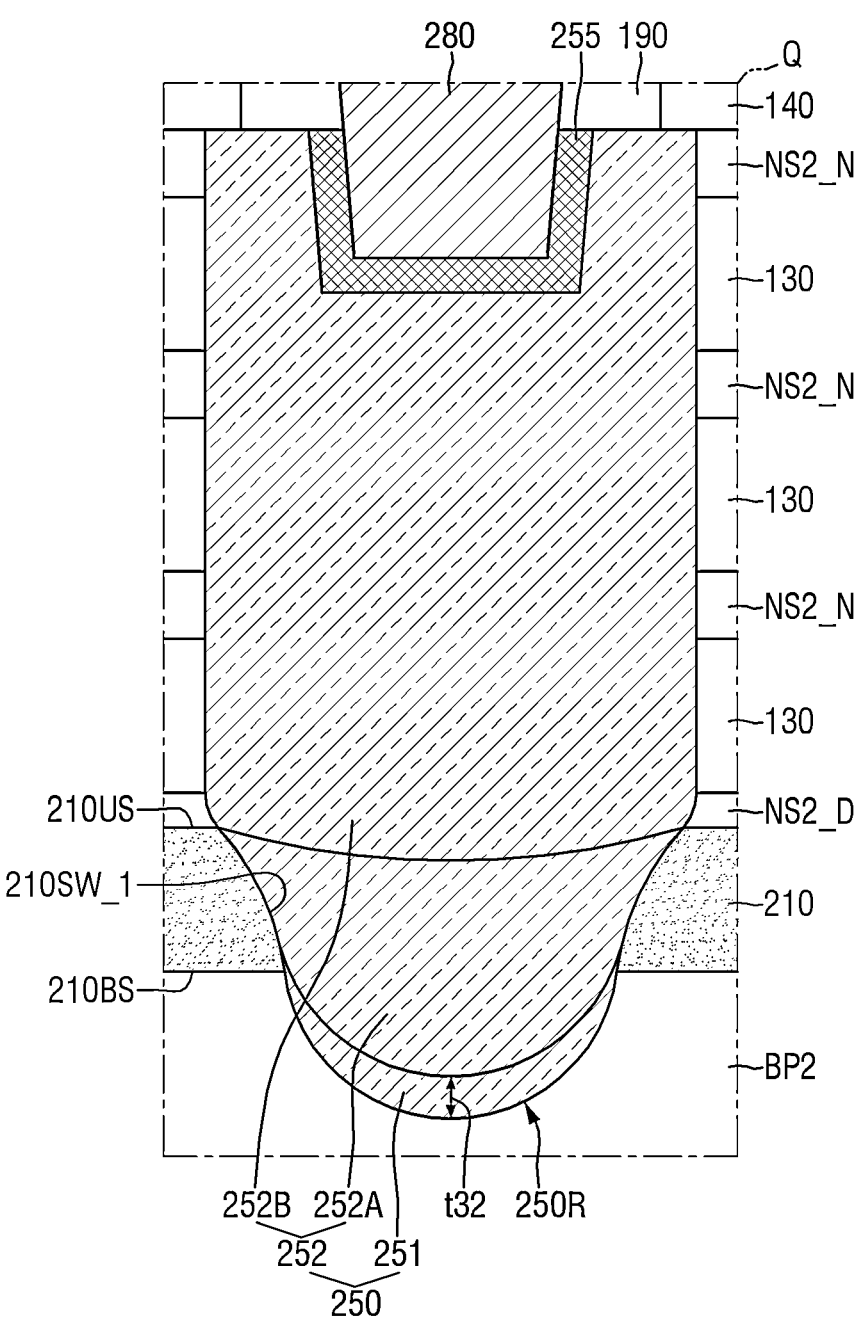
FIG. 7 is an enlarged view of region Q of FIG. 3.

FIG. 1 is a schematic plan view for illustrating a semiconductor device according to some example embodiments. FIGS. 2, 3, and 4 are cross-sectional views taken along A-A, B-B and C-C of FIG. 1, respectively. FIG. 5 is a top view of a portion as cut along D-D of FIG. 2. FIG. 6 is an enlarged view of region P of FIG. 2. FIG. 7 is an enlarged view of region Q of FIG. 3.

For reference, in FIG. 1, a gate insulating film 130, an interlayer insulating film 190, 191, and a wire structure 205 are omitted for a schematic view.

Referring to FIG. 1 to FIG. 7, the semiconductor device according to some example embodiments may include a substrate 100, a first lower pattern BP1, a second lower pattern BP2, a first channel pattern CH1, a second channel pattern CH2, a first lower insulating pattern 110, a second lower insulating pattern 210, a plurality of gate structures GS_1 and GS_2, a first source/drain pattern 150 and a second source/drain pattern 250.

The substrate 100 may be made of a bulk silicon or SOI (silicon-on-insulator). Alternatively, the substrate 100 may be embodied as a silicon substrate, or may be made of a material other than silicon, such as silicon germanium, SGOI (silicon germanium on insulator), indium antimonide, lead telluride, indium arsenide, indium phosphide, gallium arsenide or gallium antimonide. However, the inventive concepts may not be limited thereto.

The first lower pattern BP1 may protrude from the substrate 100 in the third direction D3. The first lower pattern BP1 may extend in the first direction D1. The first lower pattern BP1 includes a long-side extending in the first direction D1 and a short-side extending in the second direction D2. A terminating end of the first lower pattern BP1 may include a short-side of the first lower pattern BP1.

The second lower pattern BP2 may protrude from the substrate 100 in the third direction D3. The second lower pattern BP2 may extend in the first direction D1. The second lower pattern BP2 may be spaced apart from the first lower pattern BP1 in the second direction D2. A terminating end of the second lower pattern BP2 may include a short-side of the second lower pattern BP2.

For example, the first lower pattern BP1 may be disposed in an area in which PMOS is formed. The second lower pattern BP2 may be disposed in an area in which NMOS is formed.

Each of the first lower pattern BP1 and the second lower pattern BP2 may be formed by etching a portion of the substrate 100, or may include an epitaxial layer grown from the substrate 100. Each of the first lower pattern BP1 and the second lower pattern BP2 may include silicon or germanium as an elemental semiconductor material. Further, each of the first lower pattern BP1 and the second lower pattern BP2 may include a compound semiconductor, for example, a group IV-IV compound semiconductor or a group III-V compound semiconductor. In some example embodiments, each of the first lower pattern BP1 and the second lower pattern BP2 may be referred to as a lower semiconductor pattern.

The group IV-IV compound semiconductor may include, for example, a binary compound including two of carbon (C), silicon (Si), germanium (Ge), and tin (Sn), a ternary compound including three thereof, or a compound obtained by doping a group IV element thereto.

The group III-V compound semiconductor may include, for example, a binary compound obtained by combining one of aluminum (Al), gallium (Ga), and indium (In) as a group III element and one of phosphorus (P), arsenic (As), and antimony (Sb) as a group V element with each other, a ternary compound obtained by combining two of aluminum (Al), gallium (Ga), and indium (In) as a group III element and one of phosphorus (P), arsenic (As), and antimony (Sb) as a group V with each other, or a quaternary compound obtained by combining three of aluminum (Al), gallium (Ga), and indium (In) as a group III element and one of phosphorus (P), arsenic (As), and antimony (Sb) as a group V with each other.

A field insulating film 105 may be formed on the substrate 100. The field insulating film 105 may be disposed on a sidewall of the first lower pattern BP1. The field insulating film 105 may be disposed on a sidewall of the second lower pattern BP2. The field insulating film 105 is not disposed on an upper surface BP1_US of the first lower pattern and an upper surface BP2_US of the second lower pattern.

In one example, the field insulating film 105 may cover a portion of the sidewall of the first lower pattern BP1 and a portion of the sidewall of the second lower pattern BP2. In this case, a portion of the first lower pattern BP1 may protrude in the third direction D3 beyond an upper surface 105US of the field insulating film.

Unlike what is illustrated, the field insulating film 105 may cover an entirety of the sidewall of the first lower pattern BP1 and/or an entirety of the sidewall of the second lower pattern BP2.

The upper surface 105US of the field insulating film may have a concave shape. However, the present inventive concepts are not limited thereto. The field insulating film 105 may include, for example, an oxide film, a nitride film, an oxynitride film, or a combination film thereof. Although the field insulating film 105 is shown as a single film, this is only for convenience of illustration. However, the inventive concepts are not limited thereto.

The first lower insulating pattern 110 is disposed on the first lower pattern BP1. The first lower insulating pattern 110 is disposed on the upper surface BP1_US of the first lower pattern. The first lower insulating pattern 110 may contact the upper surface BP1_US of the first lower pattern.

The first lower insulating pattern 110 includes an upper surface 110US and a bottom surface 110BS. The bottom surface 110BS of the first lower insulating pattern faces the upper surface BP1_US of the first lower pattern. The bottom surface 110BS of the first lower insulating pattern may contact the upper surface BP1_US of the first lower pattern. The upper surface 110US of the first lower insulating pattern is opposite to the bottom surface 110BS of the first lower insulating pattern in the third direction D3. For example, in FIG. 2, the upper surface BP1_US of the first lower pattern contacts the bottom surface 110BS of the first lower insulating pattern.

In some example embodiments, the first direction D1 may be understood to be a direction extending parallel to at least the substrate 100 (e.g., extending parallel to the bottom surface 100BS of the substrate 100), the first and/or second lower patterns BP1 and/or BP2 (e.g., extending parallel to the upper surfaces BP1_US and/or BP2_US), or the like. In some example embodiments, the second direction D2 may be understood to be a direction extending parallel to at least the substrate 100 (e.g., extending parallel to the bottom surface 100BS of the substrate 100) and extending perpendicular to the first direction D1. In some example embodiments, the third direction D3 may be understood to be a direction extending perpendicular to at least the substrate 100 (e.g., extending perpendicular to the bottom surface 100BS of the substrate 100), the first and/or second lower patterns BP1 and/or BP2 (e.g., extending parallel to the upper surfaces BP1_US and/or BP2_US), or the like, and thus extending perpendicular to both the first direction D1 and the second direction D2.

The first lower insulating pattern 110 includes first sidewalls 110SW_1 opposite to the first direction D1. The first lower insulating pattern 110 includes second sidewalls 110SW_2 opposite to the second direction D2.

The second lower insulating pattern 210 is disposed on the second lower pattern BP2. The second lower insulating pattern 210 is disposed on the upper surface BP2_US of the second lower pattern. The second lower insulating pattern 210 may contact the upper surface BP2_US of the second lower pattern. The second lower insulating pattern 210 is spatially spaced from the first lower insulating pattern 110.

The second lower insulating pattern 210 includes an upper surface 210US and a bottom surface 210BS. The bottom surface 210BS of the second lower insulating pattern faces the upper surface BP2_US of the second lower pattern. The bottom surface 210BS of the second lower insulating pattern may contact the upper surface BP2_US of the second lower pattern.

The second lower insulating pattern 210 includes first sidewalls 210SW_1 opposite to the first direction D1. The second lower insulating pattern 210 includes second sidewalls 210SW_2 opposite to the second direction D2.

For example, a vertical level of each of the bottom surface 110BS of the first lower insulating pattern and the bottom surface 210BS of the second lower insulating pattern may be higher than that of the upper surface 105US of the field insulating film.

In the present specification, the term 'level', 'vertical level', 'depth', 'height', or the like may mean a vertical height (e.g., vertical distance) measured from a reference location (e.g., the bottom surface 100BS of the substrate 100, the upper surface BP1_US of the first lower pattern BP1, etc.) in a direction perpendicular to the plane or surface at the reference location (e.g., a direction perpendicular to the bottom surface 100BS of the substrate 100, the upper surface BP1_US of the first lower pattern BP1, etc.), for example, a distance from the reference location in the third direction D3. For example, where a vertical level of a first element is described herein to be lower than a vertical level of a second element, it will be understood that the distance of the first element from the reference location in the vertical direction may be smaller than the distance of the second element from the reference location in the vertical direction. In the present specification, the term 'width' may mean a width (or length) measured in a direction parallel to the reference location (e.g., the bottom surface 100BS of the substrate 100, the upper surface BP1_US of the first lower pattern BP1, etc.), for example in the first direction D1 and/or the second direction D2.

Based on a bottom surface of a fin trench defining a sidewall of the first lower pattern BP1, a height of the bottom surface 110BS of the first lower insulating pattern and a height of the bottom surface 210BS of the second lower insulating pattern may be greater than a height of the upper surface 105US of the field insulating film. The field insulating film 105 does not cover the second sidewalls 110SW_2 of the first lower insulating pattern and the second sidewalls 210SW_2 of the second lower insulating pattern. Unlike what is illustrated, the height of the bottom surface 110BS of the first lower insulating pattern and the height of the bottom surface 210BS of the second lower insulating pattern may be equal to the height of the upper surface 105US of the field insulating film.

For example, a width of the upper surface 110US of the first lower insulating pattern in the first direction D1 may be smaller than a width of the bottom surface 110BS of the first lower insulating pattern in the first direction D1. In one example, a width of the first lower insulating pattern 110 in the first direction D1 may increase as it moves away from the upper surface 110US of the first lower insulating pattern. In another example, unlike what is illustrated, the width of the first lower insulating pattern 110 in the first direction D1 may increase and then be constant in the direction away from the upper surface 110US of the first lower insulating pattern. Descriptions regarding a width of the second lower insulating pattern 210 in the first direction D1 may be substantially the same as the descriptions regarding that of the first lower insulating pattern 110.

The first lower insulating pattern 110 may not protrude in the second direction D2 beyond the first lower pattern BP1. The second sidewall 110SW_2 of the first lower insulating pattern may not protrude in the second direction D2 beyond a sidewall of the first lower pattern BP1. The first lower insulating pattern 110 may not extend along the upper surface 105US of the field insulating film. That is, the first lower insulating pattern 110 may not cover the upper surface 105US of the field insulating film. The second lower insulating pattern 210 may not protrude in the second direction D2 beyond the second lower pattern BP2.

In one example, a width of the upper surface 110US of the first lower insulating pattern in the second direction D2 may be smaller than a width of the bottom surface 110BS of the first lower insulating pattern in the second direction D2. A width W41 of the upper surface BP1_US of the first lower pattern in the second direction D2 is greater than a width W42 of the upper surface 110US of the first lower insulating pattern in the second direction D2. In another example, unlike what is illustrated, the width of the upper surface 110US of the first lower insulating pattern in the second direction D2 may be equal to the width of the bottom surface 110BS of the first lower insulating pattern in the second direction D2. The width W41 of the upper surface BP1_US of the first lower pattern in the second direction D2 is equal to the width W42 of the upper surface 110US of the first lower insulating pattern in the second direction D2. Descriptions regarding the width of the second lower insulating pattern 210 in the second direction D2 may be substantially the same as the descriptions regarding that of the first lower insulating pattern 110.

A thickness t11 of the first lower insulating pattern 110 may be equal to a thickness t12 of the second lower insulating pattern 210. A width W11 of the first lower insulating pattern 110 in the first direction D1 may be smaller than or equal to a width W12 of the second lower insulating pattern 210 in the first direction D1. Taking the first lower insulating pattern 110 as an example, the width W11 of the first lower insulating pattern 110 in the first direction D1 may be a width of the bottom surface 110BS of the first lower insulating pattern in the first direction D1.

Each of the first lower insulating pattern 110 and the second lower insulating pattern 210 includes an insulating material. The first lower insulating pattern 110 and the second lower insulating pattern 210 include the same material. Each of the first lower insulating pattern 110 and the second lower insulating pattern 210 may include, for example, at least one of silicon nitride (SiN), silicon oxynitride (SiON), silicon carbonitride (SiCN), silicon oxycarbonitride (SiOCN), and combinations thereof. Alternatively, each of the first lower insulating pattern 110 and the second lower insulating pattern 210 may include silicon oxide. In a following description, an example in which each of the first lower insulating pattern 110 and the second lower insulating pattern 210 includes silicon nitride is described.

The first channel pattern CH1 may be disposed on the first lower insulating pattern 110. The first channel pattern CH1 may overlap with the first lower insulating pattern 110 in the third direction D3. The second channel pattern CH1 may be disposed on the second lower insulating pattern 210. The second channel pattern CH2 may overlap with the second lower insulating pattern 210 in the third direction D3.

For example, the first channel pattern CH1 is included in a channel area of the PMOS. The second channel pattern CH2 is included in a channel area of the NMOS.

In the semiconductor device according to some example embodiments, each of the first channel pattern CH1 and the second channel pattern CH2 may include a plurality of sheet patterns spaced apart from each other in the third direction D3.

The first channel pattern CH1 may include a plurality of first sheet patterns NS1. The plurality of first sheet patterns NS1 may be disposed on the upper surface 110US of the first lower insulating pattern. The plurality of first sheet patterns NS1 are arranged in the third direction D3 while being disposed on the first lower insulating pattern 110. The first sheet patterns NS1 are spaced apart from each other in the third direction D3.

The plurality of first sheet patterns NS1 may include a first dummy sheet pattern NS1_D and a plurality of first normal sheet patterns NS1_N. The plurality of first normal sheet patterns NS1_N may be spaced apart from the first dummy sheet pattern NS1_D in the third direction D3. The first normal sheet patterns NS1_N may be spaced apart from each other in the third direction D3.

The first dummy sheet pattern NS1_D may contact the first lower insulating pattern 110. The first dummy sheet pattern NS1_D may contact the upper surface 110US of the first lower insulating pattern. The first dummy sheet pattern NS1_D includes an upper surface NS1_DUS and a bottom surface NS1_DBS. The upper surface NS1_DBS of the first dummy sheet pattern may contact the upper surface 110US of the first lower insulating pattern.

The plurality of first normal sheet patterns NS1_N are disposed on the upper surface NS1_DUS of the first dummy sheet pattern. Each of the first normal sheet patterns NS1_N includes an upper surface NS1_NUS and a bottom surface NS1_NBS.

The second channel pattern CH2 may include a plurality of second sheet patterns NS2. The plurality of second sheet patterns NS2 may be disposed on the upper surface 210US of the second lower insulating pattern. The plurality of second sheet patterns NS2 are arranged in the third direction D3 while being disposed on the second lower insulating pattern 210. The second sheet patterns NS2 are spaced apart from each other in the third direction D3.

The plurality of second sheet patterns NS2 may include a second dummy sheet pattern NS2_D and a plurality of second normal sheet patterns NS2_N. The plurality of second normal sheet patterns NS2_N may be spaced apart from the second dummy sheet pattern NS2_D in the third direction D3. The second normal sheet patterns NS2_N may be spaced apart from each other in the third direction D3.

The second dummy sheet pattern NS2_D may contact the second lower insulating pattern 210. The second dummy sheet pattern NS2_D may contact the upper surface 210US of the second lower insulating pattern. The second dummy sheet pattern NS2_D includes an upper surface NS2_DUS and a bottom surface NS2_DBS. The bottom surface NS2_DBS of the second dummy sheet pattern may contact the upper surface 210US of the second lower insulating pattern.

The plurality of second normal sheet patterns NS2_N are disposed on the upper surface NS2_DUS of the second dummy sheet pattern. Each of the second normal sheet patterns NS2_N includes an upper surface NS2_NUS and a bottom surface NS2_NBS.

Although it is illustrated that three first normal sheet patterns NS1_N are arranged in the third direction D3 and three second normal sheet patterns NS2_N are arranged in the third direction D3, this is only for convenience of illustration. However, the present inventive concepts are not limited thereto.

For example, a thickness t21 in the third direction D3 of the first normal sheet pattern NS1_N is greater than a thickness t22 in the third direction D3 of the first dummy sheet pattern NS1_D. Likewise, a thickness of the second normal sheet pattern NS2_N is greater than a thickness of the second dummy sheet pattern NS2_D.

A width of the first channel pattern CH1 in the first direction D1 may be a width W31 of the first normal sheet pattern NS1_N in the first direction D1. A width of the second channel pattern CH2 in the first direction D1 may be a width W32 of the second normal sheet pattern NS2_N in the first direction D1.

For example, a width W11 of the first lower insulating pattern 110 in the first direction D1 may be greater than or equal to a width W31 of the first channel pattern CH1 in the first direction D1. The width W11 of the first lower insulating pattern 110 in the first direction D1 may be greater than or equal to the width W31 of the first normal sheet pattern NS1_N in the first direction D1.

A width W12 of the second lower insulating pattern 210 in the first direction D1 may be greater than or equal to a width W32 of the second channel pattern CH2 in the first direction D1. The width W12 of the second lower insulating pattern 210 in the first direction D1 may be greater than or equal to the width W32 of the second normal sheet pattern NS2_N in the first direction D1.

Although it is illustrated that the widths of the first normal sheet patterns NS1_N in the first direction D1 are equal to each other, the present inventive concepts are not limited thereto. Further, although it is illustrated that the widths of the second normal sheet patterns NS2_N in the first direction D1 are equal to each other, the present inventive concepts are not limited thereto.

Each of the first sheet pattern NS1 and the second sheet pattern NS2 may include one of silicon or germanium as an elemental semiconductor material, a group IV-IV compound semiconductor, or a group III-V compound semiconductor. The first sheet pattern NS1 may include the same material as that of the first lower pattern BP1, or may include a material different from that of the first lower pattern BP1. The second sheet pattern NS2 may include the same material as that of the second lower pattern BP2, or may include a material different from that of the second lower pattern BP2.

In the semiconductor device according to some example embodiments, each of the first lower pattern BP1 and the second lower pattern BP2 may be a silicon lower pattern including silicon. Each of the first sheet pattern NS1 and the second sheet pattern NS2 may be a silicon sheet pattern including silicon.

A width of the first sheet pattern NS1 in the second direction D2 may be increased or decreased in proportion to a width of the upper surface BP1_US of the first lower pattern in the second direction D2. A width of the second sheet pattern NS2 in the second direction D2 may be increased or decreased in proportion to a width of the upper surface BP2_US of the second lower pattern in the second direction D2.

It is illustrated that widths in the second direction D2 of the first sheet patterns NS1 stacked in the third direction D3 are equal to each other, and widths in the second direction D2 of the second sheet patterns NS2 stacked in the third direction D3 are equal to each other. This is only for convenience of illustration. However, the present inventive concepts are not limited thereto. Unlike what is illustrated, the widths in the second direction D2 of the first sheet patterns NS1 stacked in the third direction D3 may decrease as it moves away from the first lower pattern BP1. This may be equally applied to the second sheet pattern NS2.

In FIGS. 1 and 4, it is illustrated that the width of the first lower pattern BP1 in the second direction D2 is equal to the width of the second lower pattern BP2 in the second direction D2. However, the present inventive concepts are not limited thereto. For reference, the width of the first lower pattern BP1 in the second direction D2 may be a width of the upper surface BP1_US of the first lower pattern in the second direction D2.

In one example, the first lower pattern BP1 may be disposed immediately adjacent to the second lower pattern BP2 in the second direction D2. In other words, an additional lower pattern and an additional channel pattern may not be disposed between the first lower pattern BP1 and the second lower pattern BP2.

Unlike what is shown, in another example, the second lower pattern BP2 may be disposed in an area spaced apart from the first lower pattern BP1. In this case, the second lower pattern BP2 may extend in the first direction D1, unlike the first lower pattern BP1.

The plurality of gate structures GS_1 and GS_2 may be disposed on the substrate 100. Each of the gate structures GS_1 and GS_2 may extend in the second direction D2. The gate structures GS_1 and GS_2 may be disposed to be spaced apart from each other in the first direction D1. The gate structures GS_1 and GS_2 may be adjacent to each other in the first direction D1 and may be referred to as adjacent gate structures of the plurality of gate structures.

Each of the gate structures GS_1 and GS_2 is disposed on the first lower pattern BP1 and the second lower pattern BP2. Each of the gate structures GS_1 and GS_2 may intersect the first lower pattern BP1 and the second lower pattern BP2. Each of the gate structures GS_1 and GS_2 may include, for example, a gate electrode 120, a gate insulating film 130, a gate spacer 140, and a gate capping pattern 145.

It is illustrated that each of the gate structures GS_1 and GS_2 extends across the first lower pattern BP1 and the second lower pattern BP2. This is only for convenience of illustration. However, the inventive concepts are not limited thereto.

In one example, one of the gate structures GS_1 and GS_2 may be divided into two portions which may be respectively disposed on the first lower pattern BP1 and the second lower pattern BP2. That is, a first gate structure on the first lower pattern BP1 may be isolated from a second gate structure on the second lower pattern BP2 in the second direction D2. In this case, a first gate electrode and a first gate insulating film included in the first gate structure may be isolated from a second gate electrode and a second gate insulating film included in the second gate structure.

Unlike what is shown, in another example, when the second lower pattern BP2 is disposed in an area spaced apart from the first lower pattern BP1, the first gate structure on the first lower pattern BP1 may be spatially isolated from the second gate structure on the second lower pattern BP2. In this case, the first gate electrode and the first gate insulating film included in the first gate structure are isolated from the second gate electrode and the second gate insulating film included in the second gate structure.

The plurality of gate structures GS_1 and GS_2 may include a normal gate structure GS_1 and an edge gate structure GS_2. The edge gate structure GS_2 may be disposed at the terminating end of the first lower pattern BP1 and/or at the terminating end of the second lower pattern BP2. The normal gate structure GS_1 is disposed between the edge gate structures GS_2. Although three normal gate structures GS_1 are illustrated, this is only for convenience of illustration. However, the inventive concepts are not limited thereto.

The plurality of gate structures GS_1 and GS_2 may include a first inner gate structure INT1_GS and a second inner gate structure INT2_GS. The first inner gate structure INT1_GS may be disposed between the first sheet patterns NS1 adjacent to each other in the third direction D3 (e.g., between adjacent first sheet patterns NS1 of the plurality of first sheet patterns NS1). The second inner gate structure INT2_GS may be disposed between the second sheet patterns NS2 adjacent to each other in the third direction D3 (e.g., between adjacent second sheet patterns NS2 of the plurality of second sheet patterns NS2). Each of the first inner gate structure INT1_GS and the second inner gate structure INT2_GS may include a gate electrode 120 and a gate insulating film 130.

The first inner gate structure INT1_GS may be disposed between the first normal sheet patterns NS1_N adjacent to each other in the third direction D3 (e.g., between adjacent first normal sheet patterns NS1_N) and between the first dummy sheet pattern NS1_D and the first normal sheet pattern NS1_N. The first inner gate structure INT1_GS is in contact with the upper surface NS1_DUS of the first dummy sheet pattern, the upper surface NS1_NUS of the first normal sheet pattern, and the bottom surface NS1_NBS of the first normal sheet pattern.

The second inner gate structure INT2_GS may be disposed between the second normal sheet patterns NS2_N adjacent to each other in the third direction D3 (e.g., between adjacent second normal sheet patterns NS2_N) and between the second dummy sheet pattern NS2_D and the second normal sheet pattern NS2_N. The second inner gate structure INT2_GS is in contact with the upper surface NS2_DUS of the second dummy sheet pattern, the upper surface NS2_NUS of the second normal sheet pattern, and the bottom surface NS2_NBS of the second normal sheet pattern.

For example, in a cross-sectional view taken in the first direction D1, an entirety of the gate electrode 120 included in the edge gate structure GS_2 may overlap the first channel pattern CH1 in the third direction D3. In the cross-sectional view, an entirety of the gate electrode 120 included in the edge gate structure GS_2 may overlap the second channel pattern CH2 in the third direction D3.

The gate electrode 120 is disposed on the first lower pattern BP1 and the second lower pattern BP2. The gate electrode 120 intersects the first lower pattern BP1 and the second lower pattern BP2.

The gate electrode 120 is disposed on the first lower insulating pattern 110 and the second lower insulating pattern 210. The gate electrode 120 overlaps with the first lower insulating pattern 110 in the third direction D3. The gate electrode 120 overlaps the second lower insulating pattern 210 in the third direction D3. The gate electrode 120 may surround the first normal sheet pattern NS1_N. The gate electrode 120 may surround the second normal sheet pattern NS2_N.

For example, in the cross-sectional view, the width W11 of the first lower insulating pattern 110 in the first direction D1 is greater than the width W21 of the gate electrode 120 in the first direction D1. In the cross-sectional view, the width W12 of the second lower insulating pattern 210 in the first direction D1 is greater than the width W22 of the gate electrode 120 in the first direction D1. In FIG. 2, the width W21 of the gate electrode 120 in the first direction D1 may be the width of the gate electrode 120 included in the first inner gate structure INT1_GS in the first direction D1. In FIG. 3, the width W22 of the gate electrode 120 in the first direction D1 may be the width of the gate electrode 120 included in the second inner gate structure INT2_GS in the first direction D1.

The gate electrodes 120 adjacent to each other in the first direction D1 may be spaced apart from each other by a gate distance L. For example, the distance L by which the gate electrodes 120 sandwiching the first source/drain pattern 150 therebetween are spaced apart from each other in the first direction D1 may be a distance between sidewalls of the gate electrodes 120 sandwiching the first source/drain pattern 150 therebetween and facing each other in the first direction D1.

A distance L at which the gate electrodes 120 is spaced apart in the first direction D1 in a portion overlapping the first lower pattern BP1 in the third direction D3, may be equal to a distance L at which the gate electrodes 120 is spaced apart in the first direction D1 in a portion overlapping the second lower pattern BP2 in the third direction D3.

When the second lower pattern BP2 is disposed in an area spaced apart from the first lower pattern BP1, a distance at which first gate electrodes disposed on the first lower pattern BP1 are spaced apart from each other, may be equal to a distance at which second gate electrodes disposed on the second lower pattern BP2 are spaced apart from each other.

The gate electrode 120 may include at least one of a metal, a metal alloy, a conductive metal nitride, a metal silicide, a doped semiconductor material, a conductive metal oxide, and a conductive metal oxynitride. The gate electrode 120 may include at least one of, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V) and combinations thereof. The present inventive concepts are not limited thereto. Each of the conductive metal oxide and the conductive metal oxynitride may include oxidized products of the above-mentioned materials. The present inventive concepts are not limited thereto.

The gate electrode 120 may be disposed on each of both opposing sides of the first source/drain pattern 150 to be described later. Each of the gate structures GS_1 and GS_2 may be disposed on each of both opposing sides in the first direction D1 of the first source/drain pattern 150. The gate electrode 120 may be disposed on each of both opposing sides of the second source/drain pattern 250 to be described later. Each of the gate structures GS_1 and GS_2 may be disposed on each of both opposing sides in the first direction D1 of the second source/drain pattern 250.

The gate insulating film 130 may extend along the upper surface 105US of the field insulating film, the upper surface 110US of the first lower insulating pattern, and the upper surface 210US of the second lower insulating pattern. The gate insulating film 130 may cover the second sidewalls 110SW_2 of the first lower insulating pattern and the second sidewalls 210SW_2 of the second lower insulating pattern. The gate insulating film 130 may contact the second sidewalls 110SW_2 of the first lower insulating pattern and the second sidewalls 210SW_2 of the second lower insulating pattern. The gate insulating film 130 may contact the upper surface NS1_DUS of the first dummy sheet pattern and the upper surface NS2_DUS of the second dummy sheet pattern.

The gate insulating film 130 may surround the first normal sheet pattern NS1_N and the second normal sheet pattern NS2_N. The gate insulating film 130 may be disposed around the first normal sheet pattern NS1_N and around the second normal sheet pattern NS2_N. The gate electrode 120 is disposed on the gate insulating film 130. The gate insulating film 130 is disposed between the gate electrode 120 and the first sheet pattern NS1.

The gate insulating film 130 may include silicon oxide, silicon-germanium oxide, germanium oxide, silicon oxynitride, silicon nitride, or a high dielectric constant material having a higher dielectric constant than that of silicon oxide. The high dielectric constant material may include at least one of, for example, boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

Although the gate insulating film 130 is shown as a single film, this is only for convenience of illustration. The inventive concepts are not limited thereto. The gate insulating film 130 may include a plurality of films. The gate insulating film 130 may include an interfacial layer and a high dielectric constant insulating film disposed between the first sheet pattern NS1 and the gate electrode 120 and between the second sheet pattern NS2 and the gate electrode 120.

The semiconductor device according to some example embodiments may include an NC (negative capacitance) FET using a negative capacitor. In one example, the gate insulating film 130 may include a ferroelectric material film having ferroelectric characteristics and a paraelectric material film having paraelectric characteristics.

The ferroelectric material film may have negative capacitance, and the paraelectric material film may have positive capacitance. For example, when two or more capacitors may be connected in series to each other, and capacitance of each of the capacitors has a positive value, a total capacitance is smaller than capacitance of each individual capacitor. On the contrary, when at least one of capacitances of two or more capacitors connected in series to each other has a negative value, a total capacitance may have a positive value and be greater than an absolute value of each individual capacitance.

When the ferroelectric material film with negative capacitance and the paraelectric material film with positive capacitance are connected in series to each other, a total capacitance value of the ferroelectric material film and the paraelectric material film connected in series to each other may be increased. Using the increase in the total capacitance value, a transistor including the ferroelectric material film may have a subthreshold swing (SS) lower than about 60 mV/decade at room temperature.

The ferroelectric material film may have ferroelectric properties. The ferroelectric material film may include, for example, at least one of hafnium oxide, hafnium zirconium oxide, barium strontium titanium oxide, barium titanium oxide, and lead zirconium titanium oxide. In this connection, in one example, hafnium zirconium oxide may refer to a material obtain by doping hafnium oxide with zirconium (Zr). In another example, hafnium zirconium oxide may refer to a compound of hafnium (Hf), zirconium (Zr), and oxygen (O).

The ferroelectric material film may further contain doped dopants. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr) and tin (Sn). A type of the dopant contained in the ferroelectric material film may vary depending on a type of the ferroelectric material included in the ferroelectric material film.

When the ferroelectric material film includes hafnium oxide, the dopant contained in the ferroelectric material film may include, for example, at least one of gadolinium (Gd), silicon (Si), zirconium (Zr), aluminum (Al), and yttrium (Y).

When the dopant is aluminum (Al), the ferroelectric material film may contain about 3 to about 8 at % (atomic %) of aluminum. In this connection, a content of the dopant may be a content of aluminum based on a sum of hafnium and aluminum.

When the dopant is silicon (Si), the ferroelectric material film may contain about 2 to about 10 at % of silicon. When the dopant is yttrium (Y), the ferroelectric material film may contain about 2 to about 10 at % yttrium. When the dopant is gadolinium (Gd), the ferroelectric material film may contain about 1 to about 7 at % gadolinium. When the dopant is zirconium (Zr), the ferroelectric material film may contain about 50 to about 80 at % zirconium.

The paraelectric material film may have paraelectric properties. The paraelectric material film may include, for example, at least one of silicon oxide and metal oxide having a high dielectric constant. Although the metal oxide contained in the paraelectric material film may include, for example, at least one of hafnium oxide, zirconium oxide and aluminum oxide. However, the present inventive concepts are not limited thereto.

The ferroelectric material film and the paraelectric material film may include the same material. The ferroelectric material film may have ferroelectric properties, but the paraelectric material film may not have the ferroelectric properties. For example, when each of the ferroelectric material film and the paraelectric material film includes hafnium oxide, a crystal structure of hafnium oxide contained in the ferroelectric material film is different from a crystal structure of hafnium oxide contained in the paraelectric material film.

The ferroelectric material film may have a thickness sized to exhibit ferroelectric properties. Although the thickness of the ferroelectric material film may be, for example, in a range of about 0.5 to about 10 nm, the present inventive concepts are not limited thereto. Because a critical thickness exhibiting the ferroelectric properties may be varied based on a type of the ferroelectric material, the thickness of the ferroelectric material film may vary depending on the type of the ferroelectric material.

In one example, the gate insulating film 130 may include one ferroelectric material film. In another example, the gate insulating film 130 may include a plurality of ferroelectric material films spaced apart from each other. The gate insulating film 130 may have a stack structure in which a plurality of ferroelectric material films and a plurality of paraelectric material films are alternately stacked with each other.

A gate spacer 140 may be disposed on a sidewall of the gate electrode 120. The gate spacer 140 may not be disposed between the first sheet patterns NS1 adjacent to each other in the third direction D3.

The gate spacer 140 may include an inner sidewall 140_ISW, a connective sidewall 140_CSW, and an outer sidewall 140_OSW. The inner sidewall 140_ISW of the gate spacer faces a sidewall of the gate electrode 120 extending in the second direction D2. The inner sidewall 140_ISW of the gate spacer may extend in the second direction D2. The inner sidewall 140_ISW of the gate spacer may be opposite to the outer sidewall 140_OSW of the gate spacer facing the first interlayer insulating film 190. The connective sidewall 140_CSW of the gate spacer connects the inner sidewall 140_ISW of the gate spacer and the outer sidewall 140_OSW of the gate spacer to each other. The connective sidewall 140_CSW of the gate spacer may extend in the first direction D1.

The gate insulating film 130 may extend along the inner sidewall 140_ISW of the gate spacer. The gate insulating film 130 may contact the inner sidewall 140_ISW of the gate spacer.

The gate spacer 140 may include, for example, at least one of silicon nitride (SiN), silicon oxynitride (SiON), silicon oxide (SiO₂), silicon oxycarbonitride (SiOCN), silicon boron nitride (SiBN), silicon oxyboronitride (SiOBN), silicon oxycarbide (SiOC), and combinations thereof. The present inventive concepts are not limited thereto. Although the gate spacer 140 is shown as a single film, this is only for convenience of illustration. However, the inventive concepts are not limited thereto.

The gate capping pattern 145 may be disposed on the gate electrode 120 and the gate spacer 140. An upper surface of the gate capping pattern 145 may be coplanar with an upper surface of the first interlayer insulating film 190. Unlike what is illustrated, the gate capping pattern 145 may be disposed between the gate spacers 140.

The gate capping pattern 145 may include, for example, at least one of silicon nitride (SiN), silicon oxynitride (SiON), silicon carbonitride (SiCN), silicon oxycarbonitride (SiOCN), and combinations thereof. The gate capping pattern 145 may include a material having an etching selectivity relative to a material of the first interlayer insulating film 190.

The first source/drain pattern 150 may be disposed on the first lower pattern BP1. The first source/drain pattern 150 is connected to the first sheet pattern NS1.

The first source/drain pattern 150 may be disposed on each of sides of the gate structures GS_1 and GS_2. The first source/drain pattern 150 may be disposed between gate structures GS_1 and GS_2 adjacent to each other in the first direction D1 (e.g., between adjacent gate structures GS_1 and GS_2 of the plurality of gate structures).

The second source/drain pattern 250 may be disposed on the second lower pattern BP2. The second source/drain pattern 250 is connected to the second sheet pattern NS2.

The second source/drain pattern 250 may be disposed on each of sides of gate structures GS_1 and GS_2. The second source/drain pattern 250 may be disposed between gate structures GS_1 and GS_2 adjacent to each other in the first direction D1.

Each of the first source/drain pattern 150 and the second source/drain pattern 250 may be included in a source/drain of a transistor using each of the first sheet pattern NS1 and the second sheet pattern NS2 as a channel area thereof.

The first source/drain pattern 150 may be disposed in a first source/drain recess 150R. The second source/drain pattern 250 may be disposed in a second source/drain recess 250R. Each of the first source/drain recess 150R and the second source/drain recess 250R extends into the third direction D3. Each of the first source/drain recess 150R and the second source/drain recess 250R may be defined between the gate structures GS_1 and GS_2 adjacent to each other in the first direction D1.

A bottom surface of the first source/drain recess 150R may be defined by the first lower pattern BP1. A bottom surface of the second source/drain recess 250R may be defined by the second lower pattern BP2.

In the semiconductor device according to some example embodiments, a sidewall of the first source/drain recess 150R may be defined by the first sheet pattern NS1, the first inner gate structure INT1_GS, and the first lower insulating pattern 110. A sidewall of the second source/drain recess 250R may be defined by the second sheet pattern NS2, the second inner gate structure INT2_GS, and the second lower insulating pattern 210.

The first inner gate structure INT1_GS may include an upper surface facing the bottom surface NS1_NBS of the first normal sheet pattern. The first inner gate structure INT1_GS includes a bottom surface facing the upper surface NS1_NUS of the first normal sheet pattern or the upper surface NS1_DUS of the first dummy sheet pattern. The first inner gate structure INT1_GS includes a sidewall connecting the upper surface of the first inner gate structure INT1_GS and the bottom surface of the first inner gate structure INT1_GS to each other. The sidewall of the first inner gate structure INT1_GS and the first sidewall 110SW_1 of the first lower insulating pattern may define a portion of the sidewall of the first source/drain recess 150R.

As in the first inner gate structure INT1_GS, the second inner gate structure INT2_GS includes a sidewall connecting an upper surface of the second inner gate structure INT2_GS and a bottom surface of the second inner gate structure INT2_GS to each other. The sidewall of the second inner gate structure INT2_GS and the first sidewall 210SW_1 of the second lower insulating pattern may define a portion of the sidewall of the second source/drain recess 250R.

A vertical level of the bottom surface of the first source/drain recess 150R is lower than that of the upper surface BP1_US of the first lower pattern. Likewise, a vertical level of the bottom surface of the second source/drain recess 250R is lower than that of the upper surface BP2_US of the second lower pattern.

The first source/drain pattern 150 contacts the first sheet pattern NS1. The first source/drain pattern 150 is in contact with the first lower pattern BP1 and the first lower insulating pattern 110. The first source/drain pattern 150 is in contact with the first sidewall 110SW_1 of the first lower insulating pattern. Since the gate spacer 140 is not disposed between adjacent first sheet patterns NS1, the first inner gate structure INT1_GS is in contact with the first source/drain pattern 150. The gate insulating film 130 of the first inner gate structure INT1_GS may contact the first source/drain pattern 150.

The second source/drain pattern 250 contacts the second sheet pattern NS2. The second source/drain pattern 250 is in contact with the second lower pattern BP2 and the second lower insulating pattern 210. The second source/drain pattern 250 is in contact with the first sidewall 210SW_1 of the second lower insulating pattern. Since the gate spacer 140 is not disposed between adjacent second sheet patterns NS2, the second inner gate structure INT2_GS is in contact with the second source/drain pattern 250. The gate insulating film 130 of the second inner gate structure INT2_GS may contact the second source/drain pattern 250.

The lowermost portion of the first source/drain pattern 150 is lower than the bottom surface 110BS of the first lower insulating pattern. A depth d11 from the upper surface 110US of the first lower insulating pattern to the lowermost portion of the first source/drain pattern 150 is greater than a thickness t11 of the first lower insulating pattern 110 in the third direction D3. For example, when one first source/drain pattern 150 and the other first source/drain pattern 150 are respectively disposed on both opposing sides of the normal gate structure GS_1, each of the lowermost portion of one first source/drain pattern 150 and the lowermost portion of the other first source/drain pattern 150 is lower than the bottom surface 110BS of the first lower insulating pattern.

The lowermost portion the second source/drain pattern 250 is lower than the bottom surface 210BS of the second lower insulating pattern. A depth d12 from the upper surface 210US of the second lower insulating pattern to the lowermost portion of the second source/drain pattern 250 is greater than a thickness t12 of the second lower insulating pattern 210 in the third direction D3.

It is illustrated that the depth d11 from the upper surface 110US of the first lower insulating pattern to the lowermost portion of the first source/drain pattern 150 is equal to the depth d12 from the upper surface 210US of the second lower insulating pattern to the lowermost portion of the second source/drain pattern 250. However, the present inventive concepts are not limited thereto.

Each of the first source/drain pattern 150 and the second source/drain pattern 250 includes a semiconductor material.

The first source/drain pattern 150 may include a first bottom semiconductor liner film 151 and a first filling semiconductor film 152. The first filling semiconductor film 152 is disposed on the first bottom semiconductor liner film 151.

The first bottom semiconductor liner film 151 may extend along the first lower pattern BP1 defining the bottom surface of the first source/drain recess 150R. The first bottom semiconductor liner film 151 may include silicon-germanium. The first bottom semiconductor liner film 151 may be a bottom silicon-germanium film. Based on the bottom surface 110BS of the first lower insulating pattern, the uppermost portion of the first bottom semiconductor liner film 151 may be lower than the upper surface 110US of the first lower insulating pattern.

The first filling semiconductor film 152 may include, for example, a first lower filling semiconductor film 152A and a first upper filling semiconductor film 152B. The first upper filling semiconductor film 152B is disposed on the first lower filling semiconductor film 152A. Each of the first lower filling semiconductor film 152A and the first upper filling semiconductor film 152B may include silicon-germanium. For example, the first lower filling semiconductor film 152A may not extend along a sidewall of the first source/drain recess 150R defined by the first normal sheet pattern NS1_N and the gate insulating film 130.

The first upper filling semiconductor film 152B may contain doped p-type impurities. For example, the p-type impurity may be boron B. However, the present inventive concepts are not limited thereto. In one example, the first lower filling semiconductor film 152A may include an undoped semiconductor material. Herein, the "undoped semiconductor material" means a semiconductor material that does not contain intentionally implanted or doped impurities. That is, the undoped semiconductor material means a semiconductor material in which p-type impurities, n-type impurities, or other impurities are not intentionally implanted into a semiconductor layer when a semiconductor material is grown. However, the undoped semiconductor material may contain impurities that have diffused from an adjacent film into the semiconductor layer. In another example, the first lower filling semiconductor film 152A may contain n-type impurities. The first lower filling semiconductor film 152A may be doped with impurities of a conductivity type different from that of the first upper filling semiconductor film 152B. That is, the first lower filling semiconductor film 152A may include a semiconductor material counter-doped with respect to the first upper filling semiconductor film 152B. For example, the n-type impurity may include at least one of phosphorus (P), arsenic (As), antimony (Sb), and bismuth (Bi).

Each of the first lower filling semiconductor film 152A and the first upper filling semiconductor film 152B is illustrated as a single film. However, this is only for convenience of illustration. The inventive concepts are not limited thereto.

The second source/drain pattern 250 may include a second bottom semiconductor liner film 251 and a second filling semiconductor film 252. The second filling semiconductor film 252 is disposed on the second bottom semiconductor liner film 251.

The second bottom semiconductor liner film 251 may extend along the second lower pattern BP2 defining the bottom surface of the second source/drain recess 250R. The second bottom semiconductor liner film 251 may include silicon-germanium. Based on the bottom surface 210BS of the second lower insulating pattern, the uppermost portion of the second bottom semiconductor liner film 251 may be lower than the upper surface 210US of the second lower insulating pattern.

The second filling semiconductor film 252 may include, for example, a second lower filling semiconductor film 252A and a second upper filling semiconductor film 252B. The second upper filling semiconductor film 252B is disposed on the second lower filling semiconductor film 252A. Each of the second lower filling semiconductor film 252A and the second upper filling semiconductor film 252B may include at least one of silicon, silicon-germanium, and silicon carbide. For example, the second lower filling semiconductor film 252A may not extend along a sidewall of the second source/drain recess 250R defined by the second normal sheet pattern NS2_N and the gate insulating film 130.

The second upper filling semiconductor film 252B may contain doped n-type impurities. In one example, the second lower filling semiconductor film 252A may include an undoped semiconductor material. In another example, the second lower filling semiconductor film 252A may contain p-type impurities. The second lower filling semiconductor film 252A may include a semiconductor material that is counter-doped with respect to the second upper filling semiconductor film 252B.

Each of the second lower filling semiconductor film 252A and the second upper filling semiconductor film 252B is illustrated as a single film. However, this is only for convenience of illustration. The present inventive concepts are not limited thereto.

In one example, a thickness t31 of the first bottom semiconductor liner film 151 in the third direction D3 is greater than a thickness t32 of the first bottom semiconductor liner film 251 in the third direction D3. In another example, the thickness t31 of the first bottom semiconductor liner film 151 in the third direction D3 may be equal to the thickness t32 of the first bottom semiconductor liner film 251 in the third direction D3.

When the first lower insulating pattern 110 and the second lower insulating pattern 210 are disposed, flow of leakage current through the first lower pattern BP1 and the second lower pattern BP2 may be prevented, minimized, or reduced. As a result, a semiconductor device may have improved performance and reliability based on including at least one of the first lower insulating pattern 110 or the second lower insulating pattern 210 which may configure the semiconductor device to have reduced, minimized, or prevented flow of leakage current through the first lower pattern BP1 and the second lower pattern BP2. Further, when each of the first source/drain pattern 150 and/or the second source/drain pattern 250 includes each of the lower filling semiconductor films 152A and/or 252A including the undoped semiconductor material or the counter-doped semiconductor material, flow of leakage current may be prevented, minimized, or reduced. As a result, a semiconductor device may have improved performance and reliability based on including at least one of the first source/drain pattern 150 and/or the second source/drain pattern 250 that includes at least one of the lower filling semiconductor films 152A and/or 252A including the undoped semiconductor material or the counter-doped semiconductor material, which may configure the semiconductor device to have reduced, minimized, or prevented flow of leakage current therein and/or therethrough.

Although not shown, a source/drain etch stop film may be disposed on an upper surface of the first source/drain pattern 150 and an upper surface of the second source/drain pattern 250. The source/drain etch stop film may be disposed on the upper surface 105US of the field insulating film.

The first interlayer insulating film 190 may be disposed on the first source/drain pattern 150 and the second source/drain pattern 250. The first interlayer insulating film 190 may not cover an upper surface of the first gate capping pattern 145 and an upper surface of the second gate capping pattern 245.

The first interlayer insulating film 190 may include, for example, at least one of silicon oxide, silicon nitride, silicon oxynitride, and a low dielectric constant material. The low dielectric constant material may include, for example, Fluorinated TetraEthylOrthoSilicate (FTEOS), Hydrogen Silsesquioxane (HSQ), Bis-benzoCycloButene (BCB), TetraMethylOrthoSilicate (TMOS), OctaMethyleyCloTetraSiloxane (OMCTS), HexaMethylD-iSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica or combinations thereof. However, the inventive concepts are not limited thereto.

A first source/drain contact 180 is disposed on the first source/drain pattern 150. The first source/drain contact 180 is connected to the first source/drain pattern 150. The first source/drain contact 180 may extend through the first interlayer insulating film 190 and may be connected to the first source/drain pattern 150.

A second source/drain contact 280 is disposed on the second source/drain pattern 250. The second source/drain contact 280 is connected to the second source/drain pattern 250.

A first metal silicide layer 155 may be further disposed between the first source/drain contact 180 and the first source/drain pattern 150. A second metal silicide layer 255 may be further disposed between the second source/drain contact 280 and the second source/drain pattern 250.

Although each of the first source/drain contact 180 and the second source/drain contact 280 is shown as a single film, this is only for convenience of illustration. However, the inventive concepts are not limited thereto. Each of the first source/drain contact 180 and the second source/drain contact 280 may include, for example, at least one of metal, metal alloy, conductive metal nitride, conductive metal carbide, conductive metal oxide, conductive metal carbonitride and a two-dimensional material.

Each of the first metal silicide layer 155 and the second metal silicide layer 255 may include metal silicide.

The second interlayer insulating film 191 is disposed on the first interlayer insulating film 190. The second interlayer insulating film 191 may include, for example, at least one of silicon oxide, silicon nitride, silicon oxynitride, and a low dielectric constant material.

The wire structure 205 is disposed in the second interlayer insulating film 191. The wire structure 205 may be connected to the first source/drain contact 180 and the second source/drain contact 280. The wire structure 205 may include a wire line 207 and a wire via 206.

Although the wire line 207 and the wire via 206 are illustrated as being separated from each other, this is only for convenience of illustration. However, the inventive concepts are not limited thereto. That is, in one example, after the wire via 206 is formed, the wire line 207 may be formed. In another example, the wire via 206 and the wire line 207 may be formed simultaneously.

Although each of the wire line 207 and the wire via 206 is shown as a single film, this is only for convenience of illustration. However, the inventive concepts are not limited thereto. Each of the wire line 207 and the wire via 206 may include, for example, at least one of a metal, a metal alloy, a conductive metal nitride, a conductive metal carbide, a conductive metal oxide, a conductive metal carbonitride and a two-dimensional material.

For example, an upper surface of a portion of the first source/drain contact 180 connected to the wire structure 205 may be coplanar with an upper surface of a portion of the first source/drain contact 180 not connected to the wire structure 205.

Figure 8:
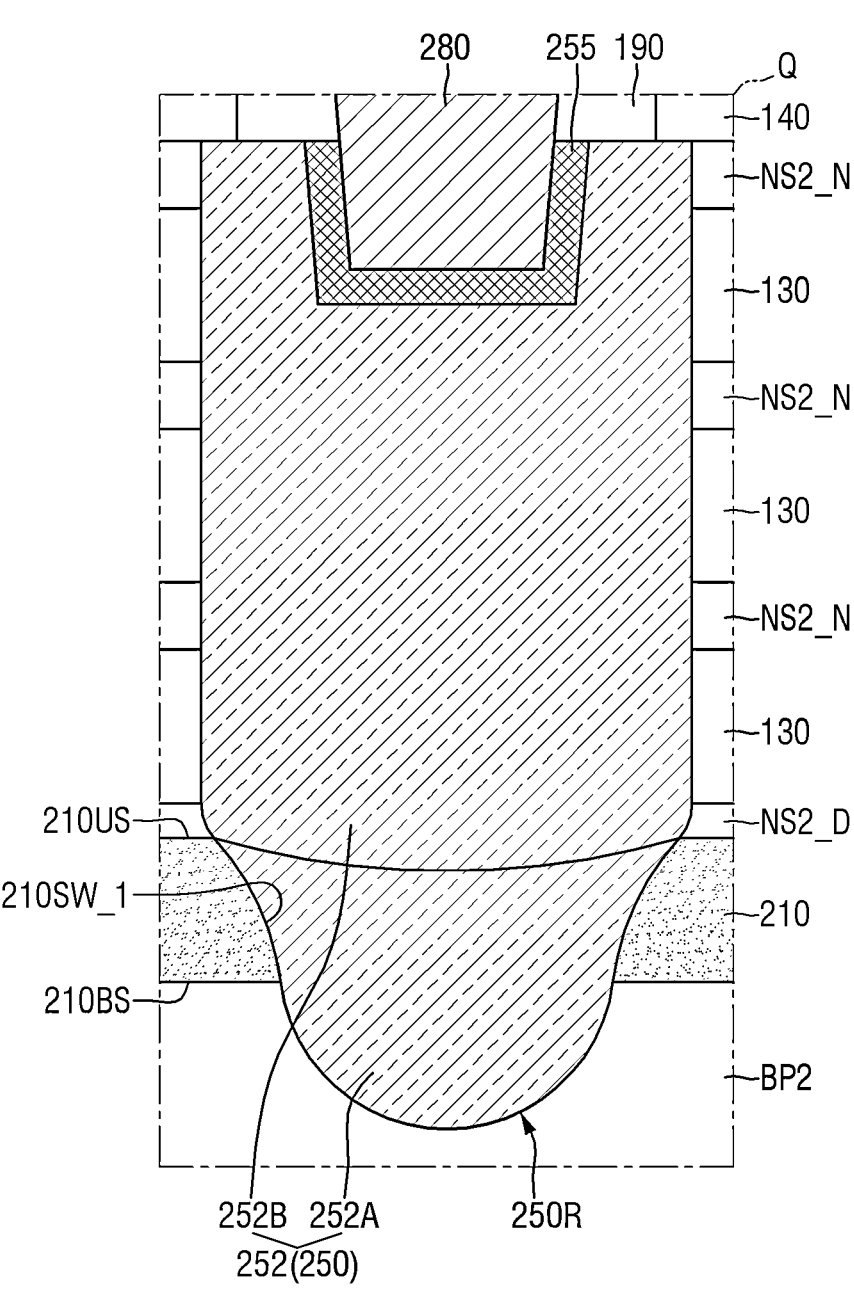
FIG. 8 is a diagram for illustrating a semiconductor device according to some example embodiments.
Figure 9:
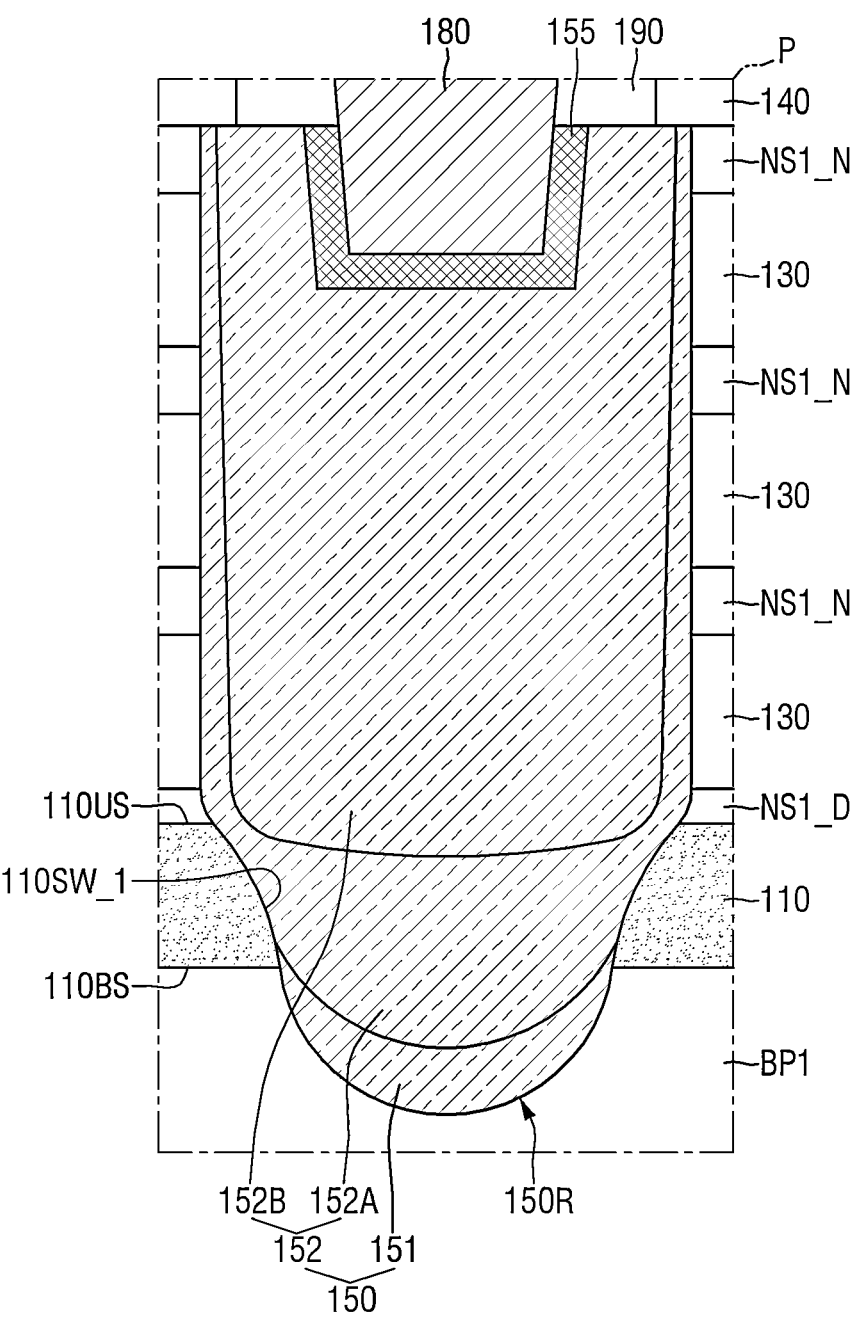
FIG. 9 and FIG. 10 are diagrams for illustrating a semiconductor device according to some example embodiments.
Figure 10:
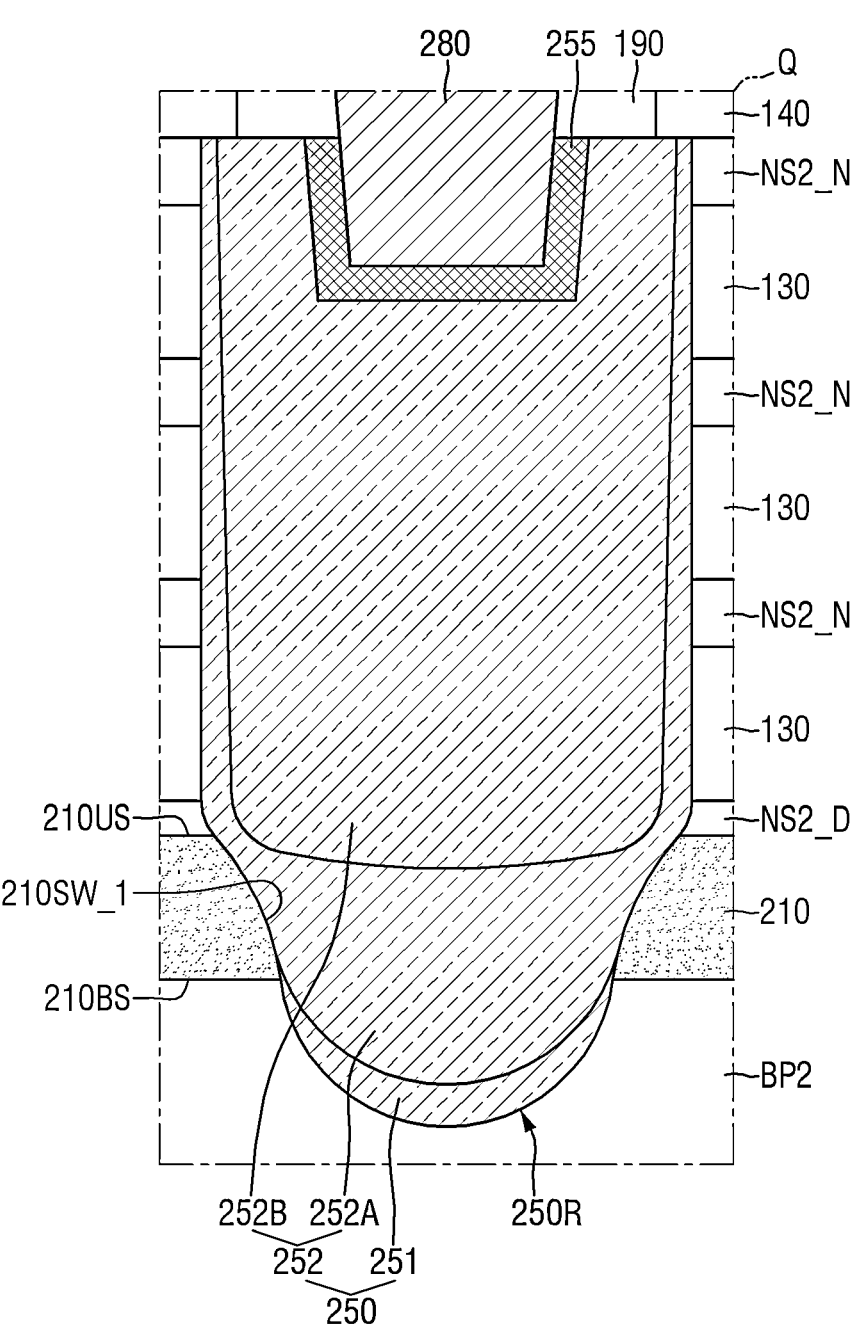
Figure 11:
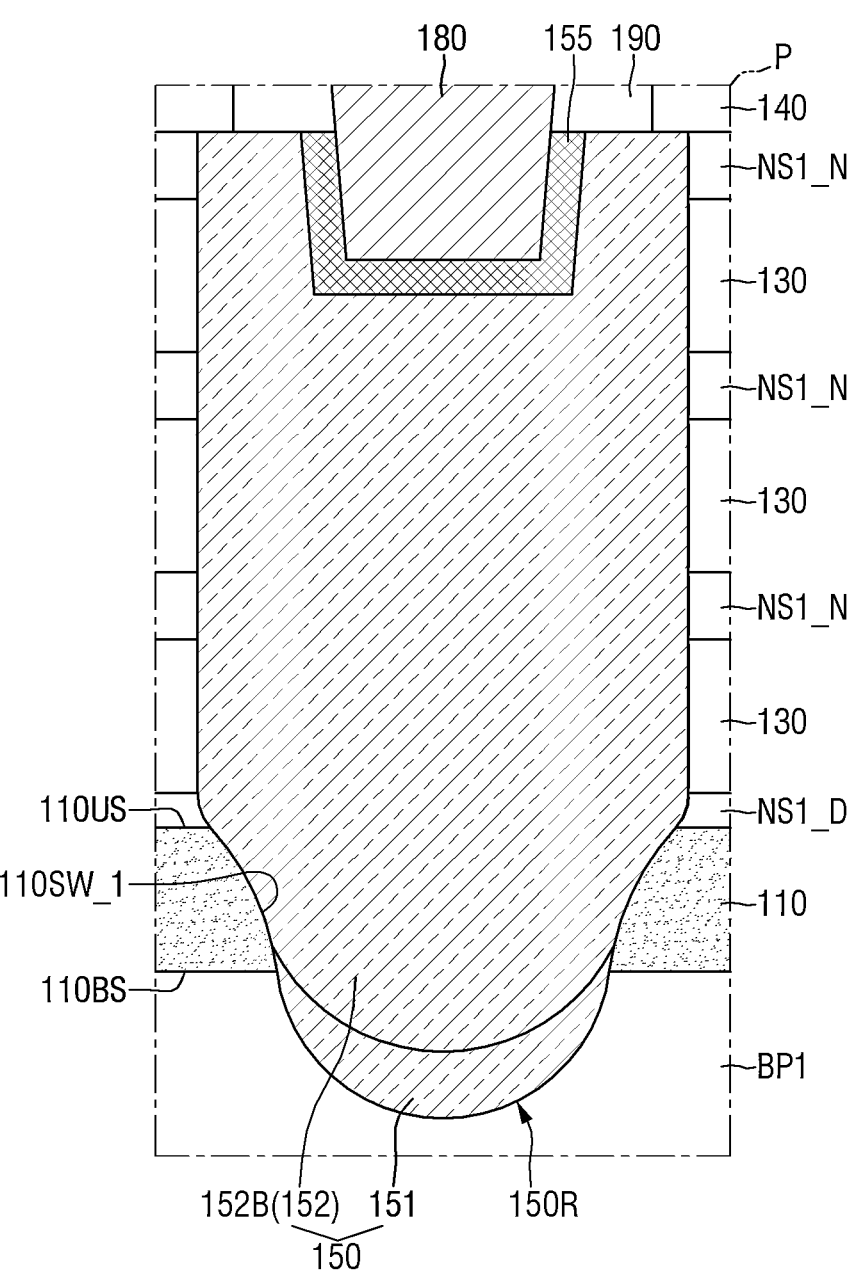
FIG. 11 and FIG. 12 are diagrams for illustrating a semiconductor device according to some example embodiments.
Figure 12:
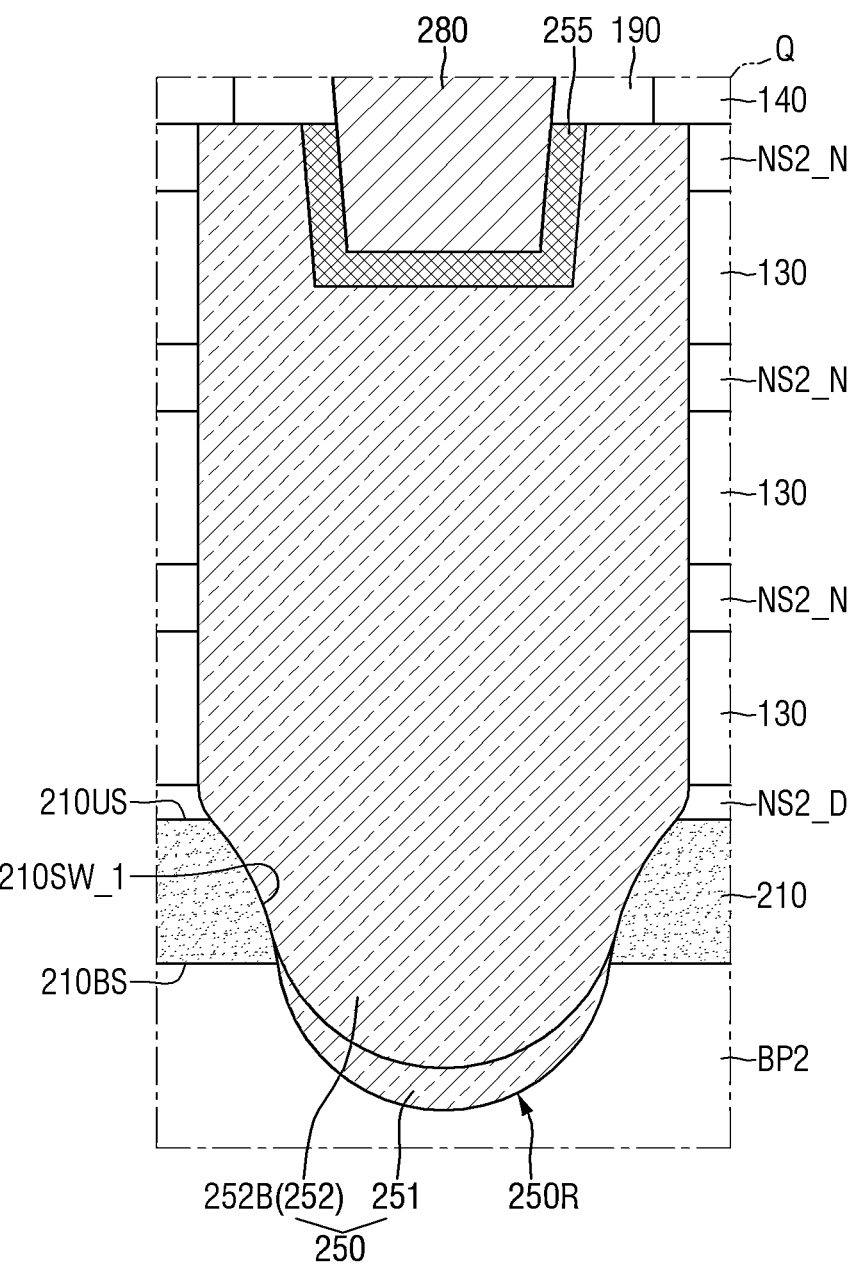

FIG. 8 is a diagram for illustrating a semiconductor device according to some example embodiments. FIGS. 9 and 10 are diagrams for illustrating a semiconductor device according to some example embodiments. FIG. 11 and FIG. 12 are diagrams for illustrating a semiconductor device according to some example embodiments. For convenience of illustration, following description is based on differences thereof from those as described above with reference to FIG. 1 to FIG. 7.

For reference, FIG. 8, FIG. 10, and FIG. 12 are enlarged views of region Q of FIG. 3. FIG. 9 and FIG. 11 are enlarged views of region P of FIG. 2.

Referring to FIG. 8, in the semiconductor device according to some example embodiments, the second source/drain pattern 250 may not include the second bottom semiconductor liner film 251 extending along the bottom surface of the second source/drain recess 250R.

The second source/drain pattern 250 may include the second lower filling semiconductor film 252A and the second upper filling semiconductor film 252B.

Referring to FIG. 9 and FIG. 10, in the semiconductor device according to some example embodiments, the first lower filling semiconductor film 152A may extend along the sidewall of the first source/drain recess 150R defined by the first normal sheet pattern NS1_N and the gate insulating film 130.

The second lower filling semiconductor film 252A may extend along the sidewall of the second source/drain recess 250R defined by the second normal sheet pattern NS2_N and the gate insulating film 130.

Each of the first lower filling semiconductor film 152A and the second lower filling semiconductor film 252A may include an undoped semiconductor material. However, each of the first lower filling semiconductor film 152A and the second lower filling semiconductor film 252A do not include a counter-doped semiconductor material.

Referring to FIG. 11 and FIG. 12, in the semiconductor device according to some example embodiments, the first source/drain pattern 150 does not include the first lower filling semiconductor film (152A in FIG. 6).

The first filling semiconductor film 152 may include only the first upper filling semiconductor film 152B doped with p-type impurities.

The second source/drain pattern 250 does not include the second lower filling semiconductor film (252A in FIG. 7).

The second filling semiconductor film 252 may include only the second upper filling semiconductor film 252B doped with n-type impurities.

In the semiconductor device according to some example embodiments, the first source/drain pattern 150 may be one of those as shown in FIG. 6, FIG. 9, and FIG. 11. The second source/drain pattern 250 may be one of those as shown in FIG. 7, FIG. 8, FIG. 10, and FIG. 12.

Figure 13:
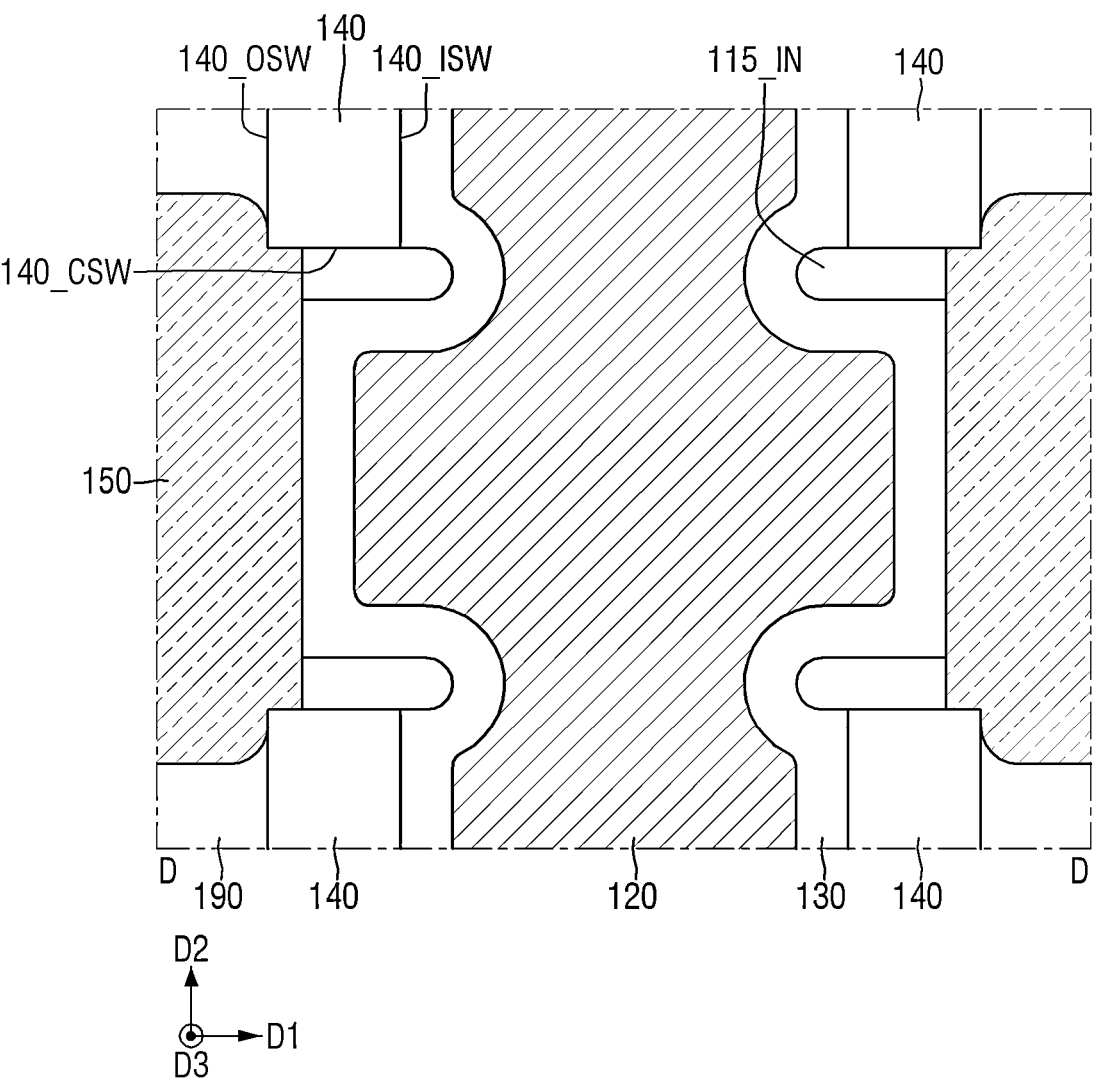
FIG. 13 is a diagram for illustrating a semiconductor device according to some example embodiments.
Figure 14:
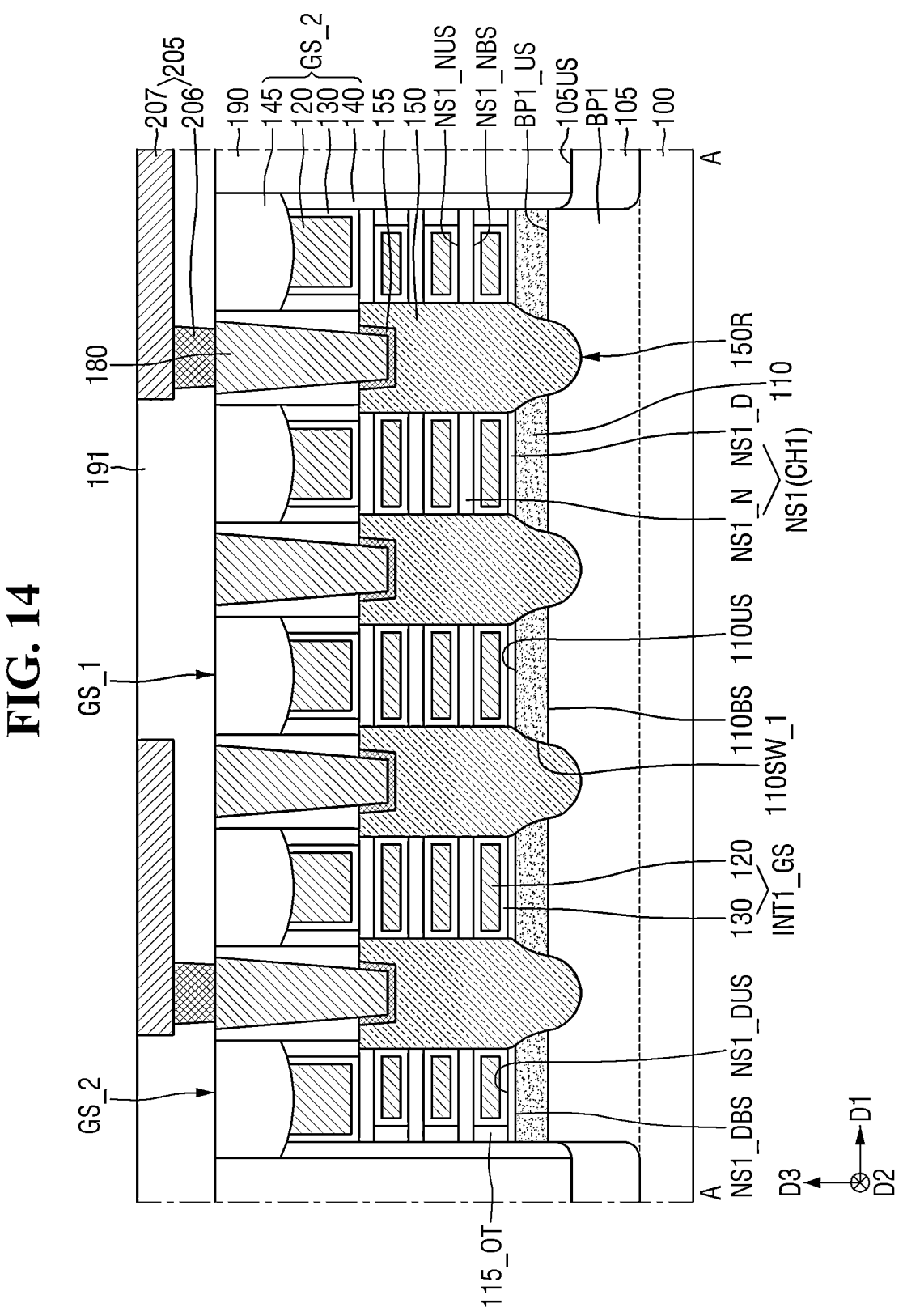
FIG. 14 is a diagram for illustrating a semiconductor device according to some example embodiments.

FIG. 13 is a diagram for illustrating a semiconductor device according to some example embodiments. FIG. 14 is a diagram for illustrating a semiconductor device according to some example embodiments. For convenience of illustration, following description is based on differences thereof from those as described above with reference to FIG. 1 to FIG. 7.

For reference, FIG. 13 is a plan view of a portion as cut along D-D of FIG. 2.

Referring to FIG. 13, a semiconductor device according to some example embodiments may include a connecting insulating pattern 115_IN disposed between the first sheet patterns NS1 adjacent to each other in the third direction D3 (e.g., between adjacent first sheet patterns NS1 of the plurality of first sheet patterns NS1).

The connecting insulating pattern 115_IN is in contact with the first gate insulating film 130.

The connecting insulating pattern 115_IN is in contact with a connective sidewall 140_CSW of the gate spacer. In the plan view, the connecting insulating pattern 115_IN is shown to be in contact with a portion of the connective sidewall 140_CSW of the gate spacer. However, the present inventive concepts are not limited thereto.

In the plan view, the connecting insulating pattern 115_IN may include a first terminating end facing the first source/drain pattern 150 and a second terminating end facing the first gate electrode 120. The second terminating end of the connecting insulating pattern 115_IN may protrude in the first direction D1 beyond the inner sidewall 140_ISW of the gate spacer. Unlike what is shown, in the plan view, the second terminating end of the connecting insulating pattern 115_IN may be aligned with the inner sidewall 140_ISW of the gate spacer in the second direction D2.

In the plan view, the connective sidewalls 140_CSW of four gate spacers are disposed between the first source/drain patterns 150 adjacent to each other in the first direction D1. Four connecting insulating patterns 115_IN may be disposed between the first source/drain patterns 150 adjacent to each other in the first direction D1. Four connecting insulating patterns 115_IN isolated from each other may be disposed between the first sheet patterns NS1 adjacent to each other in the third direction D3.

A width of the connecting insulating pattern 115_IN in the second direction D2 is smaller than a width of the first sheet pattern NS1 in contact with the connecting insulating pattern 115_IN in the second direction D2.

The connecting insulating pattern 115_IN extends in the third direction D3. The connecting insulating pattern 115_IN is in contact with the first sheet patterns (NS1 in FIG. 2) adjacent to each other in the third direction D3. For example, the connecting insulating pattern 115_IN is in contact with the upper surface NS1_NUS of the first normal sheet pattern and the bottom surface NS1_NBS of the first normal sheet pattern facing each other. The connecting insulating pattern 115_IN is in contact with the bottom surface NS1_NBS of the first normal sheet pattern and the upper surface NS1_DUS of the first dummy sheet pattern facing each other.

The connecting insulating pattern 115_IN may include, for example, at least one of silicon nitride (SiN), silicon oxynitride (SiON), silicon carbonitride (SiCN), and silicon oxycarbonitride (SiOCN).

Although not shown, the connecting insulating pattern may be disposed between the second sheet patterns (NS2 in FIG. 3) adjacent to each other in the third direction D3.

Referring to FIG. 14, the semiconductor device according to some example embodiments may include an upper insulating pattern 115_OT disposed between the first sheet patterns NS1 adjacent to each other in the third direction D3.

The upper insulating pattern 115_OT is disposed in the edge gate structure GS_2. The upper insulating pattern 115_OT is disposed only on the terminating end of the first lower pattern BP1.

The upper insulating pattern 115_OT is in contact with the first sheet patterns NS1 adjacent to each other in the third direction D3. A width of the upper insulating pattern 115_OT in the second direction D2 is equal to a width of the first sheet pattern NS1 in contact with the upper insulating pattern 115_OT in the second direction D2.

The upper insulating pattern 115_OT may include, for example, at least one of silicon nitride (SiN), silicon oxynitride (SiON), silicon carbonitride (SiCN), and silicon oxycarbonitride (SiOCN).

Although not shown, the upper insulating pattern may be disposed between the second sheet patterns (NS2 in FIG. 3) adjacent to each other in the third direction D3.

Figure 15:
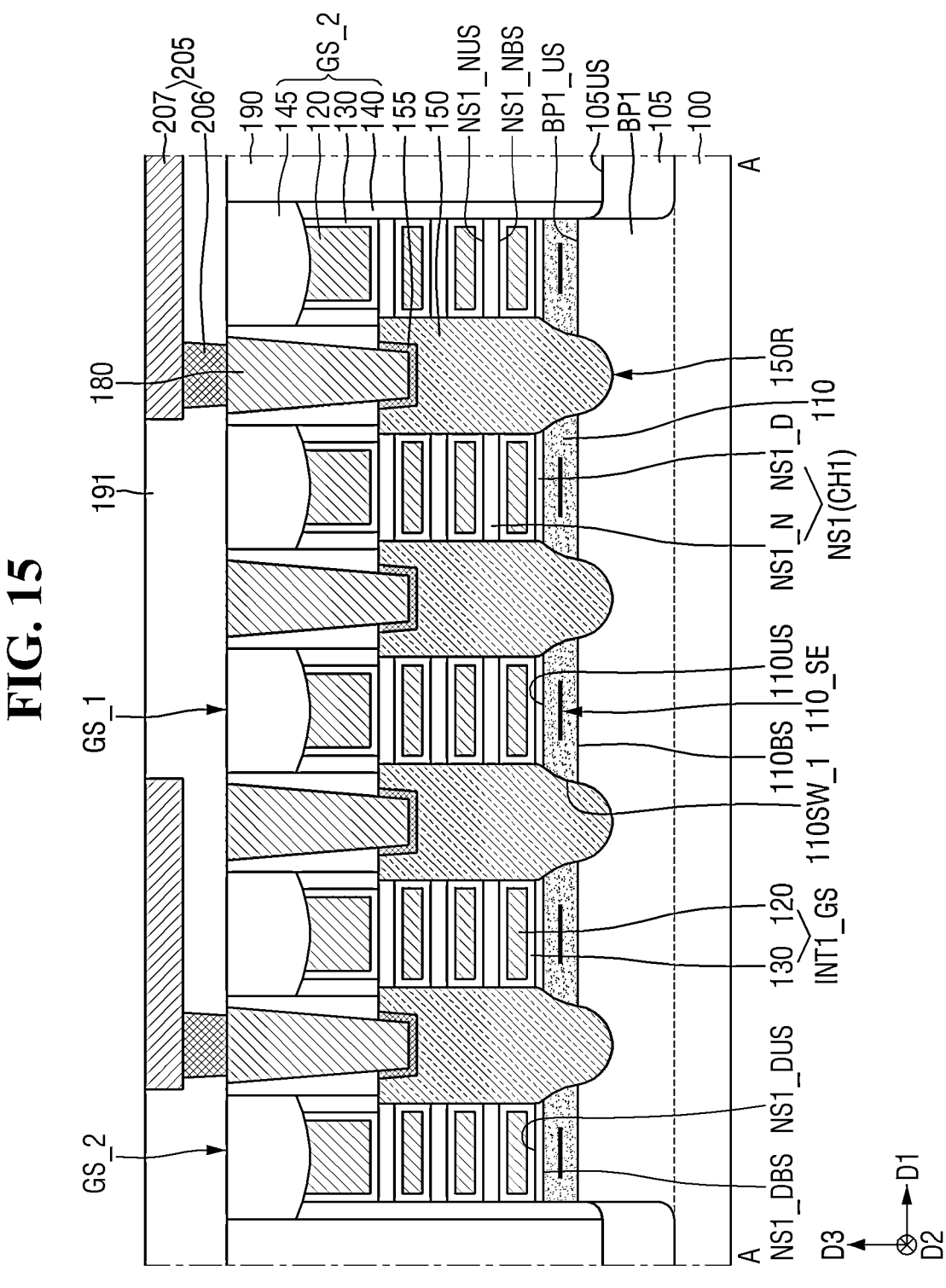
FIG. 15 and FIG. 16 are diagrams for illustrating a semiconductor device according to some example embodiments.
Figure 16:
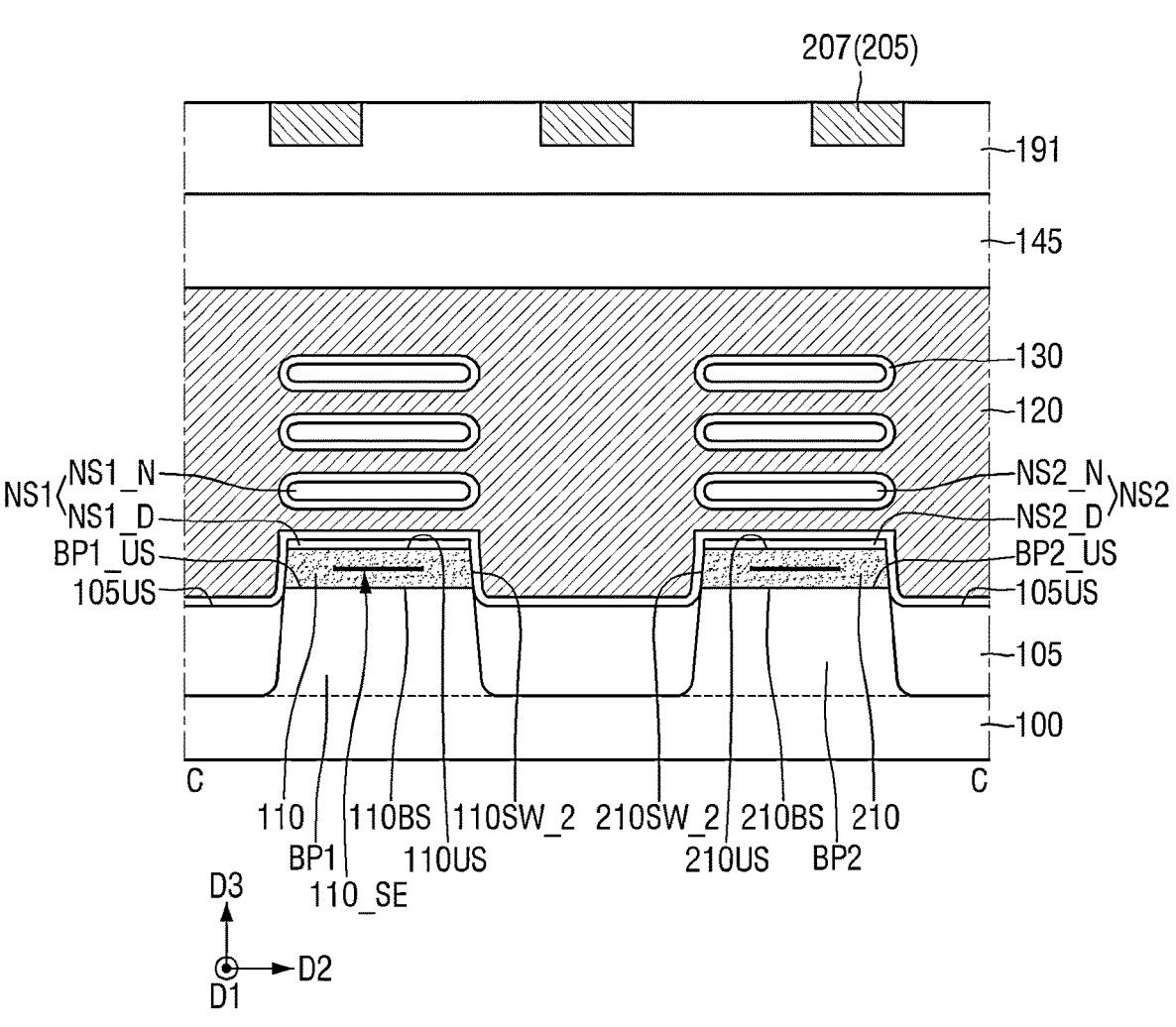
Figure 17:
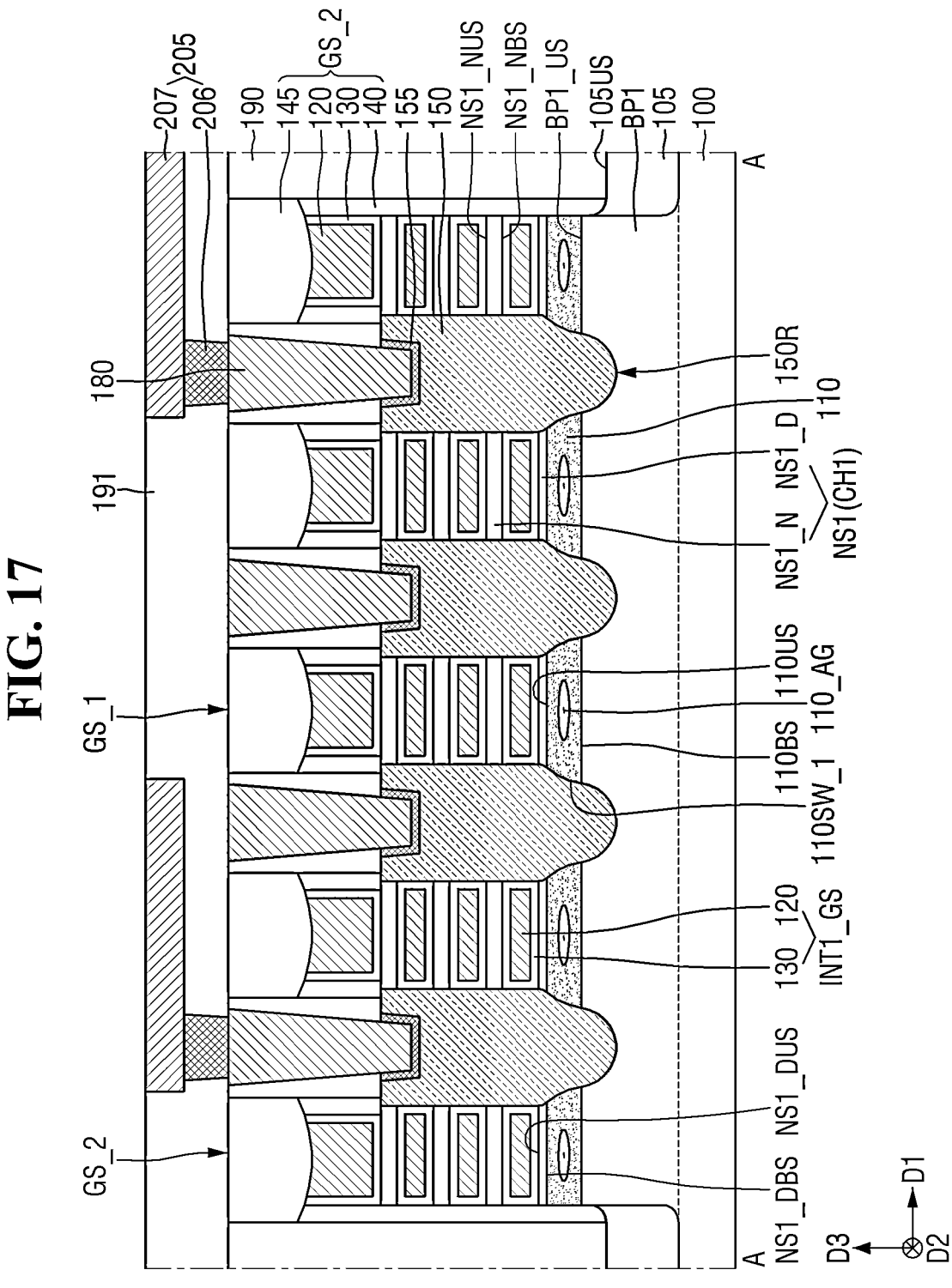
FIG. 17 and FIG. 18 are diagrams for illustrating a semiconductor device according to some example embodiments.
Figure 18:
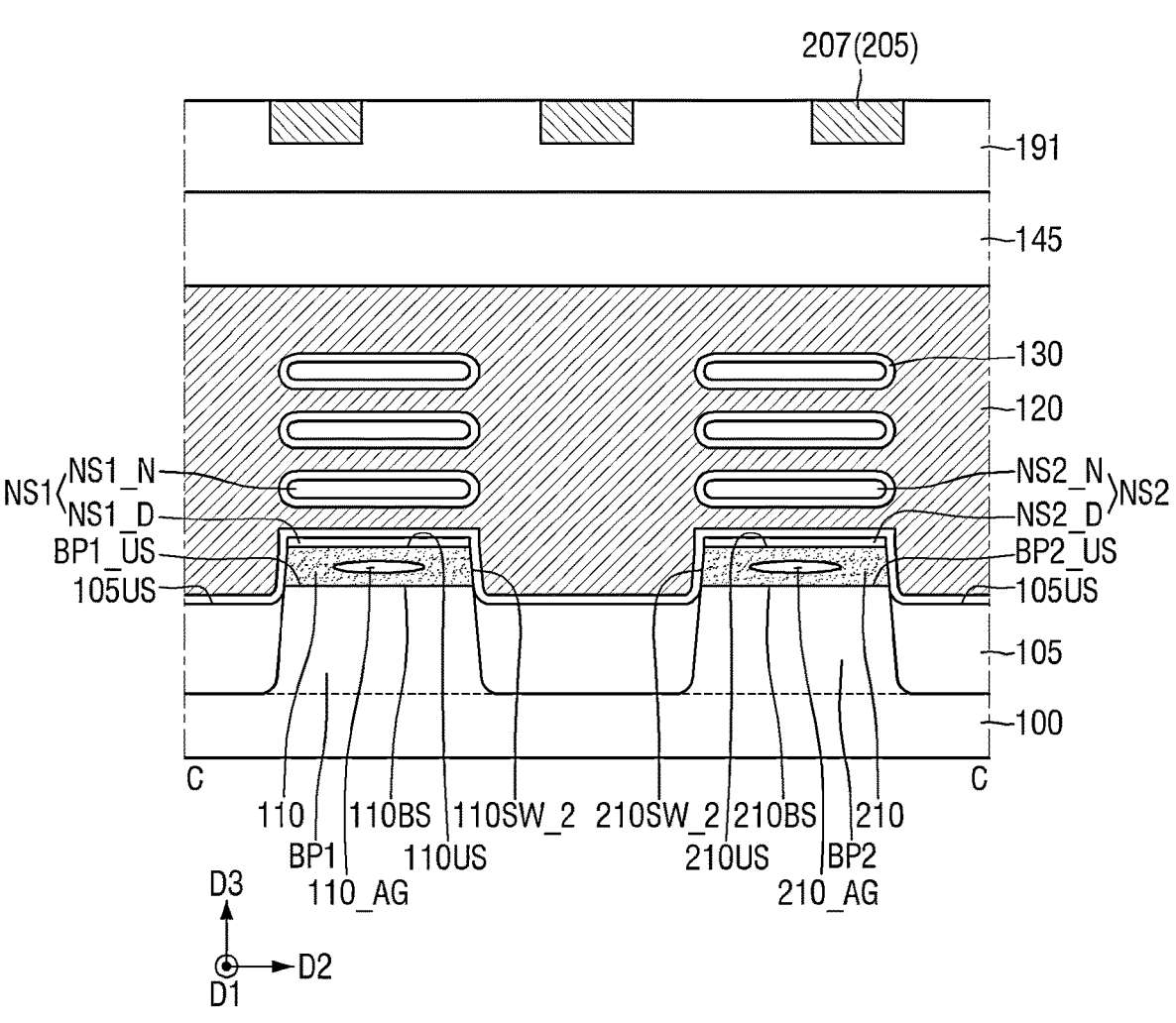
Figure 19:
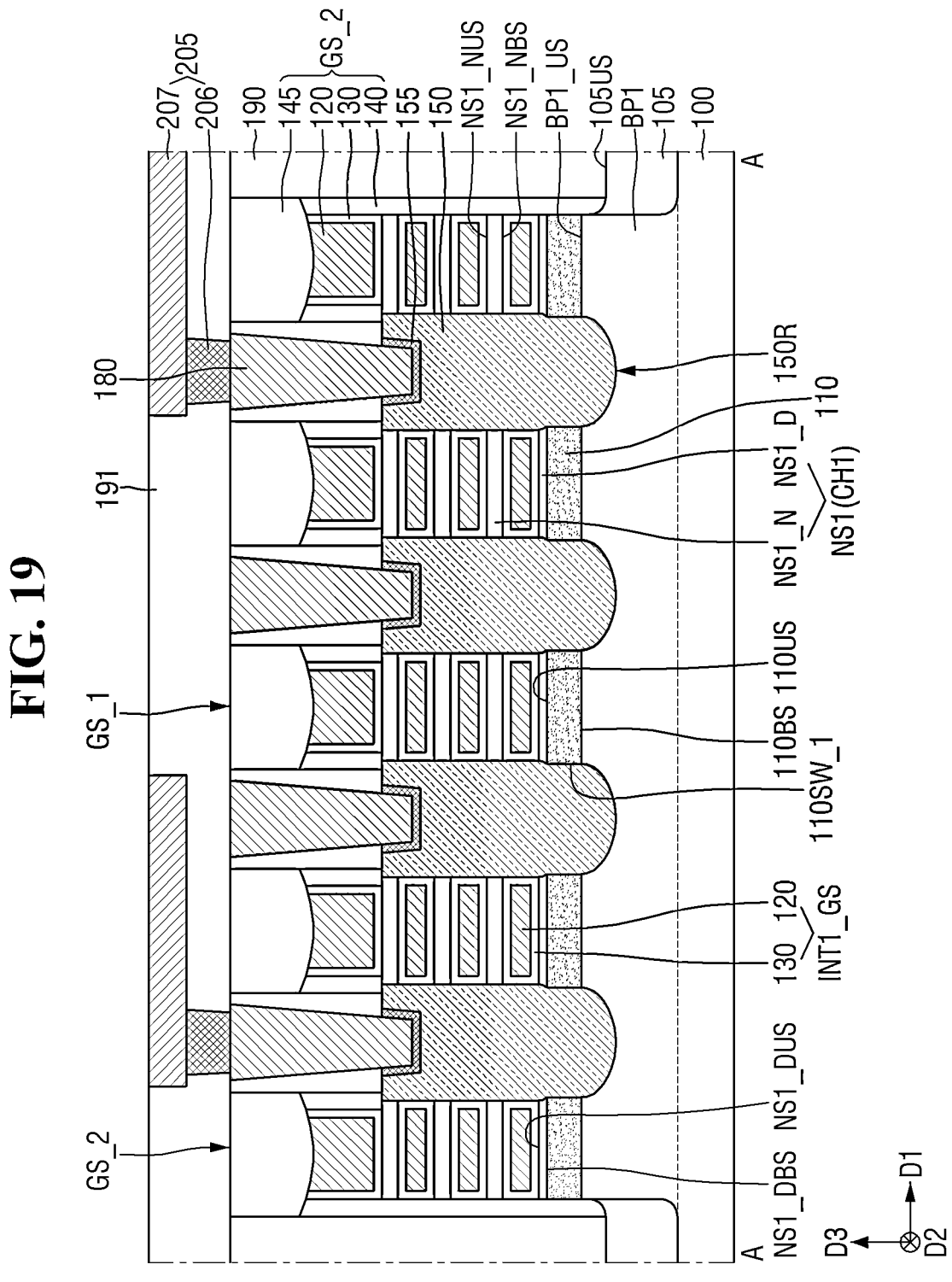
FIGS. 19, 20, and 21 are diagrams for illustrating a semiconductor device according to some example embodiments.
Figure 20:
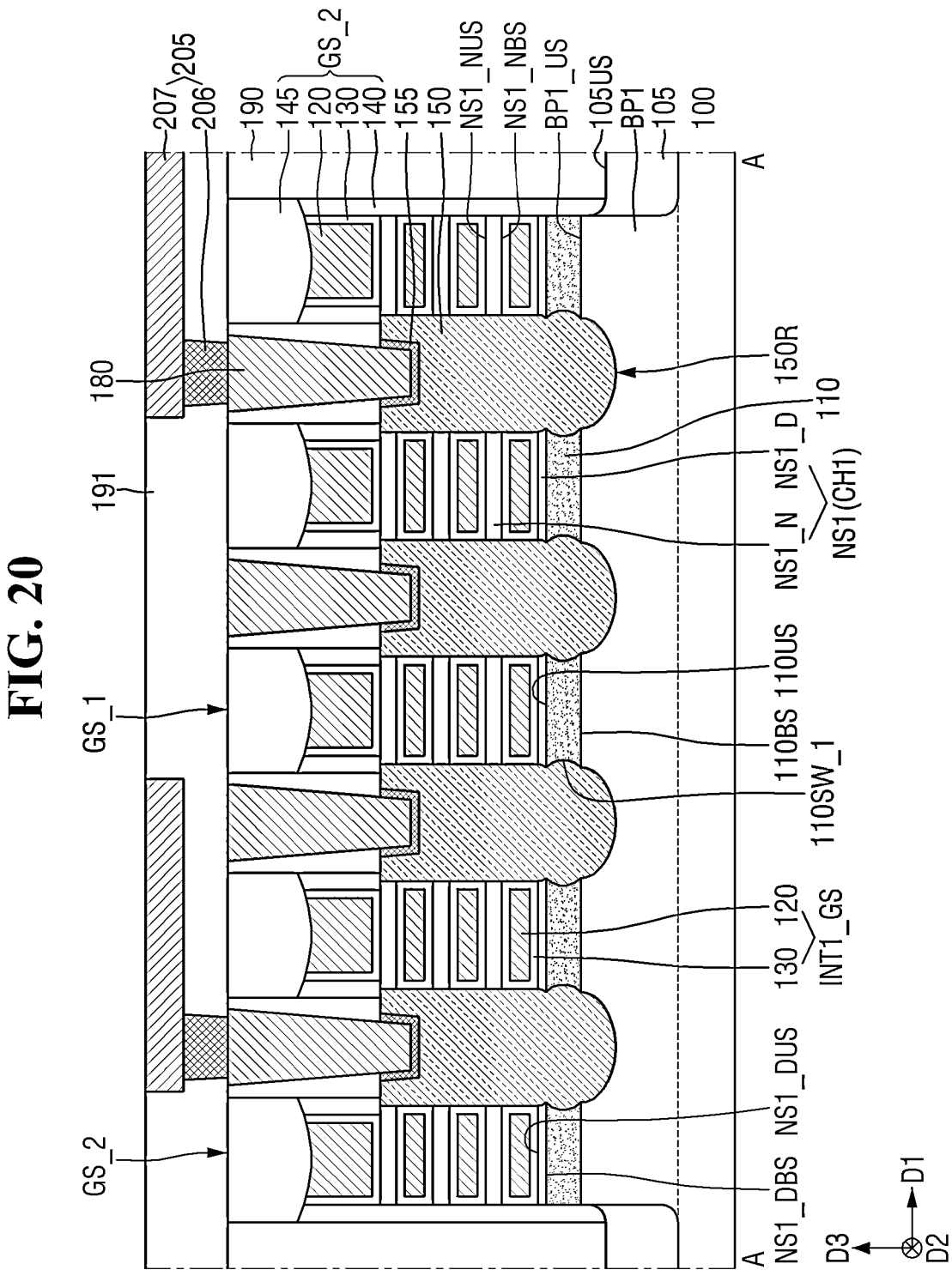
Figure 21:
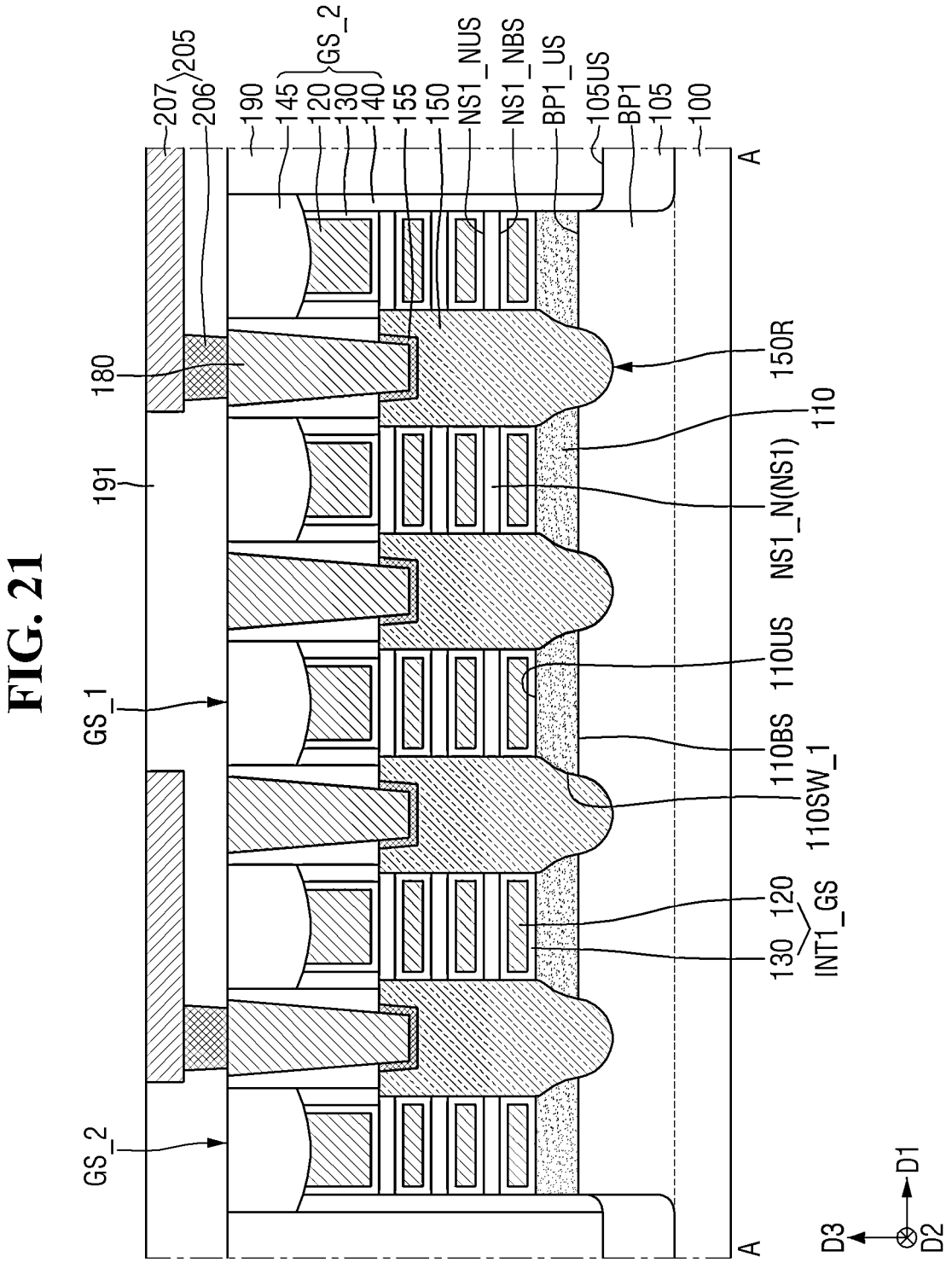

FIG. 15 and FIG. 16 are diagrams for illustrating a semiconductor device according to some example embodiments. FIG. 17 and FIG. 18 are diagrams for illustrating a semiconductor device according to some example embodiments. FIG. 19 to FIG. 21 are diagrams for illustrating a semiconductor device according to some example embodiments. For convenience of illustration, following description is based on differences thereof from those as described above with reference to FIG. 1 to FIG. 7.

Referring to FIG. 15 and FIG. 16, in the semiconductor device according to some example embodiments, the first lower insulating pattern 110 includes a first seam pattern 110_SE.

A width of the first seam pattern 110_SE in the first direction D1 is smaller than the width (W21 of FIG. 2) of the gate electrode 120 in the first direction D1.

The second lower insulating pattern 210 includes a second seam pattern 210_SE. Although not shown, a width of the second seam pattern 210_SE in the first direction D1 is smaller than the width (W22 of FIG. 3) of the gate electrode 120 in the first direction D1.

Referring to FIG. 17 and FIG. 18, in the semiconductor device according to some example embodiments, the first lower insulating pattern 110 includes a first air gap 110_AG.

A width of the first air gap 110_AG in the first direction D1 is smaller than the width (W21 in FIG. 2) of gate electrode 120 in the first direction D1.

The second lower insulating pattern 210 includes a second air gap 210_AG. Although not shown, a width of the second air gap 210_AG in the first direction D1 is smaller than the width (W22 in FIG. 3) of the gate electrode 120 in the first direction D1.

Referring to FIG. 19, in the semiconductor device according to some example embodiments, a width of the upper surface 110US of the first lower insulating pattern in the first direction D1 may be equal to a width of the bottom surface 110BS of the first lower insulating pattern in the first direction D1.

The width of the first lower insulating pattern 110 in the first direction D1 is constant as it moves away from the upper surface 110US of the first lower insulating pattern.

For example, the width of the first lower insulating pattern 110 in the first direction D1 may be equal to a width of the first channel pattern CH1 in the first direction D1.

Referring to FIG. 20, in the semiconductor device according to some example embodiments, the width of the first lower insulating pattern 110 in the first direction D1 may decrease and then increase as it moves away from the upper surface 110US of the first lower insulating pattern.

The first sidewall 110SW_1 of the first lower insulating pattern may have a concave shape.

Although not shown, the second lower insulating pattern (210 of FIG. 3) may have a shape as shown in FIG. 19 and FIG. 20.

Referring to FIG. 21, in the semiconductor device according to some example embodiments, the first sheet pattern NS1 does not include the first dummy sheet pattern (NS1_D of FIG. 2).

The first sheet pattern NS1 may include only a plurality of first normal sheet patterns NS1_N. The first inner gate structure INT1_GS is in contact with the upper surface 110US of the first lower insulating pattern.

Although not shown, the second sheet pattern (NS2 in FIG. 3) does not include the second dummy sheet pattern (NS2_D of FIG. 3). The second inner gate structure INT2_GS is in contact with the upper surface 210US of the second lower insulating pattern.

Figure 22:
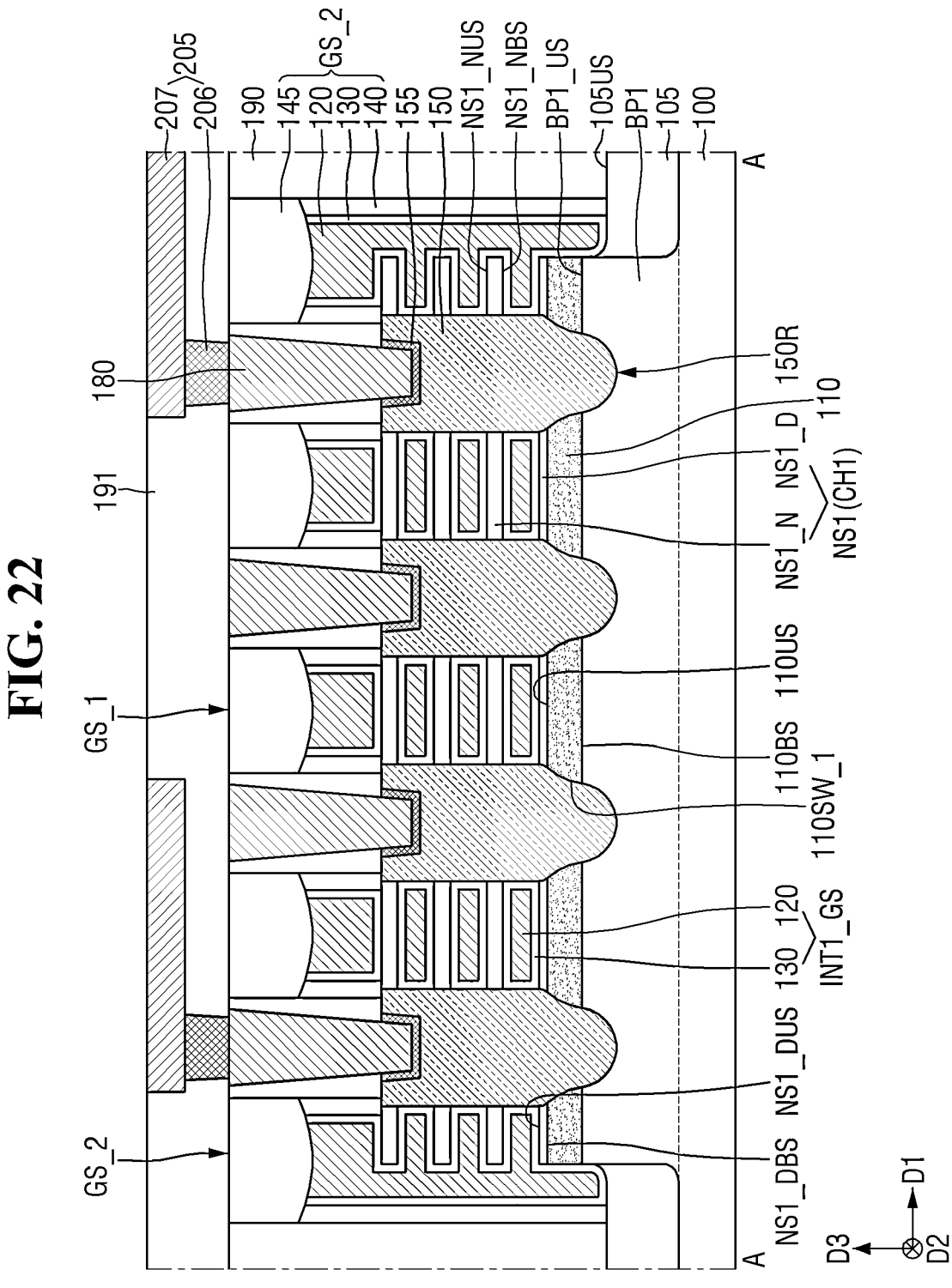
FIG. 22 and FIG. 23 are diagrams for illustrating a semiconductor device according to some example embodiments.
Figure 23:
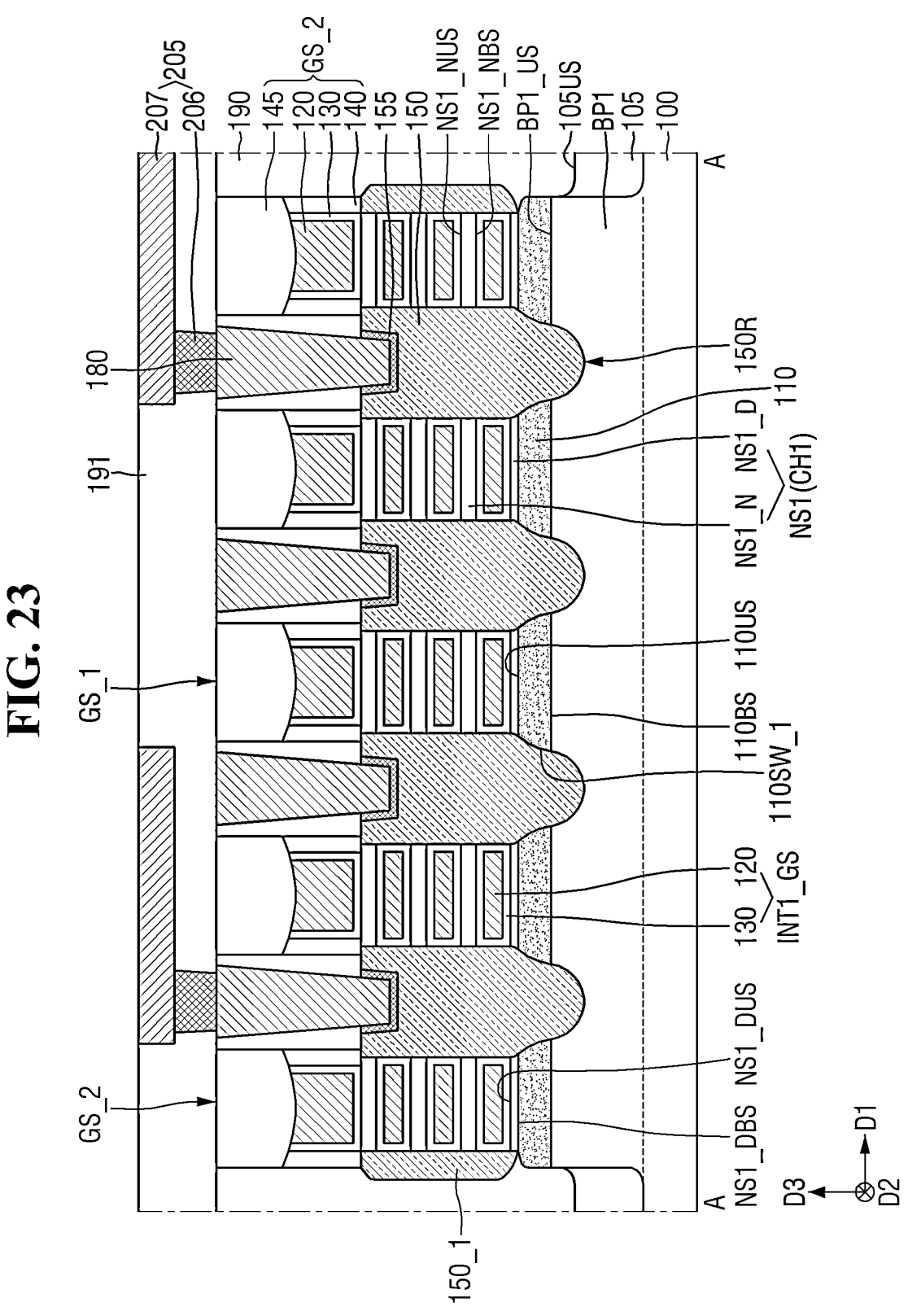

FIG. 22 and FIG. 23 are diagrams for illustrating a semiconductor device according to some example embodiments. For convenience of illustration, following description is based on differences thereof from those as described above with reference to FIG. 1 to FIG. 7.

Referring to FIG. 22, in the semiconductor device according to some example embodiments, the gate electrode 120 included in the edge gate structure GS_2 may surround the first channel pattern CH1 disposed on a terminating end of the first lower pattern BP1.

In a cross-sectional view, a portion of the gate electrode 120 included in the edge gate structure GS_2 overlaps the first channel pattern CH1 in the third direction D3. In the cross-sectional view, the remainder of the gate electrode 120 included in the edge gate structure GS_2 does not overlap with the first channel pattern CH1 in the third direction D3.

Although not shown, the gate electrode 120 included in the edge gate structure GS_2 may surround the second channel pattern CH2 disposed on a terminating end of the second lower pattern BP2.

Referring to FIG. 23, the semiconductor device according to some example embodiments may further include a first edge source/drain pattern 150_1 connected to the first channel pattern CH1.

The first edge source/drain pattern 150_1 is connected to the first channel pattern CH1 disposed on a terminating end of the first lower pattern BP1. The first channel pattern CH1 is disposed only on one side of the first edge source/drain pattern 150_1.

The first source/drain pattern 150 may be disposed on one side of the edge gate structure GS_2, while the first edge source/drain pattern 1501 may be disposed on the other side of the edge gate structure GS_2.

Although not shown, the second channel pattern CH2 disposed on a terminating end of the second lower pattern BP2 may be connected to a second edge source/drain pattern.

Figure 24:
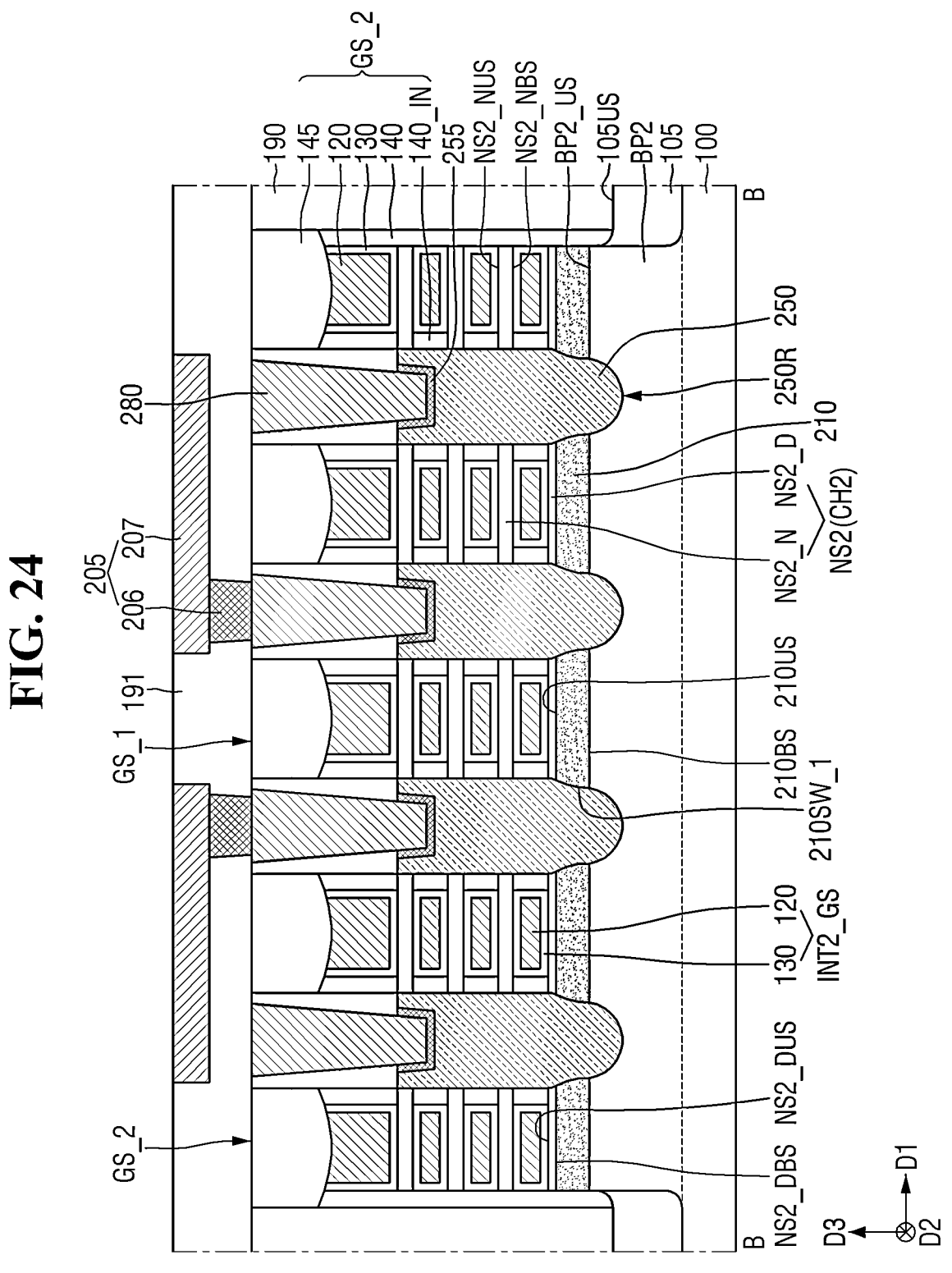
FIG. 24 is a diagram for illustrating a semiconductor device according to some example embodiments.
Figure 25:
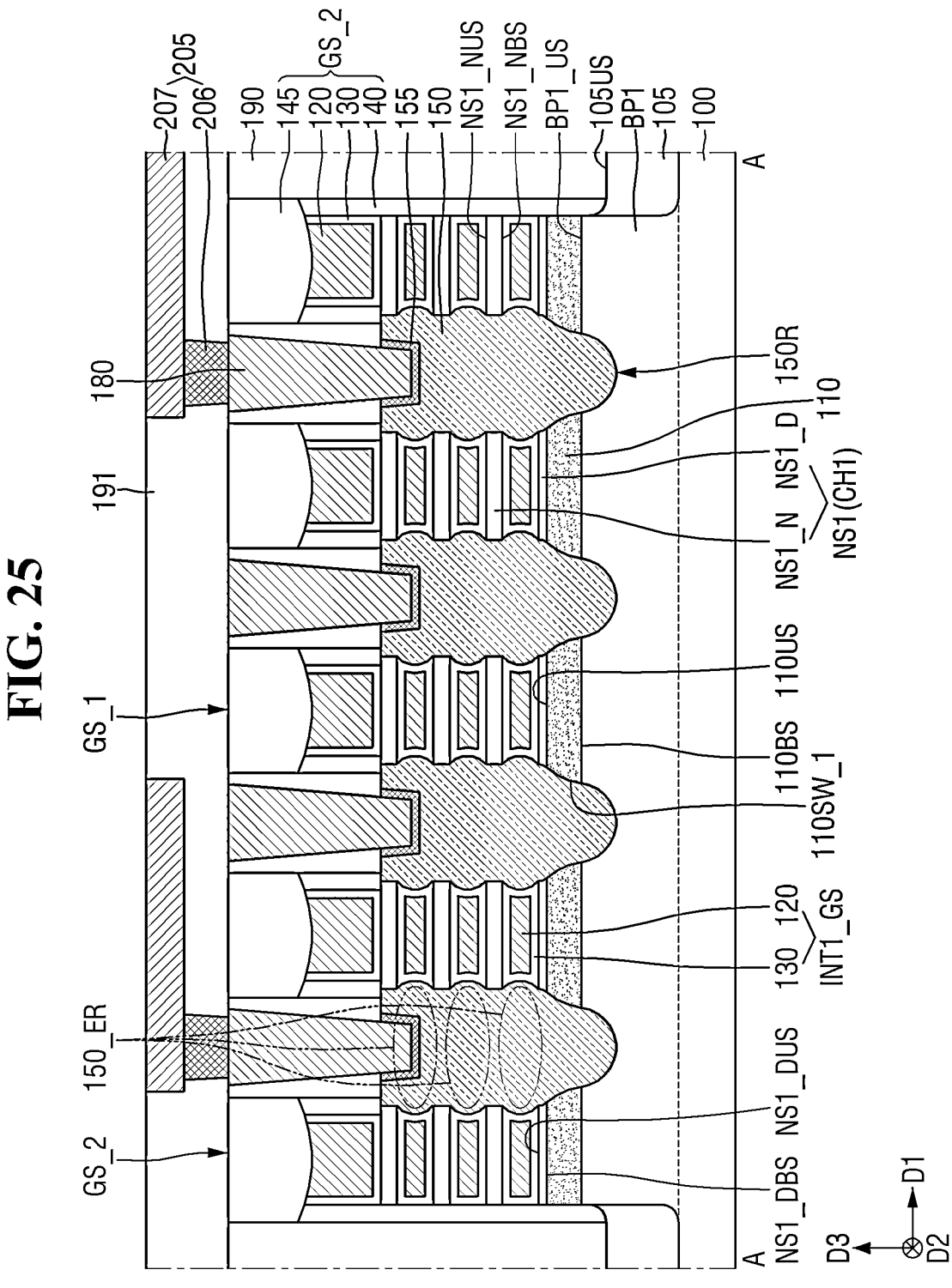
FIG. 25 and FIG. 26 are diagrams for illustrating a semiconductor device according to some example embodiments.
Figure 26:
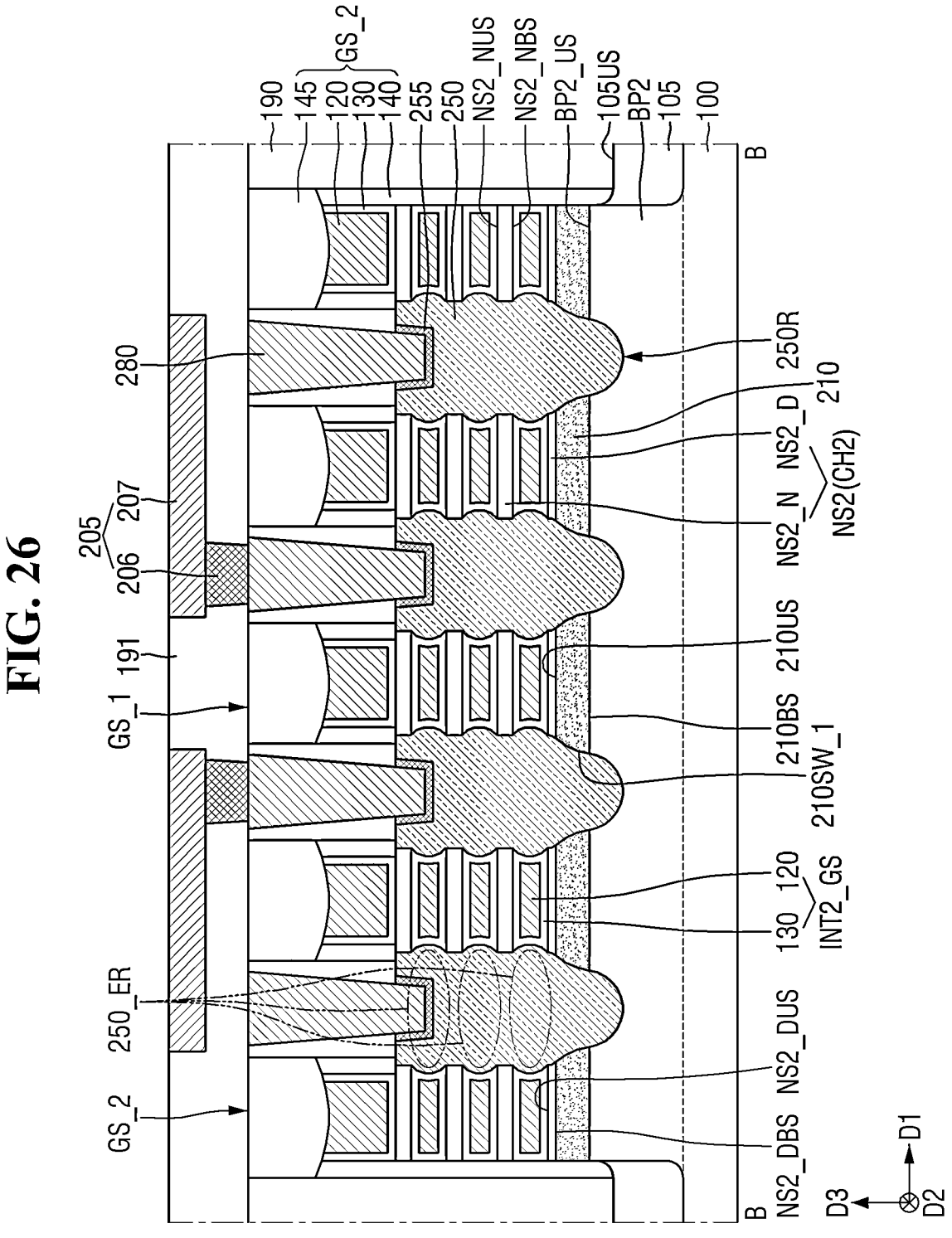

FIG. 24 is a diagram for illustrating a semiconductor device according to some example embodiments. FIG. 25 and FIG. 26 are diagrams for illustrating a semiconductor device according to some example embodiments. For convenience of illustration, following description is based on differences thereof from those as described above with reference to FIG. 1 to FIG. 7.

Referring to FIG. 24, in the semiconductor device according to some example embodiments, the gate structures GS_1 and GS_2 may further include a plurality of inner spacers 140_IN disposed between the second sheet patterns NS2 adjacent to each other in the third direction D3 (e.g., between adjacent second sheet patterns NS2).

The plurality of inner spacers 140_IN may be disposed between the second normal sheet patterns NS2_N adjacent to each other in the third direction D3 and between the second dummy sheet pattern NS2_D and the second normal sheet pattern NS2_N. The inner spacer 140_IN may be disposed between the upper surface NS2_DUS of the second dummy sheet pattern and the bottom surface NS2_NBS of the second normal sheet pattern, and between the upper surface NS1_NUS of the first normal sheet pattern and the bottom surface NS1_NBS of the first normal sheet pattern facing each other in the third direction D3.

The inner spacer 140_IN is disposed between the second inner gate structure INT2_GS and the second source/drain pattern 250. When the inner spacer 140_IN is disposed, the inner gate structure INT2_GS does not contact the second source/drain pattern 250. A sidewall of the second source/drain recess 250R may be defined by the second sheet pattern NS2, the inner spacer 140_IN, and the first sidewall 210SW_1 of the second lower insulating pattern.

The inner spacer 140_IN may include, for example, at least one of silicon nitride (SiN), silicon oxynitride (SiON), silicon oxide (SiO$_2$), silicon oxycarbonitride (SiOCN), silicon boron nitride (SiBN), silicon oxyboronitride (SiOBN), silicon oxycarbide (SiOC), and combinations thereof.

Unlike what is shown, the inner spacer 140_IN disposed at the lowest level (e.g., an inner spacer 140_IN closest proximity to the reference location such as a bottom surface of the substrate 100 in relation to a remainder of the inner spacers 140_IN in the third direction D3) may extend to the upper surface 210US of the second lower insulating pattern. That is, the inner spacer 140_IN disposed at the lowest level may contact the second lower insulating pattern 210.

The inner spacer is not disposed between the first inner gate structure (INT2_GS in FIG. 2) and the first source/drain pattern 150. The inner spacer is not disposed between the first normal sheet patterns NS1_N adjacent to each other in the third direction D3 and between the first dummy sheet pattern NS1D and the first normal sheet pattern NS1_N.

Referring to FIG. 25 and FIG. 26, in the semiconductor device according to some example embodiments, the first source/drain recess 150R may include a plurality of first width extension areas 150R_ER.

The first width extension areas 150R_ER may be disposed above the upper surface 110US of the first lower insulating pattern.

The first width extension area 150R_ER may be defined between the first sheet patterns NS1 adjacent to each other in the third direction D3. The first width extension area 150R_ER may be defined between the first dummy sheet pattern NS1_D and the first normal sheet pattern NS1_N. The first width extension area 150R_ER may extend into a portion between the first sheet patterns NS1 adjacent to each other in the third direction D3. The first width extension area

150R_ER may be defined between the first inner gate structures INT1_GS adjacent to each other in the first direction D1.

Each of the first width extension areas 150R_ER may include a portion whose width in the first direction D1 increases as it moves away from the upper surface 110US of the first lower insulating pattern, and a portion whose width in the first direction D1 decreases as it moves away from the upper surface 110US of the first lower insulating pattern. For example, as it moves away from the upper surface 110US of the first lower insulating pattern, the width of the first width extension area 150R_ER in the first direction D1 may increase and then decrease.

A point with the largest width in each of the first width extension areas 150R_ER is located between the first dummy sheet pattern NS1_D and the first normal sheet pattern NS1_N, or between the first normal sheet patterns NS1_N adjacent to each other in the third direction D3.

The second source/drain recess 250R may include a plurality of second width extension areas 250R_ER. Each of the second width extension areas 250R_ER may be located above the upper surface 210US of the second lower insulating pattern. Description of the second width extension area 250R_ER is similar to the description of the first width extension area 150R_ER, and thus will be omitted below.

Unlike what is illustrated, one of the first source/drain recess 150R and the second source/drain recess 250R may include a width extension area, and the other thereof may not include a width extension area.

Figure 27:
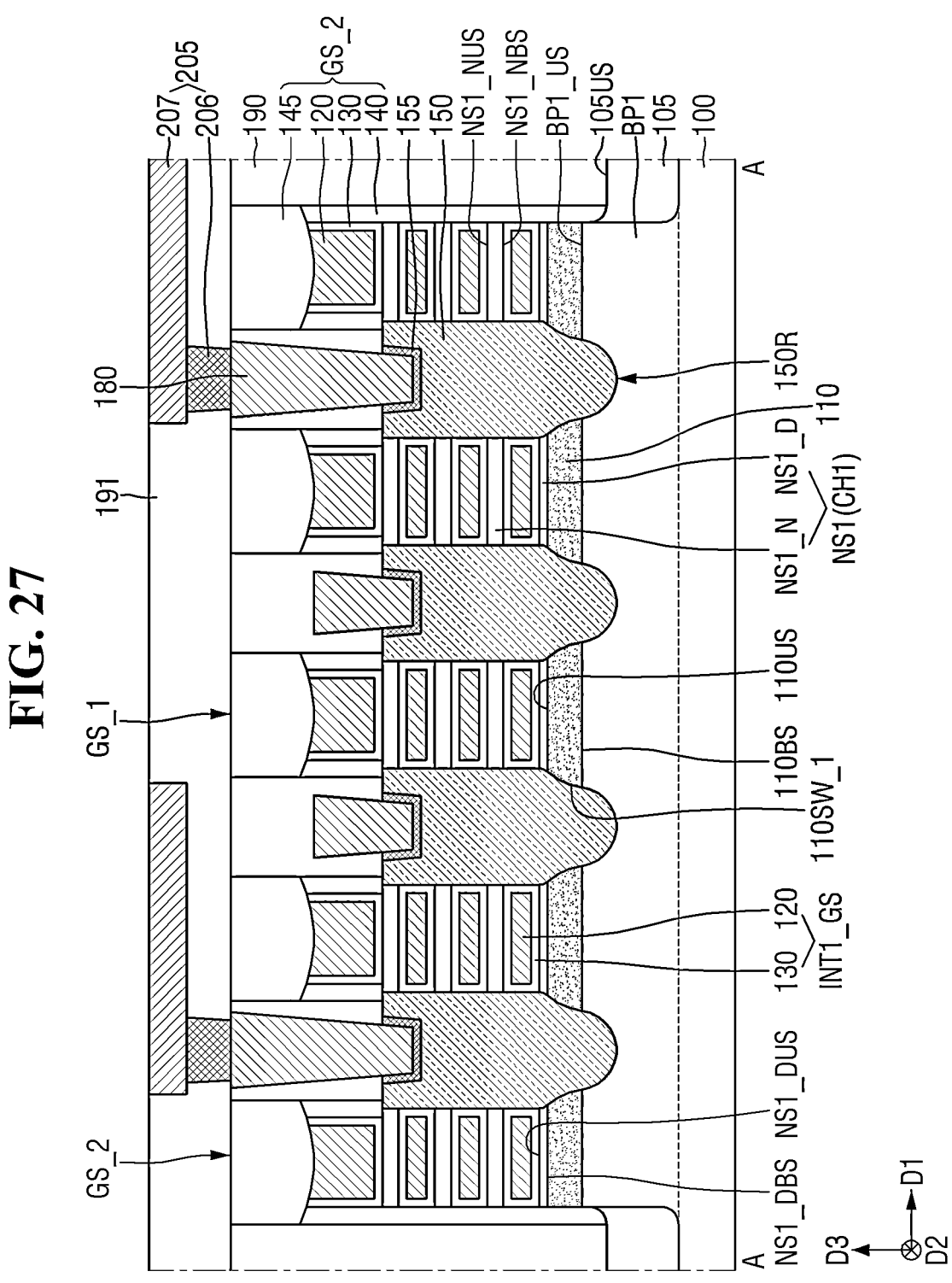
FIG. 27 and FIG. 28 are diagrams for illustrating a semiconductor device according to some example embodiments.
Figure 28:
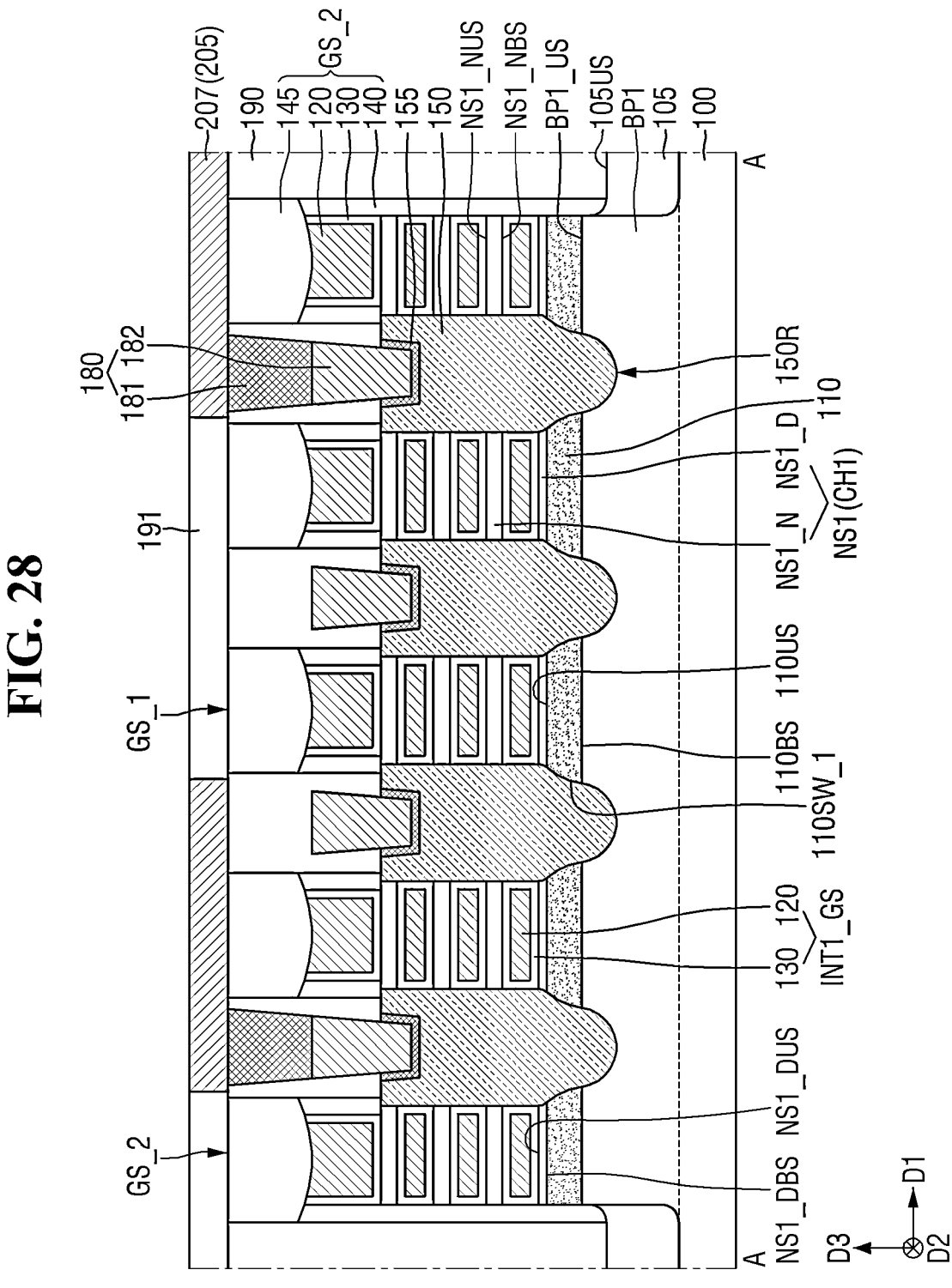

FIG. 27 and FIG. 28 are diagrams for illustrating a semiconductor device according to some example embodiments. For convenience of illustration, following description is based on differences thereof from those as described above with reference to FIG. 1 to FIG. 7.

Referring to FIG. 27, in the semiconductor device according to some example embodiments, a vertical level of an upper surface of a portion the first source/drain contact 180 not connected to the wire structure 205 is lower than a vertical level of an upper surface of the first gate capping pattern 145.

A vertical level of an upper surface of a portion of the first source/drain contact 180 connected to the wire structure 205 is lower than that of the upper surface of the portion of the first source/drain contact 180 not connected to the wire structure 205.

Referring to FIG. 28, in the semiconductor device according to some example embodiments, the first source/drain contact 180 includes a lower source/drain contact 181 and an upper source/drain contact 182.

The upper source/drain contact 182 may be disposed in a portion connected to the wire structure 205. On the contrary, the upper source/drain contact 182 may not be disposed in a portion not connected to the wire structure 205.

The wire line 207 may be connected to the first source/drain contact 180 without the wire via (206 in FIG. 2). The wire structure 205 may not include the wire via (206 in FIG. 2).

Although each of the lower source/drain contact 181 and the upper source/drain contact 182 is shown as a single film, this is only for convenience of illustration. However, the inventive concepts are not limited thereto. Each of the lower source/drain contact 181 and the upper source/drain contact 182 may include, for example, at least one of metal, metal alloy, conductive metal nitride, conductive metal carbide, conductive metal oxide, conductive metal carbonitride, and a two-dimensional material.

Although not shown, the second source/drain contact 280 may have a shape as described above with reference to FIG. 27 and FIG. 28.

FIGS. 29, 30, 31, 32, and 33 are diagrams for illustrating a semiconductor device according to some example embodiments. For the convenience of illustration, following description is based on differences thereof from those as described above with reference to FIG. 1 to FIG. 7.

Figure 29:
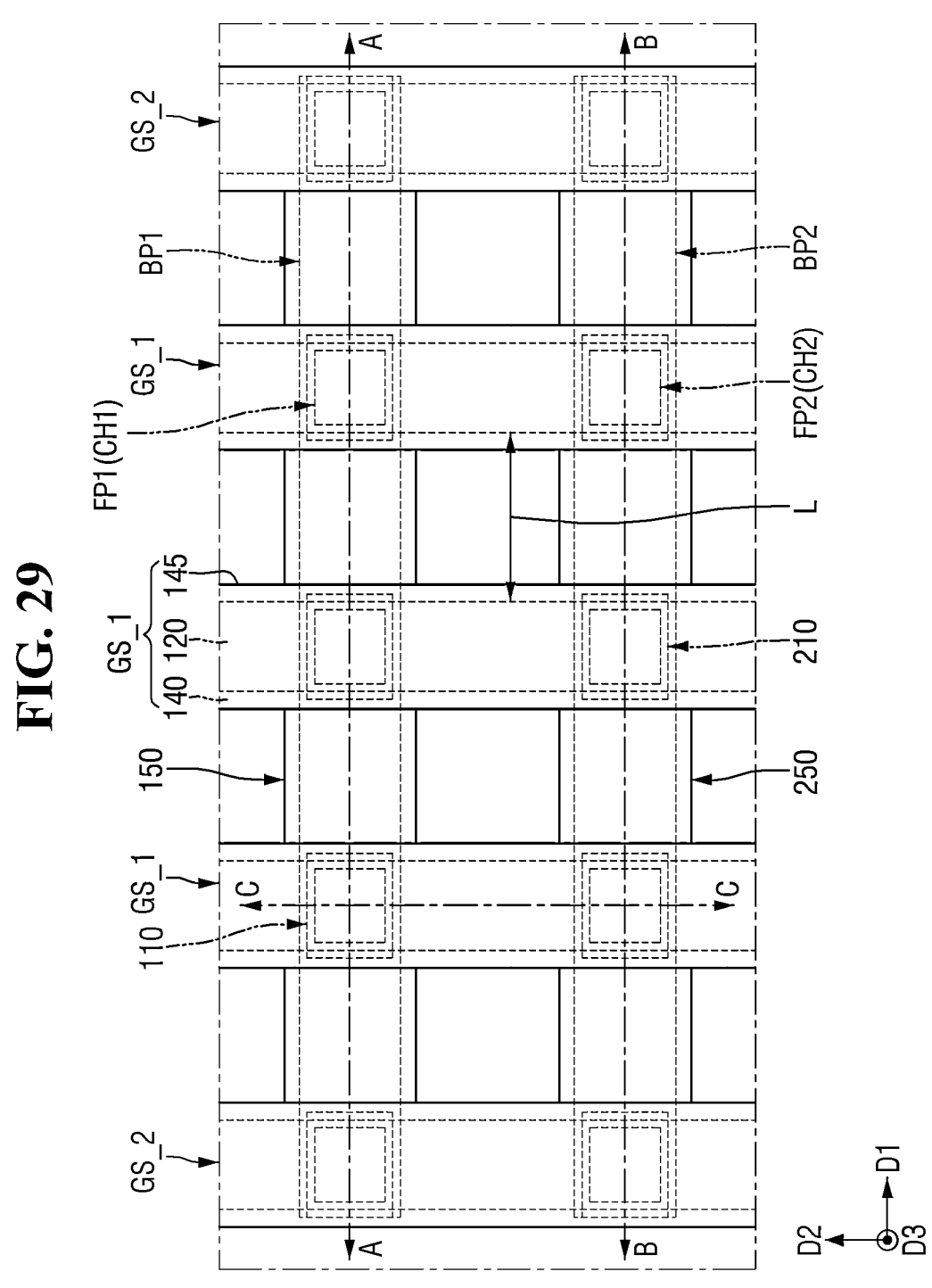
FIGS. 29, 30, 31, 32, and 33 are diagrams for illustrating a semiconductor device according to some example embodiments.
Figure 30:
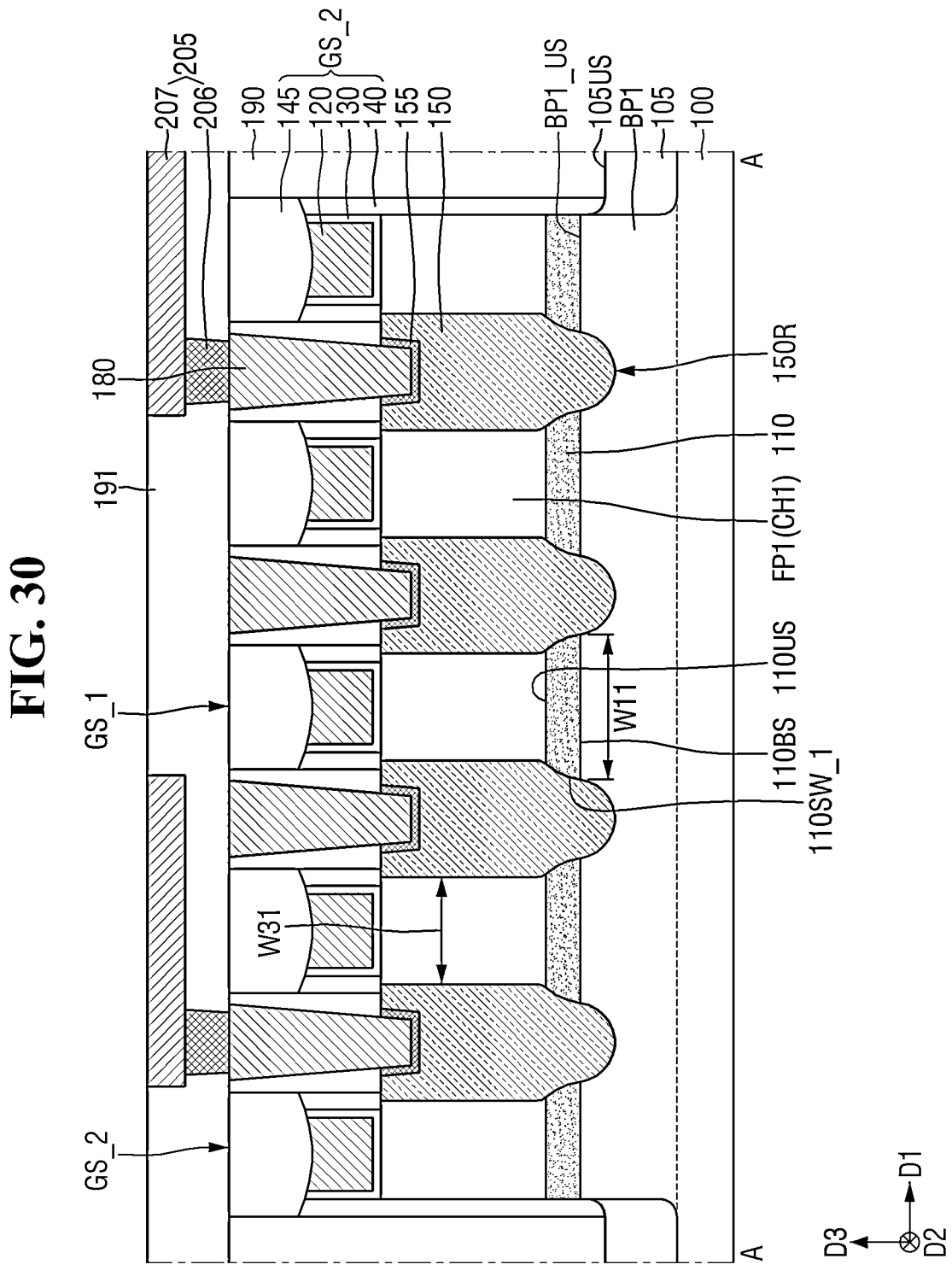
Figure 31:
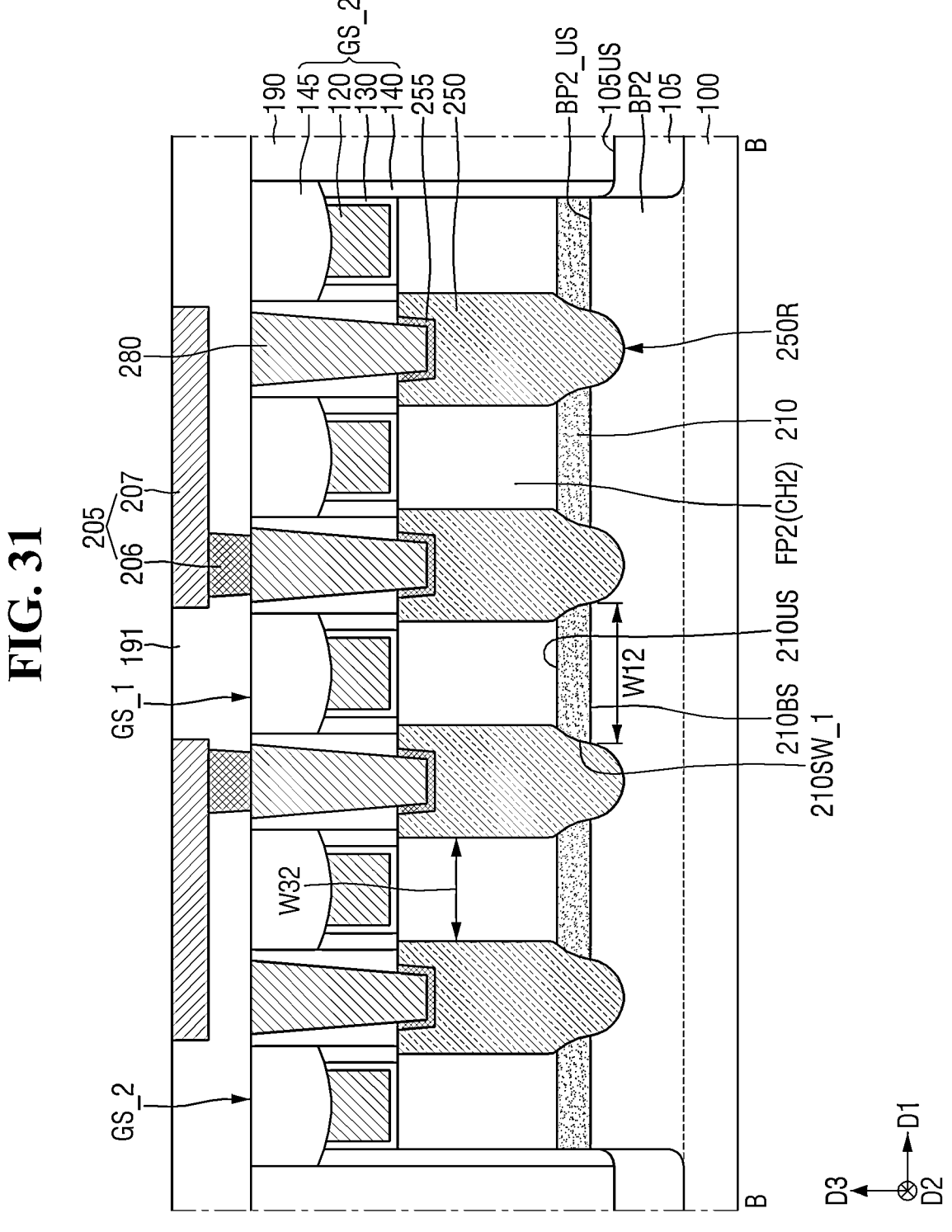
Figure 32:
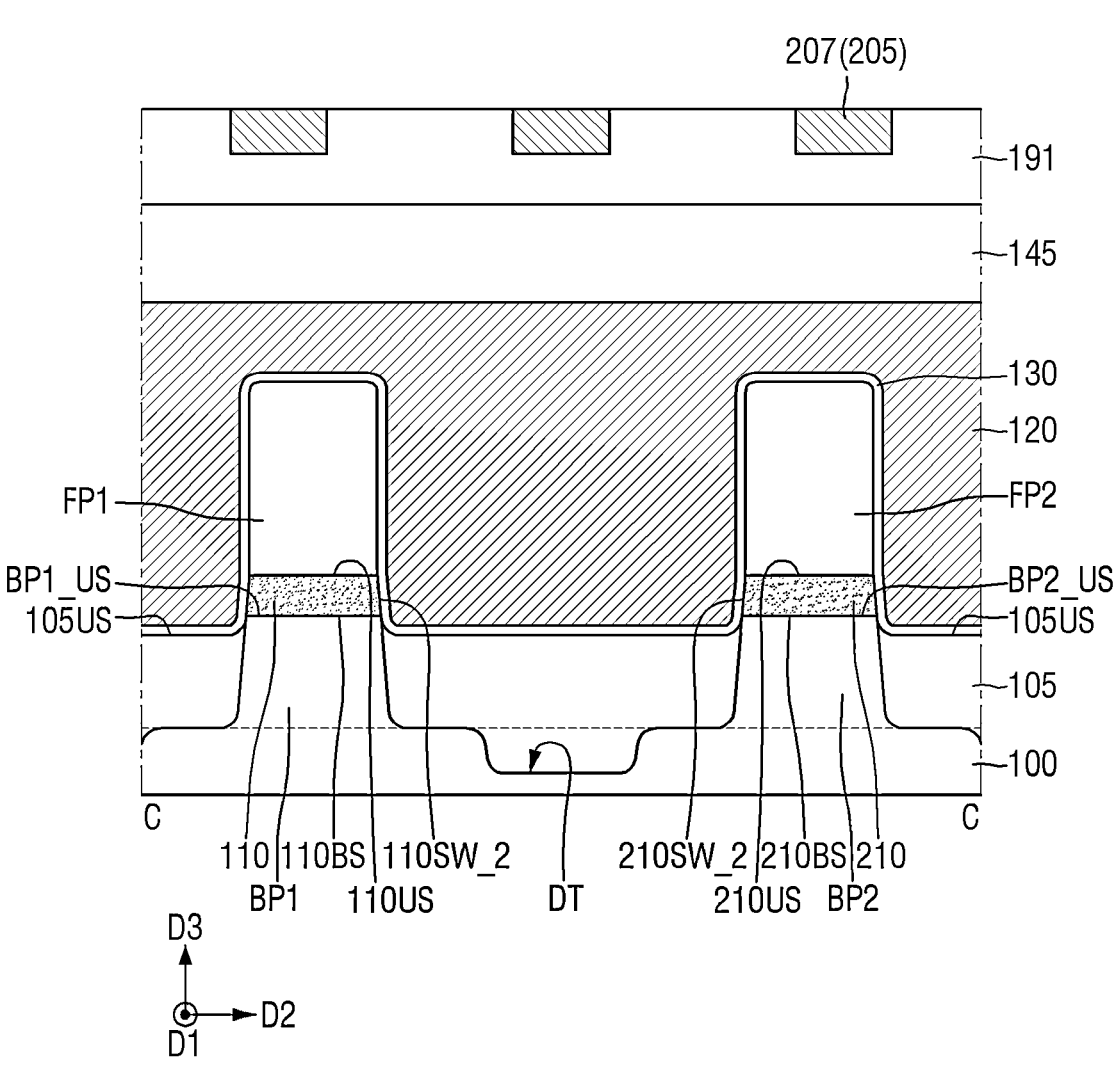
Figure 33:
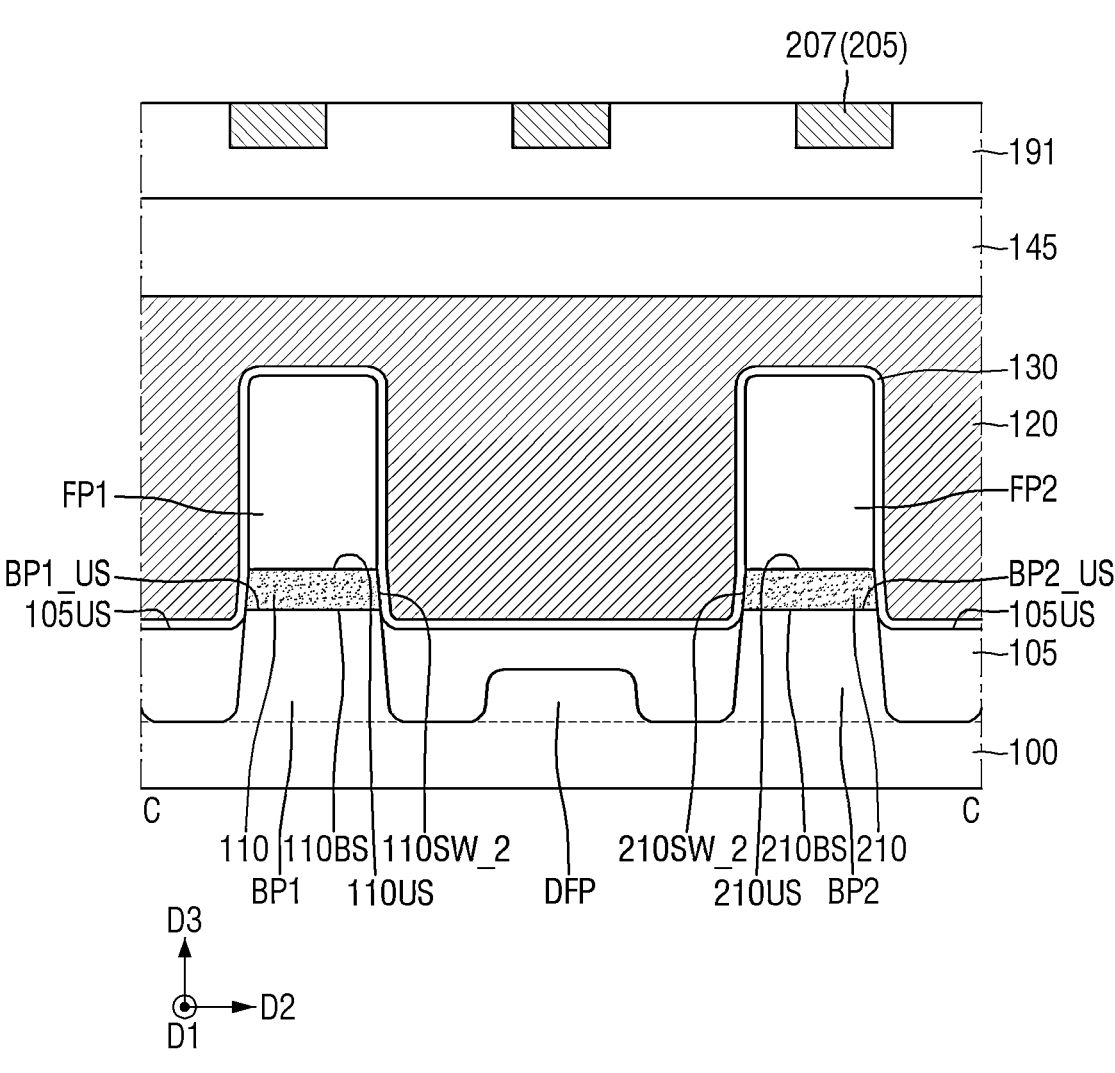

For reference, FIG. 29 is a schematic plan view for illustrating a semiconductor device according to some example embodiments. FIG. 30 and FIG. 31 are cross-sectional views taken along A-A and B-B of FIG. 29. FIG. 32 and FIG. 33 are illustrative cross-sectional views taken along C-C of FIG. 29.

Referring to FIG. 29 to FIG. 33, in the semiconductor device according to some example embodiments, the first channel pattern CH1 may include a first fin pattern FP1, and the second channel pattern CH2 may include a second fin pattern FP2.

The first fin pattern FP1 may be disposed on the upper surface 110US of the first lower insulating pattern. The first fin pattern FP1 may contact the first lower insulating pattern 110.

The second fin pattern FP2 may be disposed on the upper surface 210US of the second lower insulating pattern. The second fin pattern FP2 may contact the second lower insulating pattern 210.

The width W11 of the first lower insulating pattern 110 in the first direction D1 may be greater than or equal to a width W31 of the first fin pattern FP1 in the first direction D1. The width W12 of the second lower insulating pattern 210 in the first direction D1 may be greater than or equal to a width W32 of the second fin pattern FP2 in the first direction D1.

Each of the first fin pattern FP1 and the second fin pattern FP2 may include one of silicon or germanium as an elemental semiconductor material, a group IV-IV compound semiconductor, or a group III-V compound semiconductor. The first fin pattern FP1 may include the same material as that of the first lower pattern BP1, or may include a material different from that of the first lower pattern BP1. The second fin pattern FP2 may include the same material as that of the second lower pattern BP2, or may include a material different from that of the second lower pattern BP2. The first fin pattern FP1 and the second fin pattern FP2 may include the same material, and or include different materials. In the semiconductor device according to some example embodiments, each of the first fin pattern FP1 and the second fin pattern FP2 may be a silicon fin pattern including silicon.

In FIG. 32, each of the first lower pattern BP1 and the second lower pattern BP2 may be disposed in an active area defined by a deep trench DT. The deep trench DT may define a field area disposed between active areas. The field insulating film 105 fills the deep trench DT.

It illustrated that in the active area defined by the deep trench DT, each of one first lower pattern BP1 and one second lower pattern BP2 is disposed. However, the present inventive concepts are not limited thereto. At least two first lower patterns BP1 may be disposed in the active area. At least two second lower patterns BP2 may be disposed in the active area.

In FIG. 33, a dummy protruding pattern DFP may be disposed in a field area that defines the active area. That is, the active area may be defined between the dummy protruding patterns DFP adjacent to each other in the second direction D2.

The field insulating film 105 covers an upper surface of the dummy protruding pattern DFP. The dummy protruding pattern DFP includes the same material as that of each of the first lower pattern BP1 and the second lower pattern BP2. Unlike what is illustrated, at least two first lower patterns BP1 may be disposed in the active area and at least two second lower patterns BP2 may be disposed in the active area.

The plurality of gate structures GS_1 and GS_2 do not include an inner gate structure.

The first source/drain pattern 150 is connected to the first fin pattern FP1. The first source/drain pattern 150 contacts the first fin pattern FP1. The second source/drain pattern 250 is connected to the second fin pattern FP2. The second source/drain pattern 250 contacts the second fin pattern FP2.

A sidewall of the first source/drain recess 150R may be defined by the first fin pattern FP1 and the first lower insulating pattern 110. A sidewall of the second source/drain recess 250R may be defined by the second fin pattern FP2 and the second lower insulating pattern 210.

FIGS. 34, 35, 36, 37, 38, 39, 40, 41, 42, 43, 44, 45, 46, 47, 48, 49, and 50 are diagrams of structures of intermediate steps for illustrating a method for manufacturing a semiconductor device according to some example embodiments. Hereinafter, a process in which the components (for example, the first lower insulating pattern, the first sheet pattern, etc.) on the first lower pattern BP1 is formed will be described. In the same manner, a process of forming the components on the second lower pattern BP2 may be understood. In addition, although not shown, the lower insulating line pattern on (BP2 in FIG. 1) of the second lower pattern is formed simultaneously with formation of the lower insulating line pattern (110P of FIG. 40 to FIG. 45) on the first lower pattern BP1.

Figure 34:
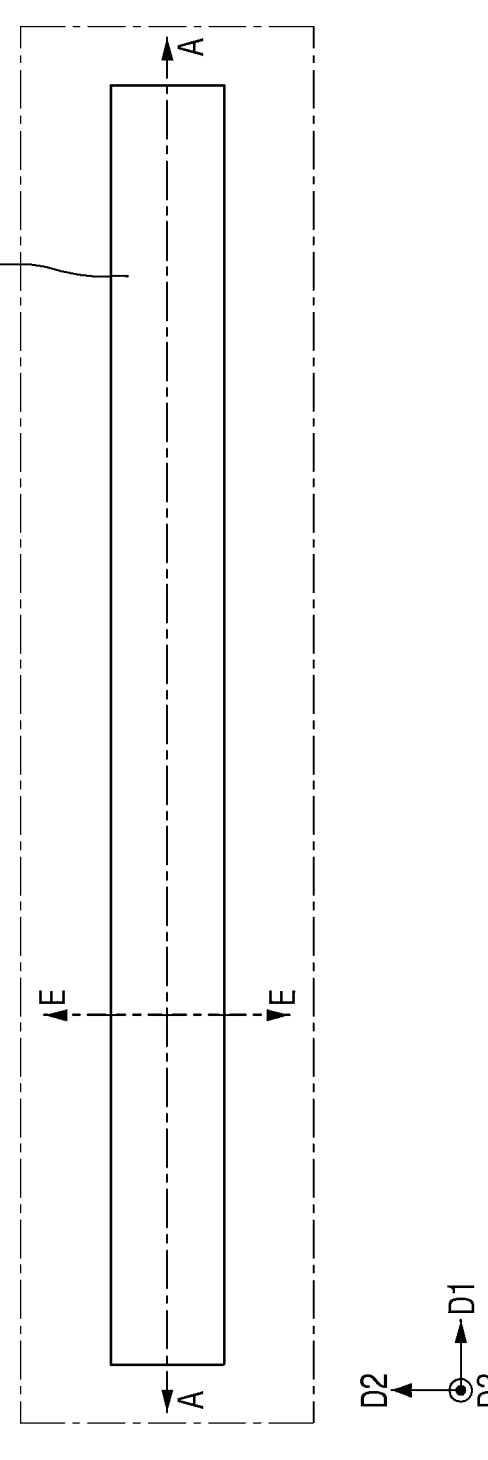
Figure 35:
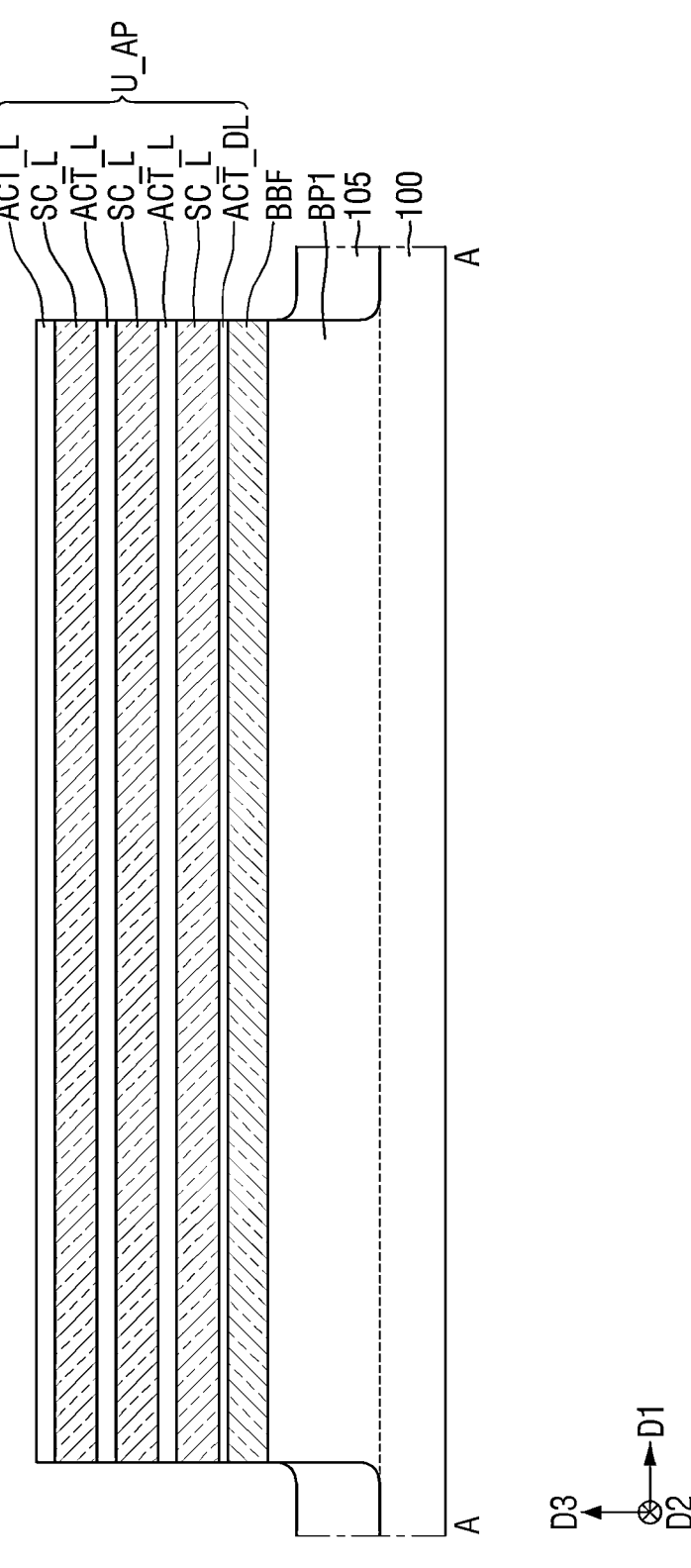
Figure 36:
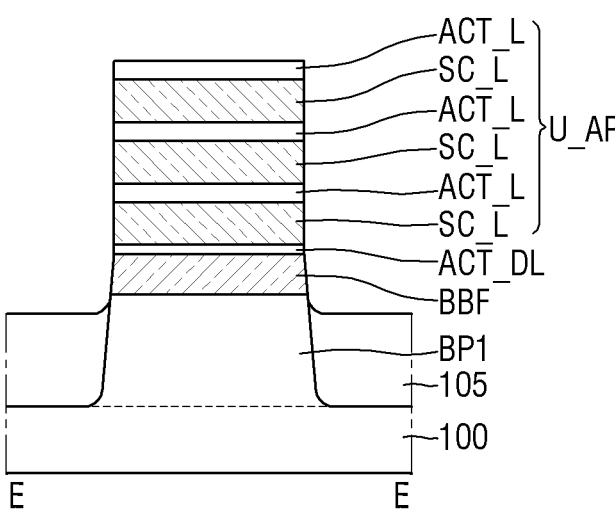
Figure 36:
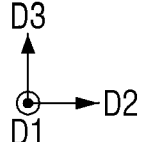
Figure 41:
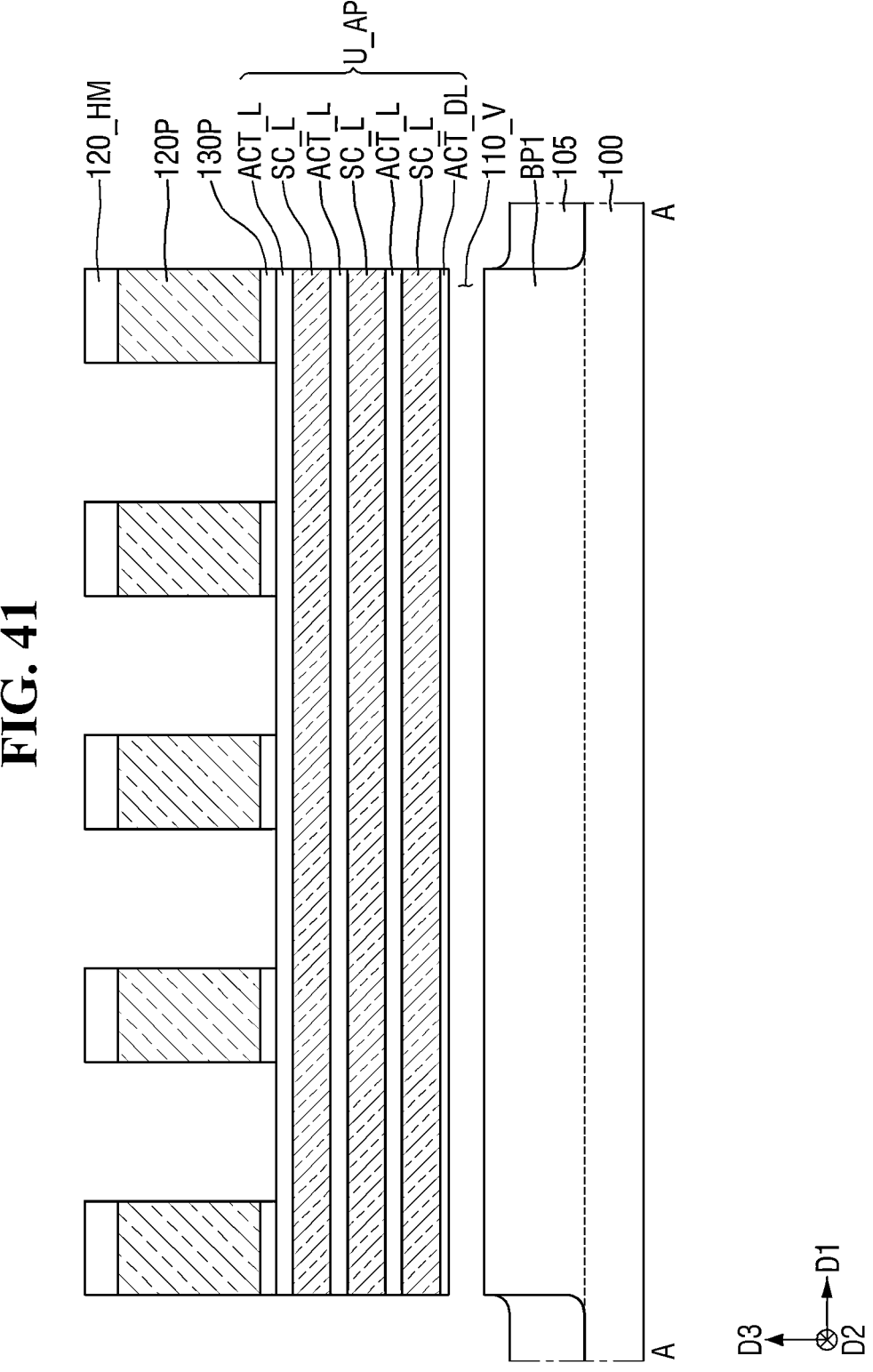
Figure 42:
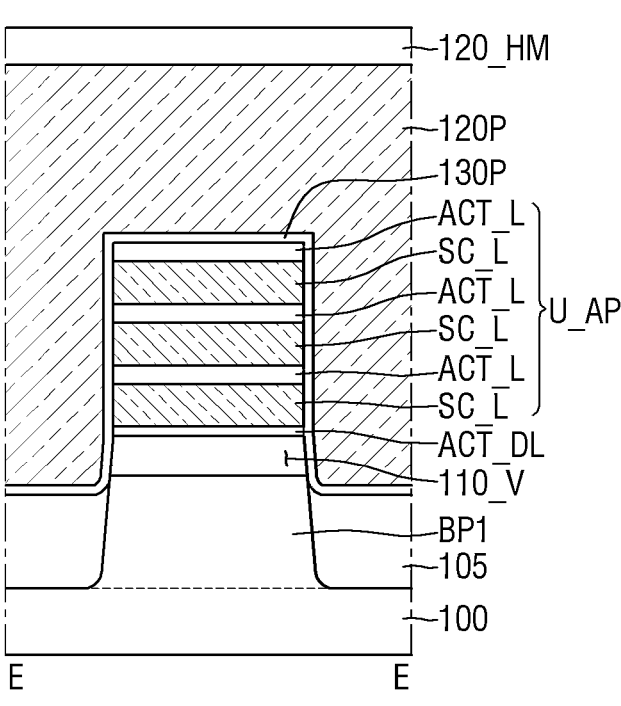
Figure 42:
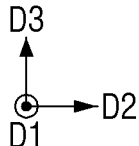
Figure 45:
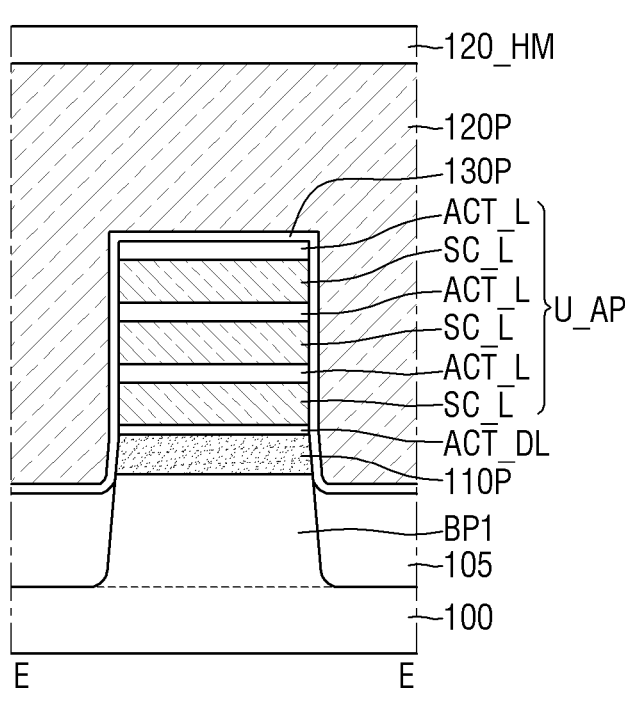
Figure 45:
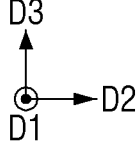

FIG. 35 and FIG. 36 are cross-sectional views taken along A-A and E-E of FIG. 34. FIG. 38 and FIG. 39 are cross-sectional views taken along A-A and E-E of FIG. 37. FIG. 41 and FIG. 42 are cross-sectional views taken along A-A and E-E of FIG. 39. FIG. 44 and FIG. 45 are cross-sectional views taken along A-A and E-E of FIG. 43.

Referring to FIG. 34 to FIG. 36, the first lower pattern BP1, a lower buffer pattern BBF, and an upper pattern structure U_AP may be formed on the substrate 100.

The first lower pattern BP1 extends in the first direction D1. The lower buffer pattern BBF is disposed on the first lower pattern BP1. The lower buffer pattern BBF is disposed between the first lower pattern BP1 and the upper pattern structure U_AP. The lower buffer pattern BBF is in contact with the first lower pattern BP1. The lower buffer pattern BBF may include a long-sidewall extending in the first direction D1 and a short-sidewall extending in the second direction D2.

The upper pattern structure U_AP is disposed on the lower buffer pattern BBF. The upper pattern structure U_AP may be in contact with the lower buffer pattern BBF. The upper pattern structure U_AP may include a long-sidewall extending in the first direction D1 and a short-sidewall extending in the second direction D2.

The upper pattern structure U_AP may include a plurality of sacrificial patterns SC_L and a plurality of active patterns ACT_L and ACT_DL alternately stacked on the lower buffer pattern BBF. The active patterns ACT_L and ACT_DL may include a normal active pattern ACL_L and a dummy active pattern ACL_DL. The dummy active pattern ACL_DL may contact the lower buffer pattern BBF.

Unlike what is illustrated, the upper pattern structure U_AP may not include the dummy active pattern ACL_DL. In this case, the sacrificial pattern SC_L may contact the lower buffer pattern BBF.

For example, each of the active patterns ACT_L and ACT_DL may include a silicon film. In one example, the sacrificial pattern SC_L may include a silicon-germanium film doped with carbon, and the lower buffer pattern BBF may include a silicon-germanium film. In another example, the sacrificial pattern SC_L may include a silicon-germanium film, and the lower buffer pattern BBF may include a silicon-germanium film doped with carbon. Depending on whether or not carbon doped, an etching rate of the silicon-germanium layer may vary. That is, the sacrificial pattern SC_L may have an etch selectivity relative to the lower buffer pattern BBF.

In a method for manufacturing a semiconductor device as described with reference to FIG. 40 to FIG. 50, the sacrificial pattern SC_L may include a silicon-germanium film doped with carbon, and the lower buffer pattern BBF may include a silicon-germanium film. However, the present inventive concepts are not limited thereto.

The field insulating film 105 does not cover a sidewall of the lower buffer pattern BBF. The lower buffer pattern BBF may protrude upwardly beyond the field insulating film 105.

Figure 37:
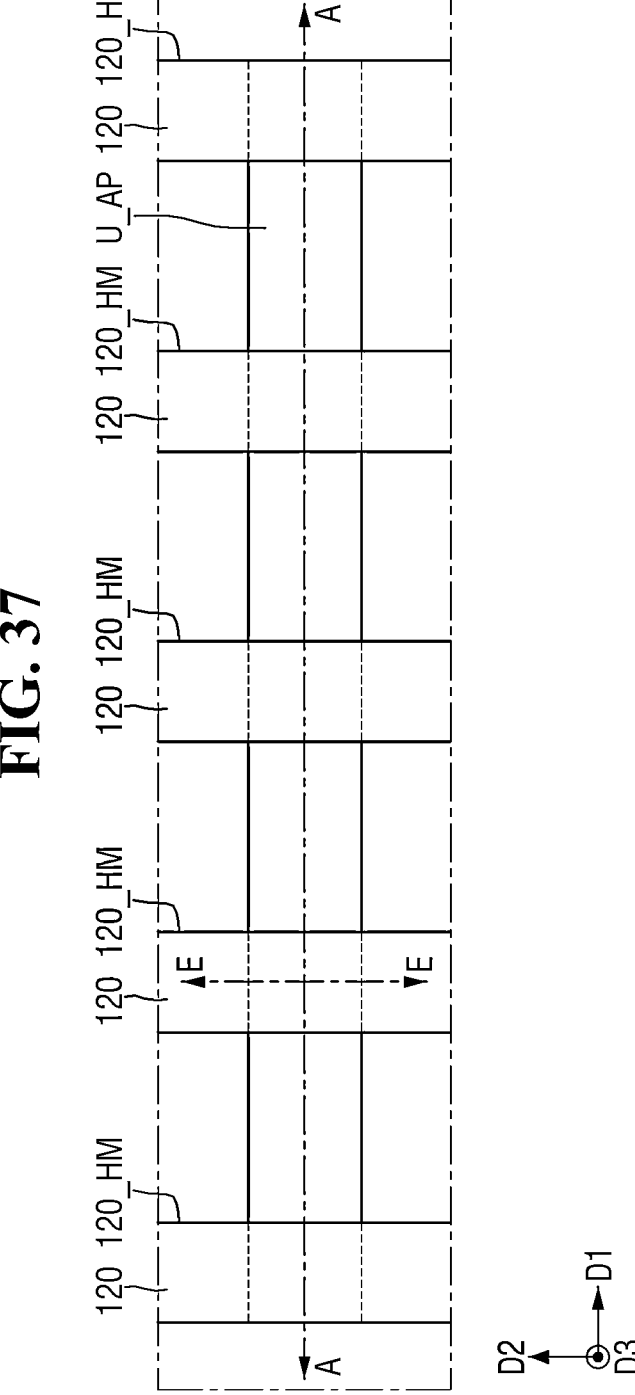
Figure 38:
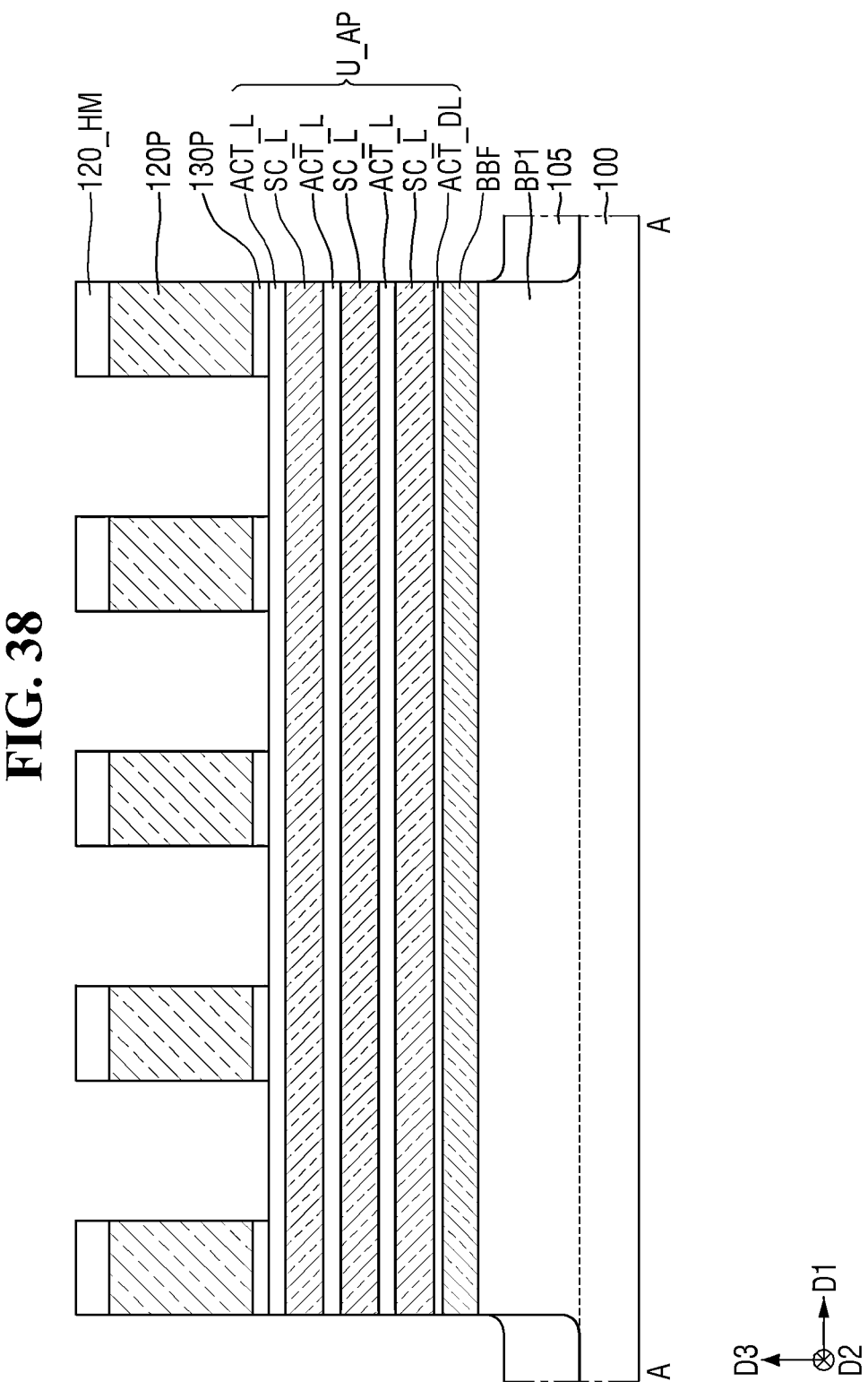
Figure 39:
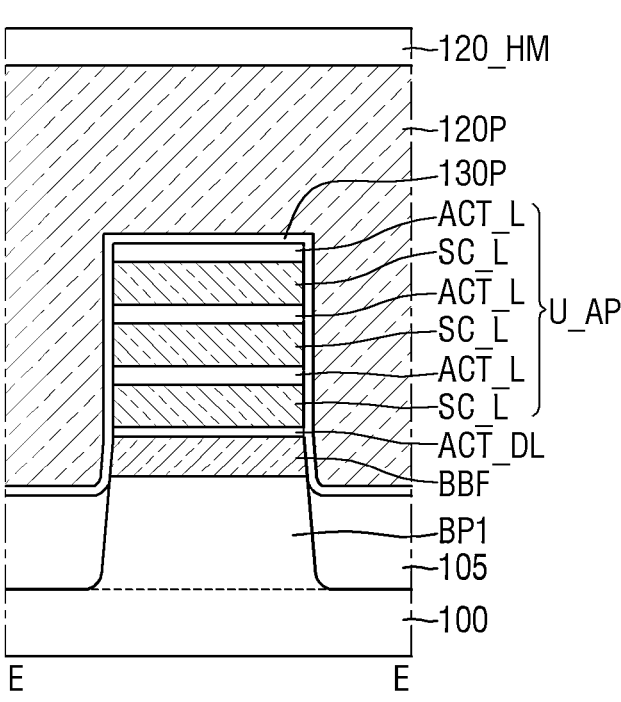
Figure 39:
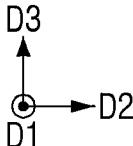

Referring to FIG. 37 to FIG. 39, a plurality of dummy gate electrodes 120P extending in the second direction D2 is formed on the upper pattern structure U_AP.

A dummy gate insulating film 130P is disposed between the dummy gate electrode 120P and the upper pattern structure U_AP. The dummy gate insulating film 130P covers a portion of the long-sidewall of the lower buffer pattern BBF.

A dummy gate capping film 120_HM is disposed on the dummy gate electrode 120P. The dummy gate capping film 120_HM extends along an upper surface of the dummy gate electrode 120P.

The dummy gate insulating film 130P may include, for example, silicon oxide. However, the present inventive concepts are not limited thereto. The dummy gate electrode 120P may include, for example, polysilicon. However, the present inventive concepts are not limited thereto. The dummy gate capping film 120_HM may include, for example, silicon nitride. However, the present inventive concepts are not limited thereto.

The dummy gate electrode 120P and the dummy gate insulating film 130P disposed on a terminating end of the first lower pattern BP1 may not cover the short-sidewall of the upper pattern structure U_AP and the short-sidewall of the lower buffer pattern BBF. That is, in FIG. 38, the short-sidewall of the upper pattern structure U_AP and the short-sidewall of the lower buffer pattern BBF may be exposed.

Unlike what is illustrated, the dummy gate electrode 120P and/or the dummy gate insulating film 130P may cover the short-sidewall of the upper pattern structure U_AP and the short-sidewall of the lower buffer pattern BBF.

Following description is described with reference to an example in which the dummy gate electrode 120P and the dummy gate insulating film 130P do not cover the short-sidewall of the upper pattern structure U_AP and the short-sidewall of the lower buffer pattern BBF.

Referring to FIG. 40 to FIG. 45, the lower buffer pattern BBF may be replaced with the lower insulating line pattern 110P.

Figure 40:
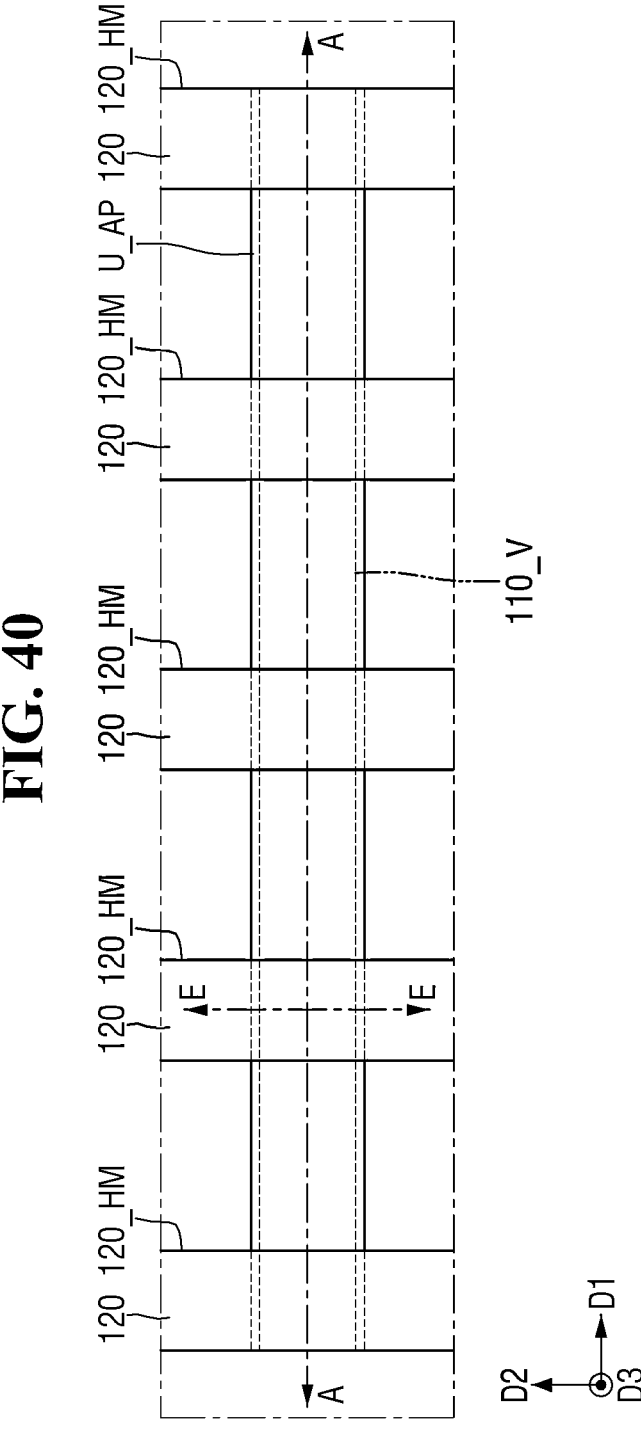

More specifically, in FIG. 40 to FIG. 42, the lower buffer pattern BBF may be removed such that a lower insulating space 110_V may be formed between the first lower pattern BP1 and the upper pattern structure U_AP. Since there is an etch selectivity between the sacrificial pattern SC_L and the lower buffer pattern BBF, the lower buffer pattern BBF may be selectively removed.

Since the short-sidewall of the lower buffer pattern BBF and the long-sidewall of the lower buffer pattern BBF between the dummy gate electrodes 120 are exposed, the lower buffer pattern BBF may be removed through an exposed portion of the lower buffer pattern BBF. Even when the lower buffer pattern BBF is removed, the upper pattern structure U_AP may be supported by the dummy gate electrode 120P and the dummy gate insulating film 130P. Thus, the lower insulating space 110_V may be maintained between the first lower pattern BP1 and the upper pattern structure U_AP.

Figure 43:
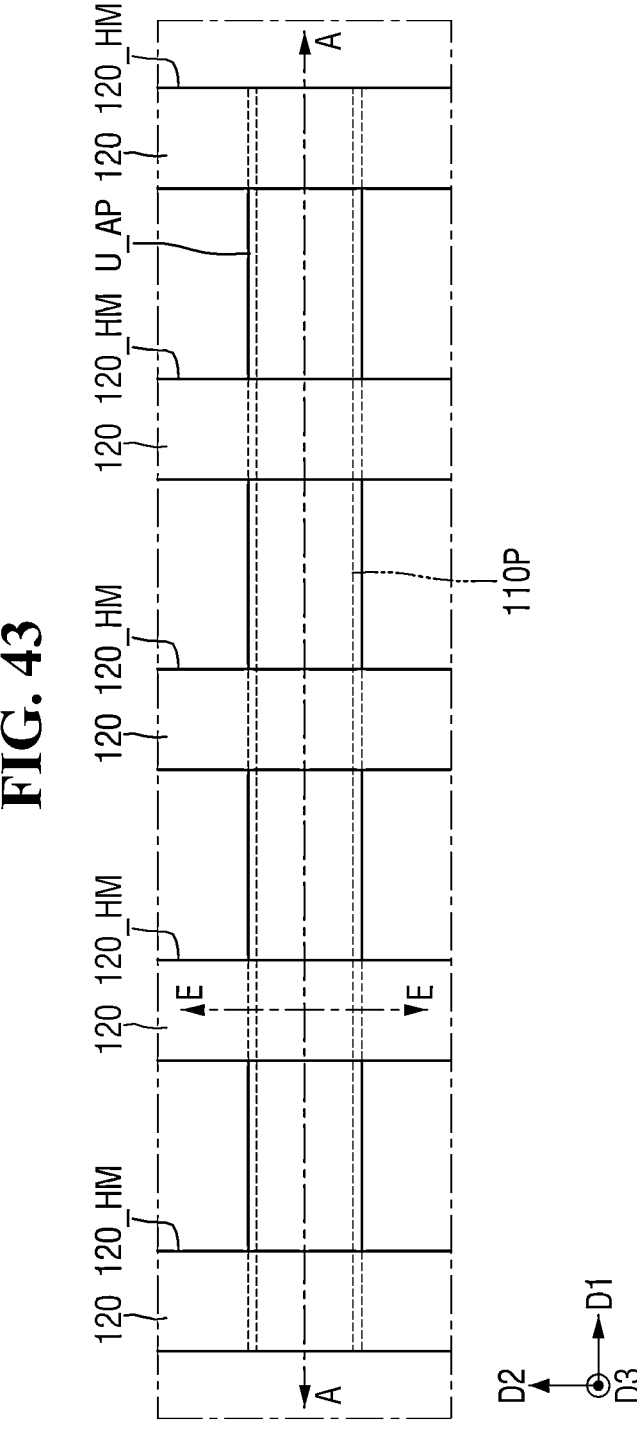
Figure 44:
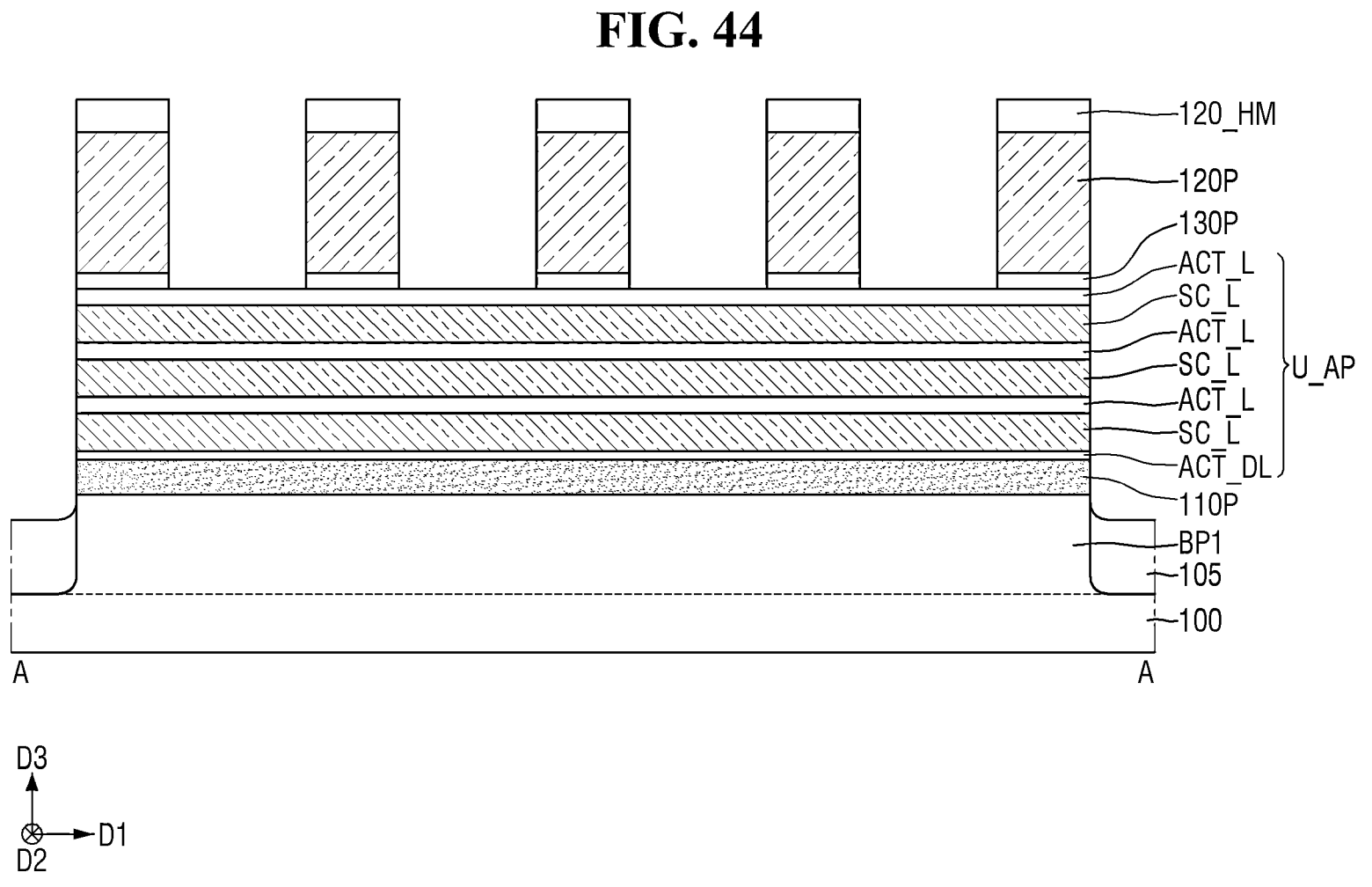

In FIG. 43 to FIG. 45, the lower insulating space 110_V is filled with insulating material, such that the lower insulating line pattern 110P is formed between the first lower pattern BP1 and the upper pattern structure U_AP. The insulating material may fill the lower insulating space 110_V through the lower insulating space 110_V between the dummy gate electrodes 120. Further, the insulating material may be deposited on the lower insulating space 110_V through the lower insulating space 110_V of a short-sidewall portion of the first lower pattern BP1.

While the insulating material fills the lower insulating space 110_V (e.g., concurrently with the insulating material filling the lower insulating space 110_V), the insulating material may also be formed on a sidewall of the exposed upper pattern structure U_AP and a sidewall of the dummy gate electrode 120P. After the lower insulating line pattern 110P is formed between the first lower pattern BP1 and the upper pattern structure U_AP, an insulating material removal process may proceed. The insulating material removal process may remove the insulating material formed on the sidewall of the upper pattern structure U_AP and the sidewall of the dummy gate electrode 120P.

In one example, while the lower buffer pattern BBF is removed (e.g., concurrently with the lower buffer pattern BBF being removed), the exposed sacrificial pattern SC_L may not be removed. While the lower insulating line pattern 110P is formed (e.g., concurrently with the lower insulating line pattern 110P being formed), the upper dummy insulating pattern is not formed between the adjacent dummy gate electrodes 120P.

In another example, while the lower buffer pattern BBF is removed, an exposed portion of the sacrificial pattern SC_L may be removed. In this case, a sacrificial recess may be formed in an area in which the portion of the sacrificial pattern SC_L is removed. While the lower insulating line pattern 110P is being formed, an upper dummy insulating pattern filling the sacrificial recess may be formed on the dummy gate electrodes 120P adjacent to each other in the first direction D1. The upper dummy insulating pattern may be formed in a shape similar to that of a connecting dummy insulating pattern 115D_IN, which will be described later using FIG. 51 to FIG. 55.

Thereafter, the manufacturing process is described with reference to a cross-sectional view cut along A-A of FIG. 43.

Figure 46:
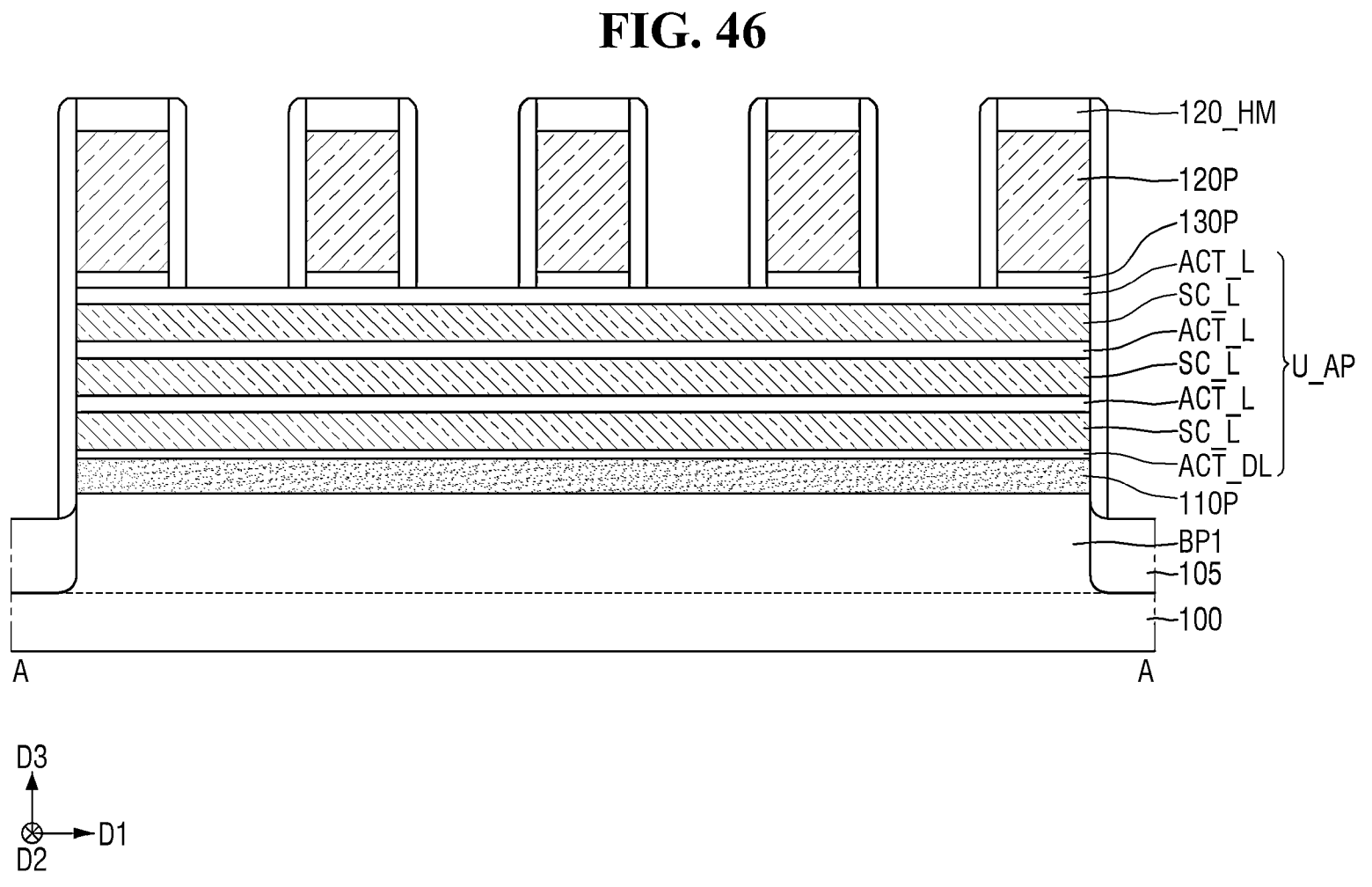

Referring to FIG. 46, a dummy gate spacer 140P is formed on a sidewall of the dummy gate electrode 120P. The dummy gate spacer 140P may cover the short-sidewall of the upper pattern structure U_AP.

On the upper pattern structure U_AP, a dummy gate structure GS_D is formed. The dummy gate structure GS_D includes a dummy gate electrode 120P, a dummy gate insulating film 130P, a dummy gate capping film 120_HM, and a dummy gate spacer 140P.

Figure 47:
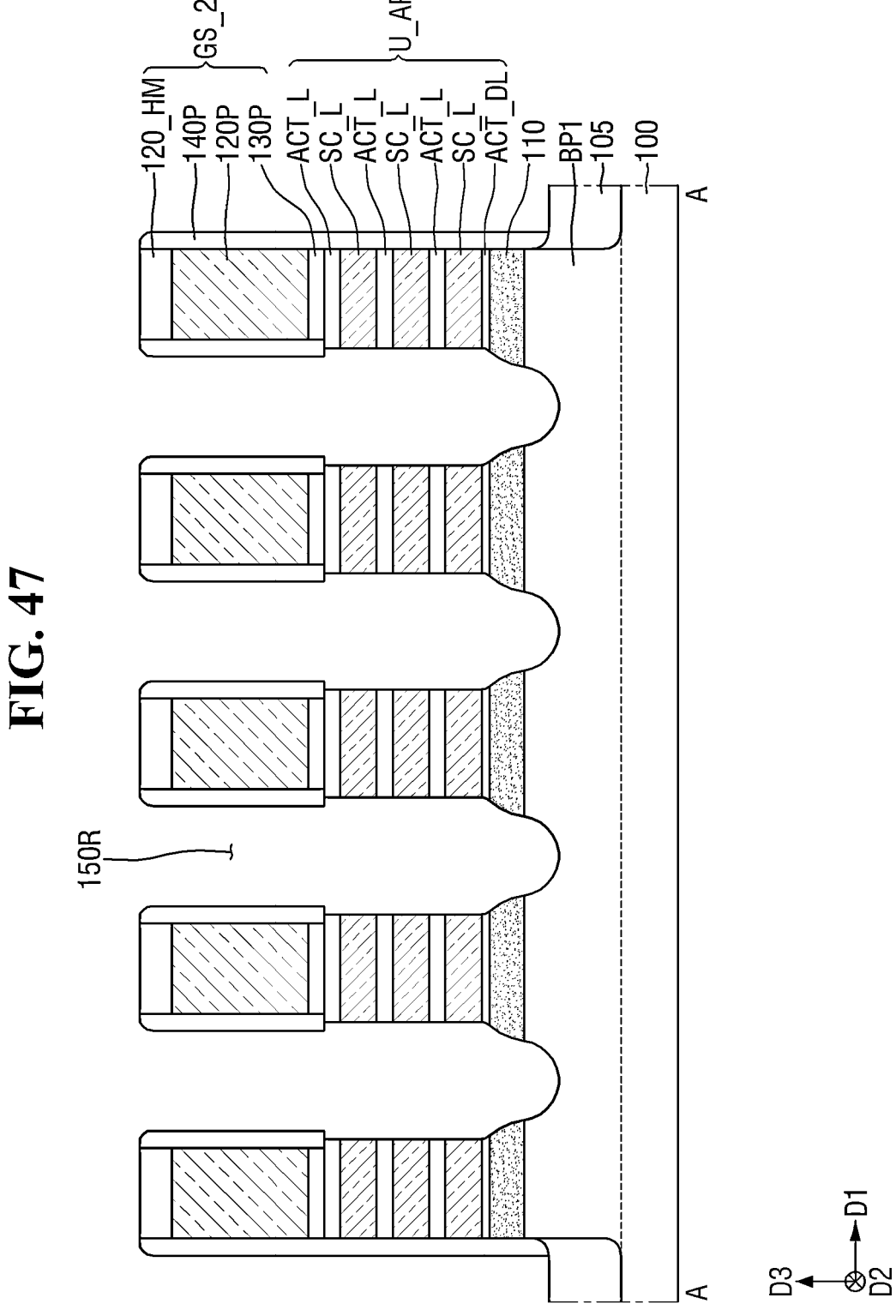

Referring to FIG. 47, using the dummy gate structure GS_D as a mask, the first source/drain recess 150R is formed in the upper pattern structure U_AP and the lower insulating line pattern 110P.

The bottom surface of the first source/drain recess 150R is defined by the first lower pattern BP1. While the first source/drain recess 150R is being formed (e.g., concurrently with the first source/drain recess 150R being formed), the lower insulating line pattern 110P may be divided into portions spaced from each other. Thus, the first lower insulating pattern 110 may be formed between the first lower pattern BP1 and the upper pattern structure U_AP.

Figure 48:
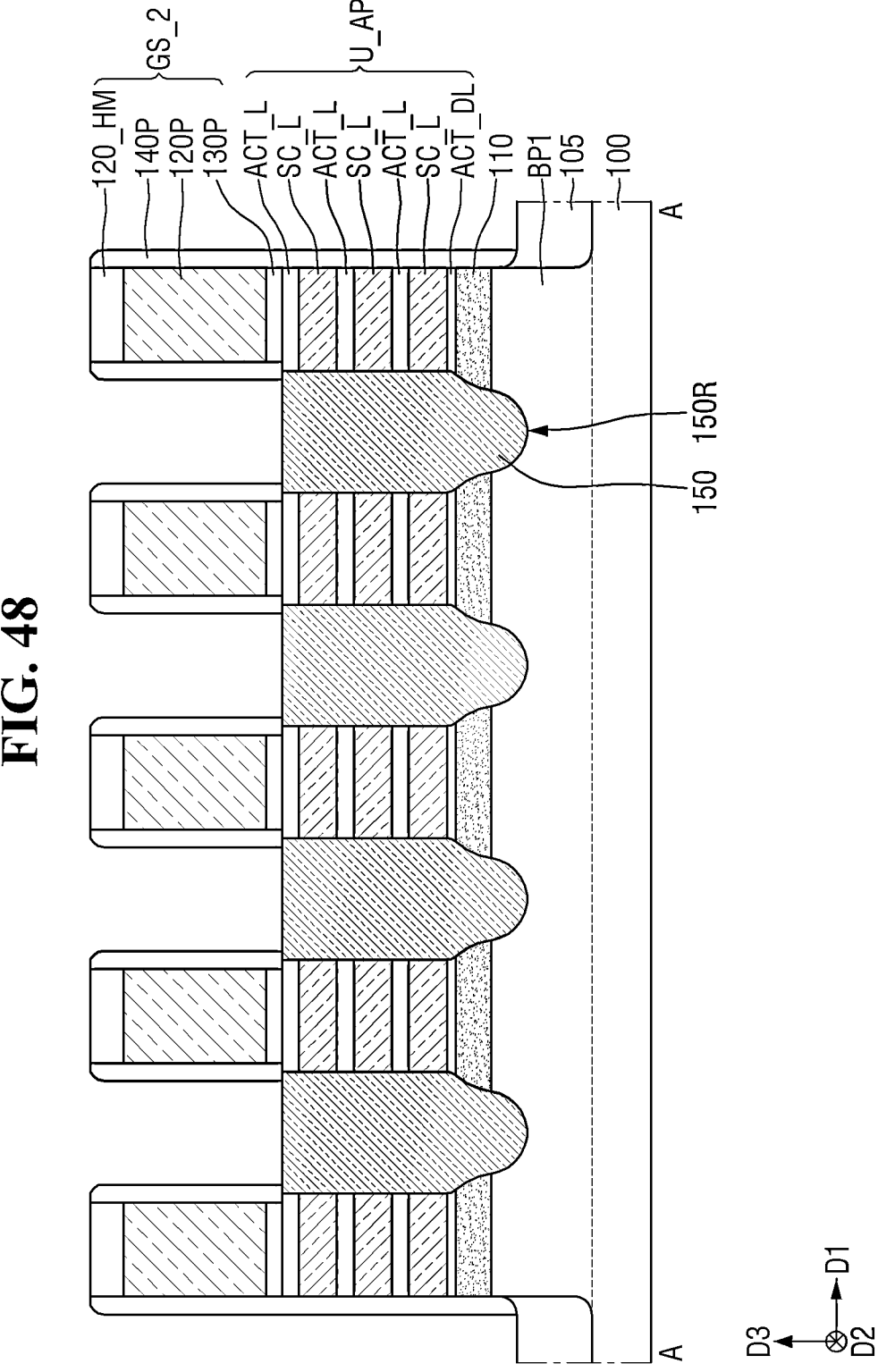

Referring to FIG. 48, on the first lower pattern BP1, the first source/drain pattern 150 is formed.

The first source/drain pattern 150 fills the first source/drain recess 150R. The first source/drain pattern 150 is connected to the active patterns ACT_L and ACT_DL. The first source/drain pattern 150 may contact the first lower insulating pattern 110.

Before forming the first source/drain pattern 150, a heat treatment process may be performed. During the heat treatment process, germanium (Ge) may diffuse out of the sacrificial pattern SC_L. Germanium may escape through a portion of the sacrificial pattern SC_L exposed through the first source/drain recess 150R.

Germanium diffused out of the sacrificial pattern SC_L may migrate to the bottom surface of the first source/drain recess 150R. Germanium which has moved to the bottom surface of the first source/drain recess 150R reacts with the first lower pattern BP1, so that the first bottom semiconductor liner film (151 in FIG. 6) may be formed.

Figure 49:
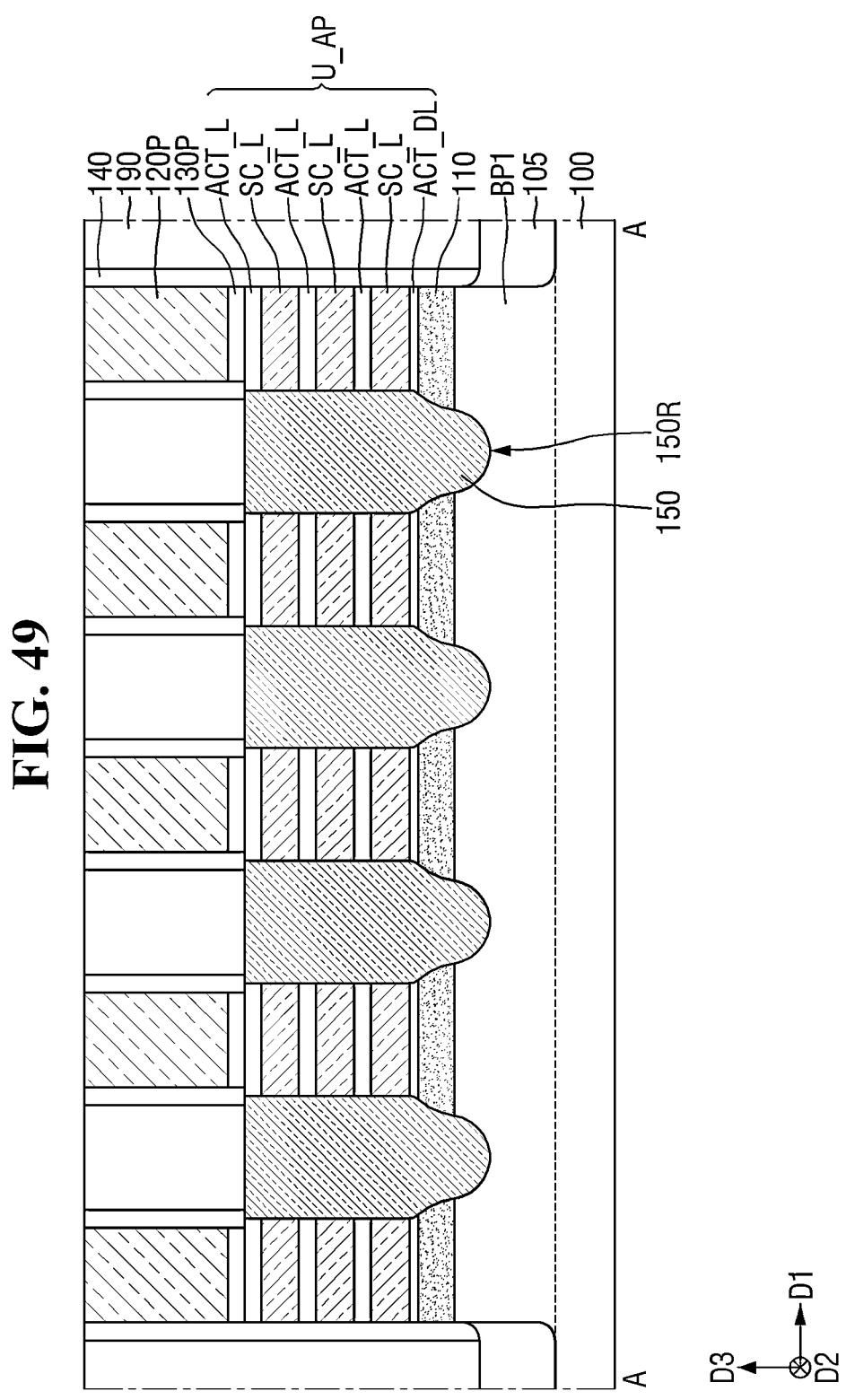

Referring to FIG. 49, the first interlayer insulating film 190 is formed on the first source/drain pattern 150.

Then, a portion of the first interlayer insulating film 190 and the dummy gate capping film 120_HM are removed to expose an upper surface of the dummy gate electrode 120P. While the upper surface of the dummy gate electrode 120P is exposed (e.g., concurrently with the upper surface of the dummy gate electrode 120P being exposed), the gate spacer 140 may be formed.

Figure 50:
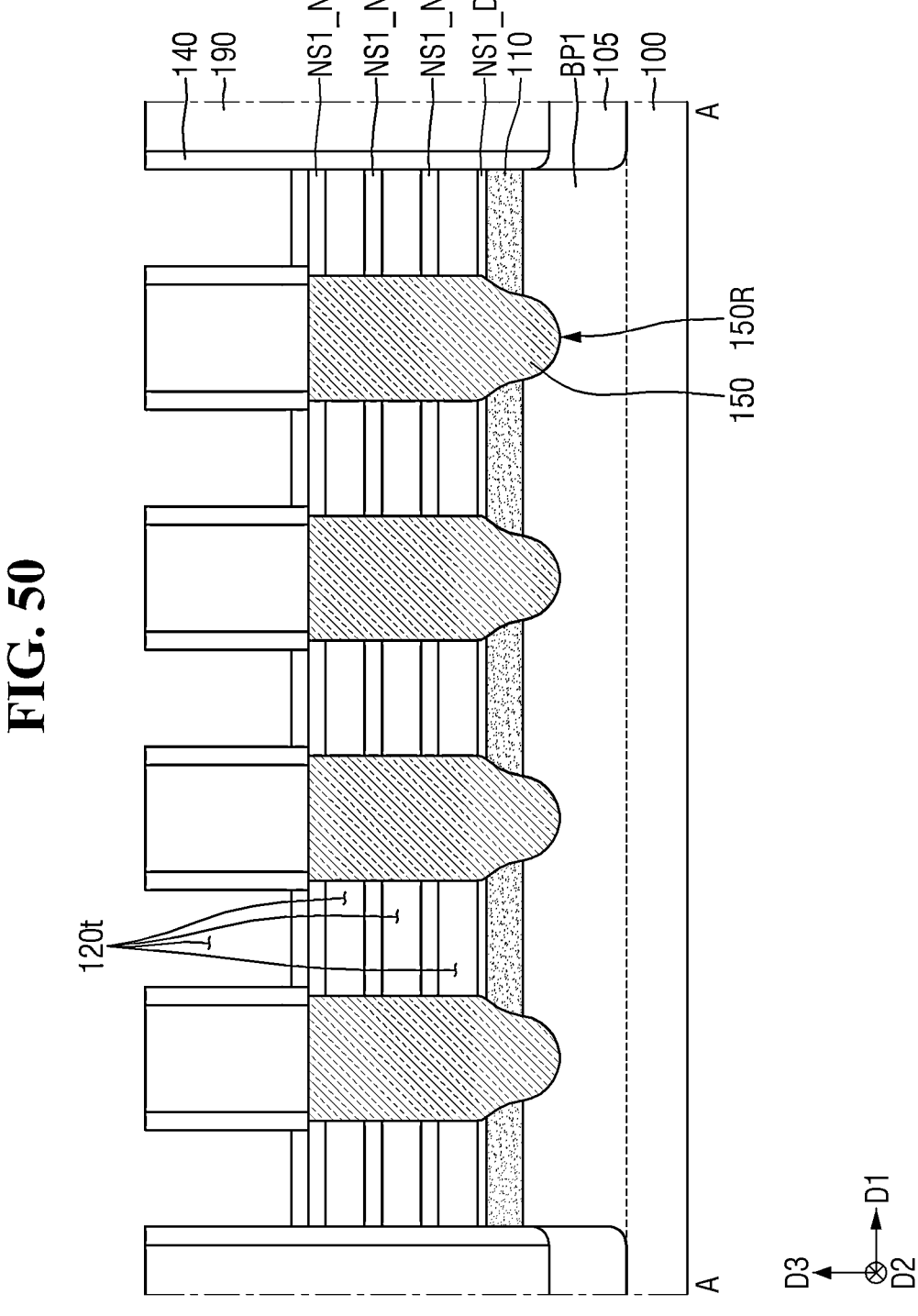
Figure 51:
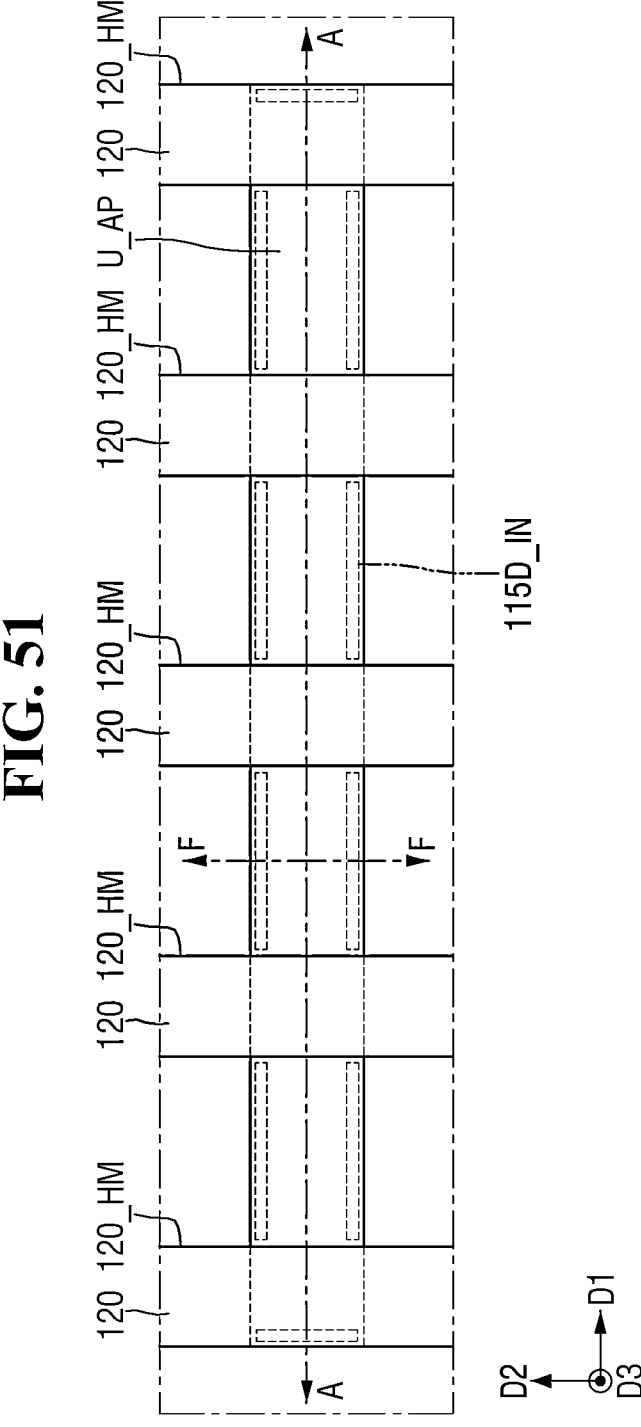
FIGS. 51, 52, 53, 54, 55, 56, 57, 58, 59, and 60 are diagrams of structures of intermediate steps for illustrating a method for manufacturing a semiconductor device according to some example embodiments.

Referring to FIG. 50, the upper pattern structure U_AP between the gate spacers 140 may be exposed by removing the dummy gate insulating film 130P and the dummy gate electrode 120P.

Subsequently, the sacrificial pattern SC_L may be removed such that the first sheet pattern NS1 may be formed. Thus, a gate trench 120t is formed between the gate spacers 140. Further, the first normal sheet pattern NS1_N and the first dummy sheet pattern NS1_D connected to the first source/drain pattern 150 are formed.

Subsequently, referring to FIG. 2, the gate insulating film 130 and the gate electrode 120 may be formed in the gate trench 120t. Further, the gate capping pattern 145 may be formed.

FIG. 51 to FIG. 60 are diagrams of structures of intermediate steps for illustrating a method for manufacturing a semiconductor device according to some example embodiments.

Figure 52:
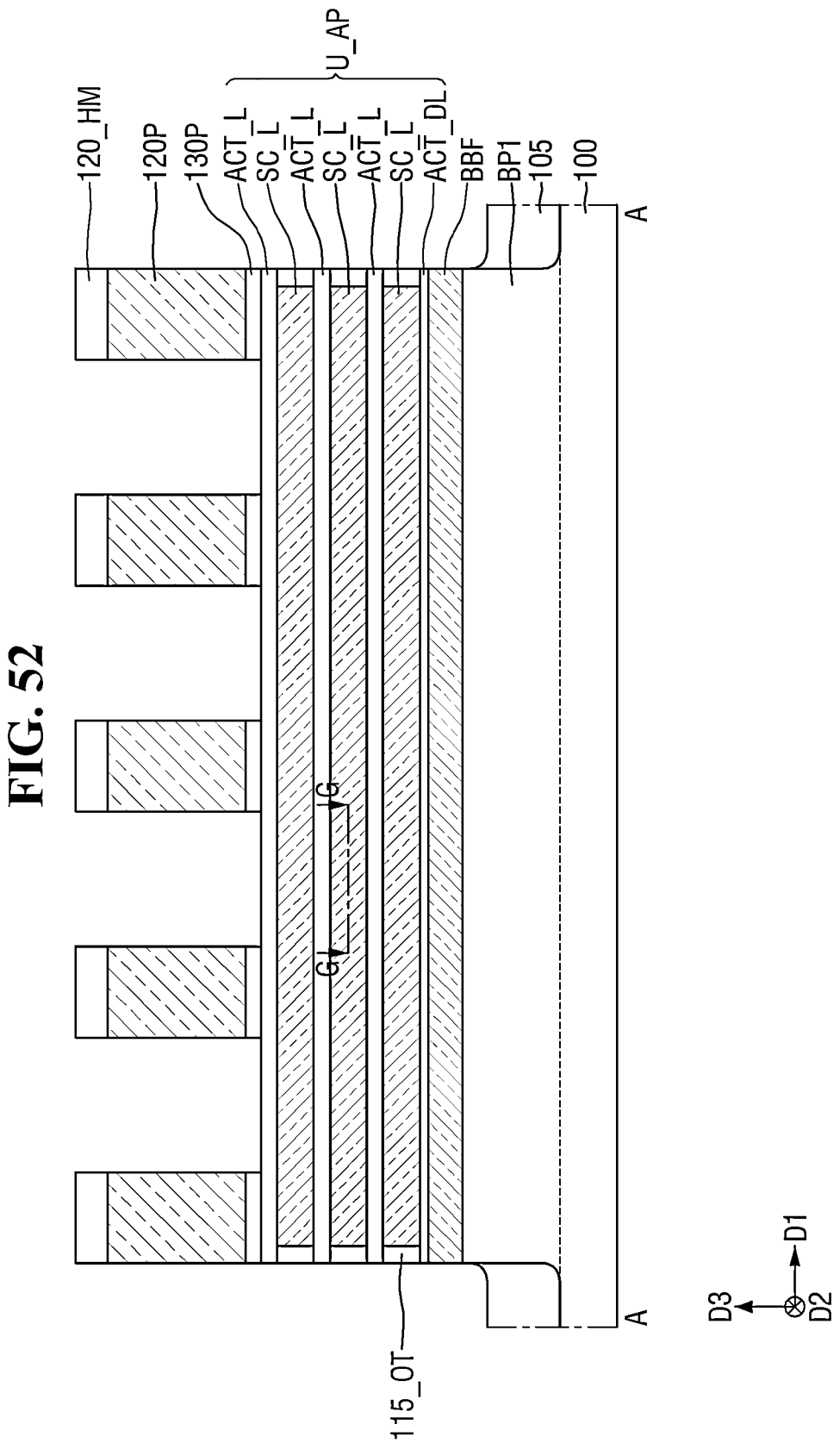
Figure 53:
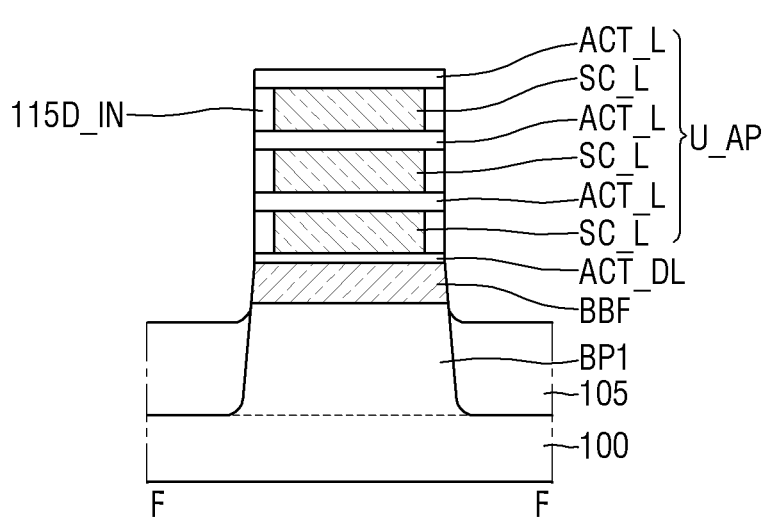
Figure 53:
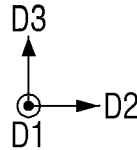
Figure 54:
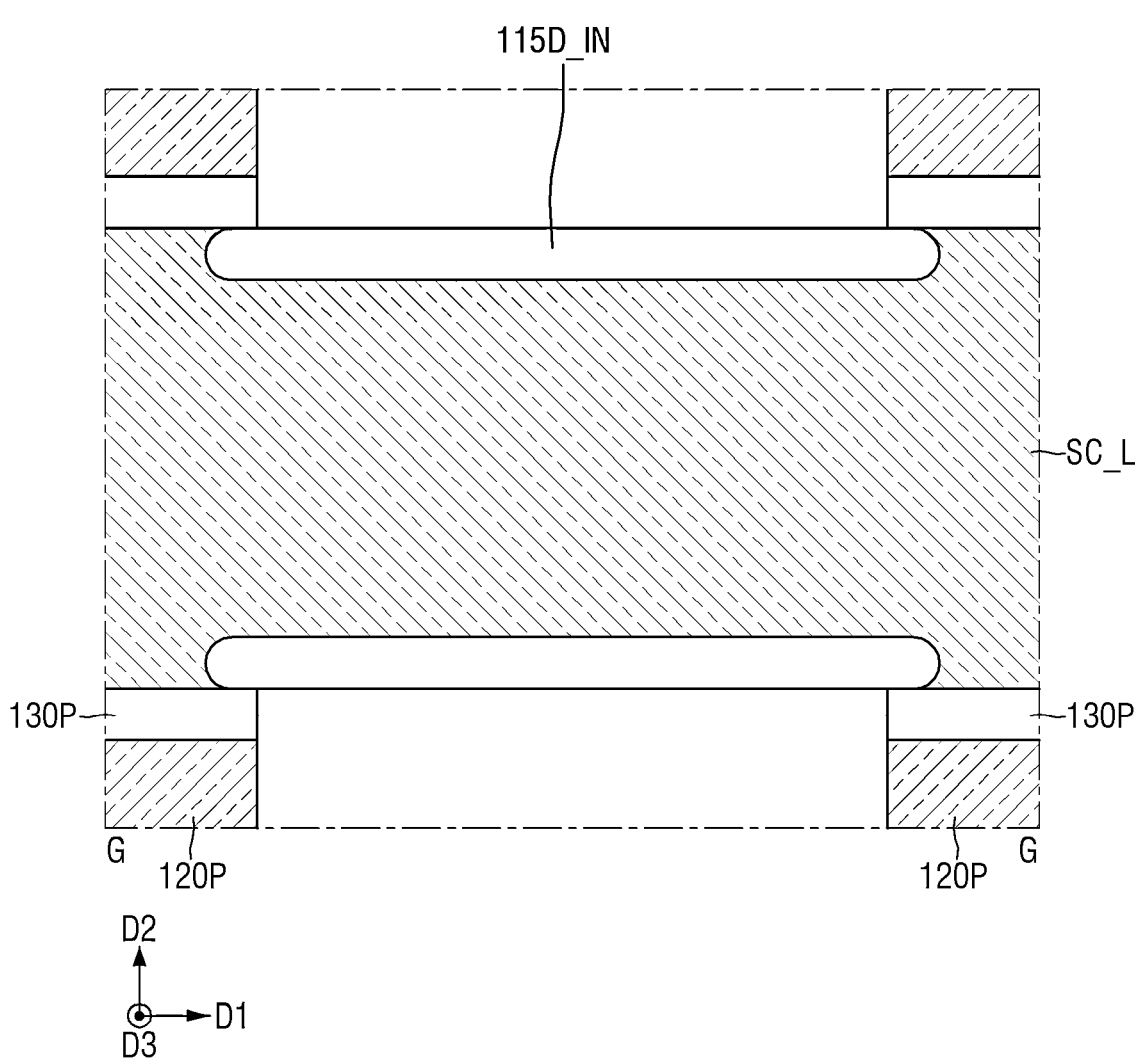
Figure 55:
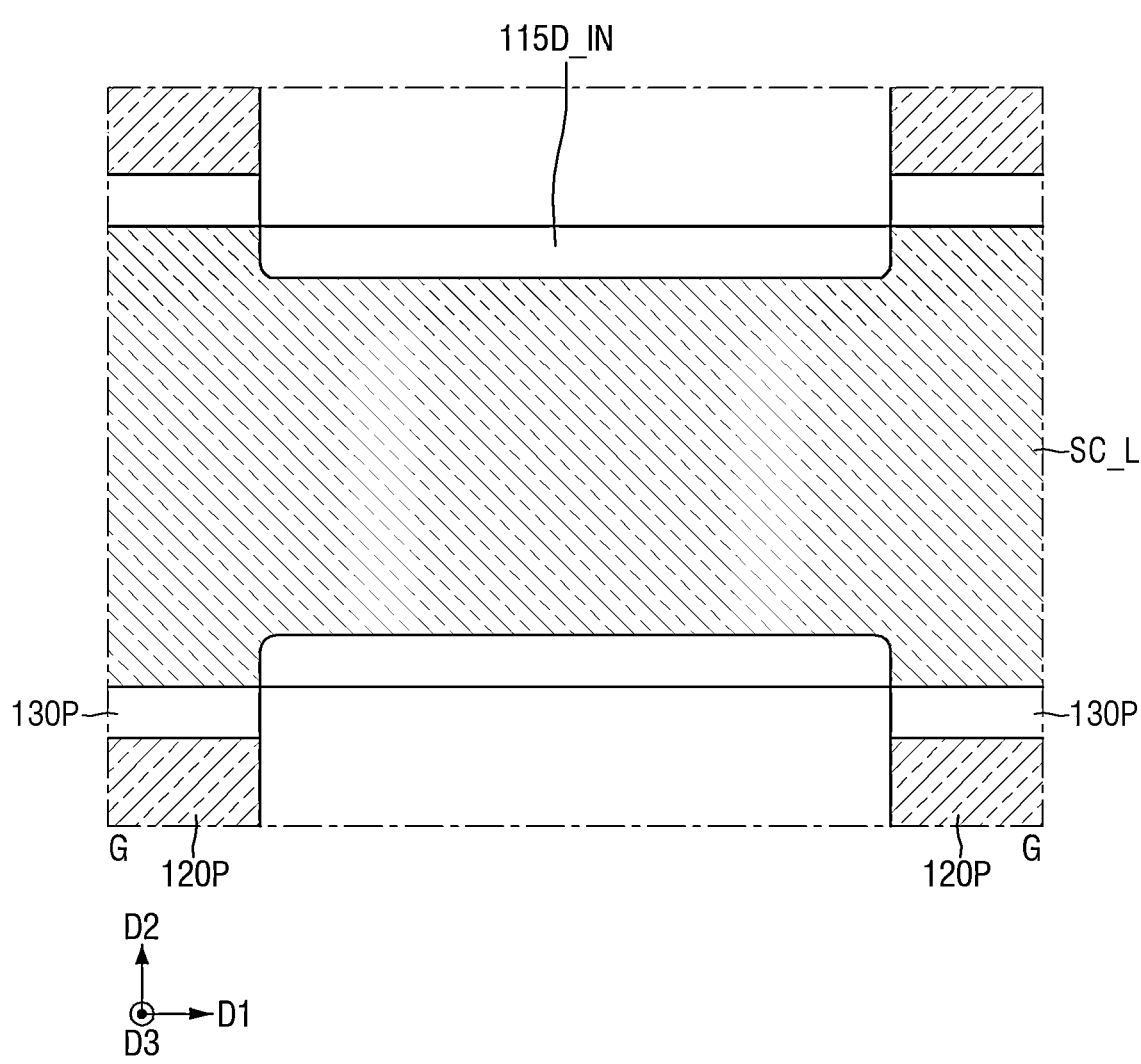

For reference, FIG. 51 to FIG. 55 may be directed to a process performed after FIG. 39. FIG. 52 and FIG. 53 are cross-sectional views taken along A-A and F-F of FIG. 51. FIG. 54 and FIG. 55 are top views of a portion taken along G-G of FIG. 52. FIG. 57 and FIG. 58 are cross-sectional views taken along A-A and F-F of FIG. 56. The cross-sectional view taken along E-E of FIG. 56 may be the same as FIG. 45. FIG. 60 is a top view of a portion taken along G-G of FIG. 59.

In the method for manufacturing a semiconductor device as described with reference to FIG. 51 to FIG. 60, the sacrificial pattern SC_L may include a silicon-germanium film, and the lower buffer pattern BBF may include a silicon-germanium film doped with carbon. However, the present inventive concepts are not limited thereto.

Referring to FIG. 51 to FIG. 55, a portion of the sacrificial pattern SC_L may be replaced with the connecting dummy insulating pattern 115D_IN. Further, a portion of the sacrificial pattern SC_L disposed on a terminating end of the first lower pattern BP1 may be replaced with the upper insulating pattern 115_OT.

The connecting dummy insulating pattern 115D_IN is disposed between the dummy gate electrodes 120P adjacent to each other in the first direction D1.

A portion of the sacrificial pattern SC_L may be selectively removed using an etch selectivity. A sacrificial recess may be formed at a position where the portion of the sacrificial pattern SC_L is removed. Subsequently, the connecting dummy insulating pattern 115D_IN and the upper insulating pattern 115_OT filling the sacrificial recess may be formed.

In FIG. 54, a portion of the connecting dummy insulating pattern 115D_IN overlaps the first dummy gate electrode 120P in the second direction D2.

In FIG. 55, the connecting dummy insulating pattern 115D_IN does not overlap with the first dummy gate electrode 120P in the second direction D2.

Following description is made with reference to FIG. 54.

Figure 56:
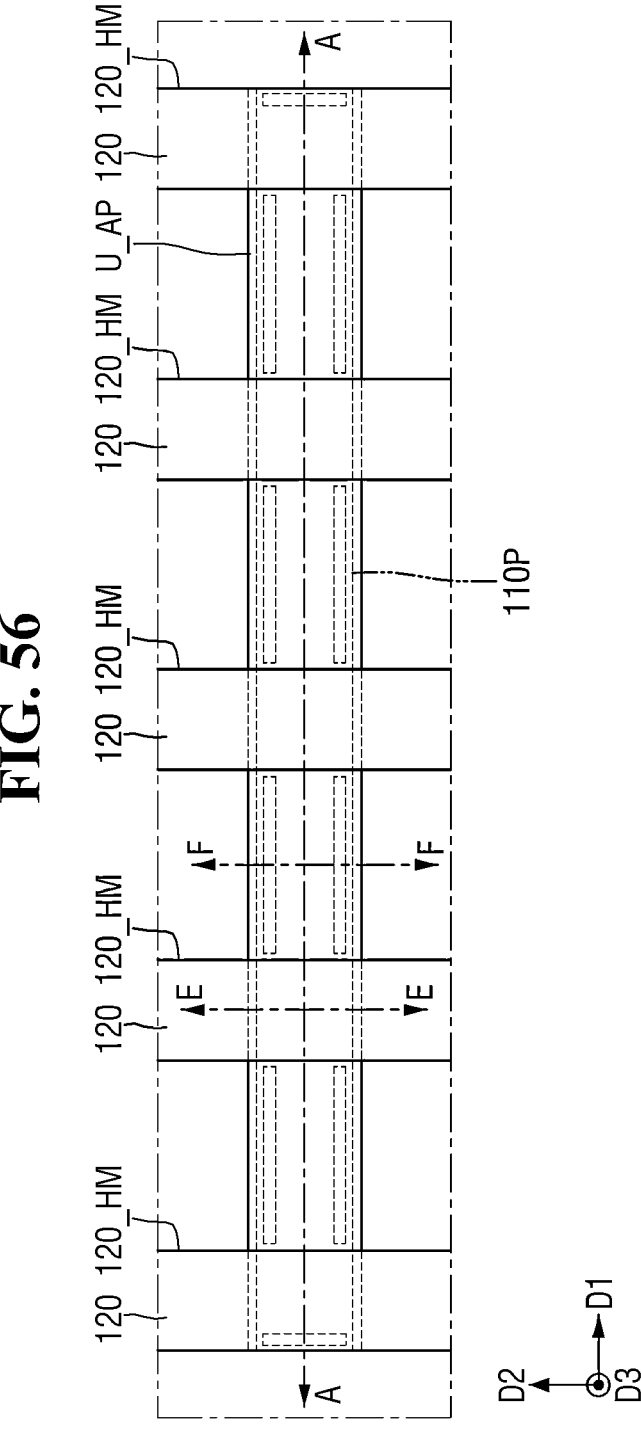
Figure 57:
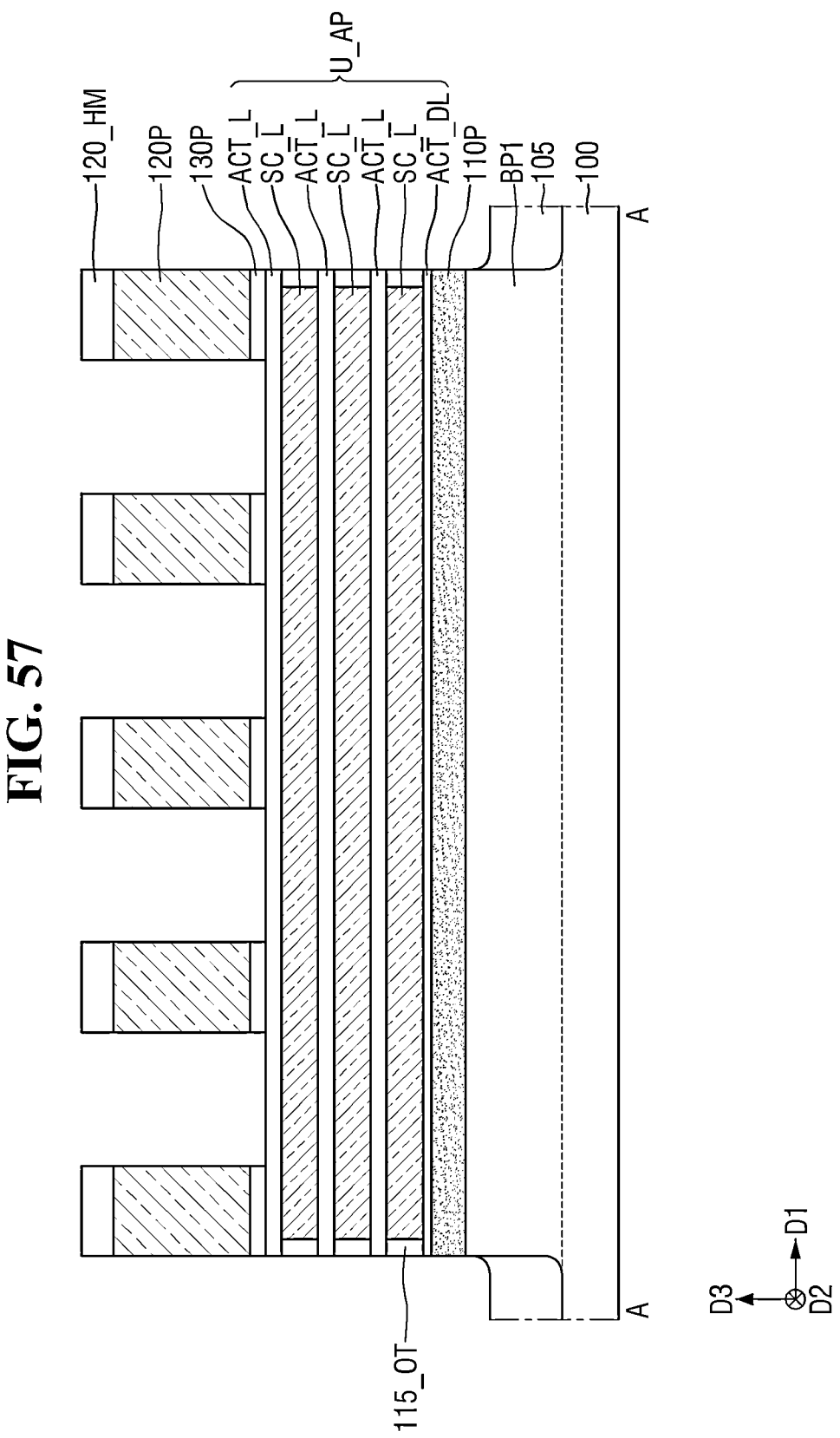
Figure 58:
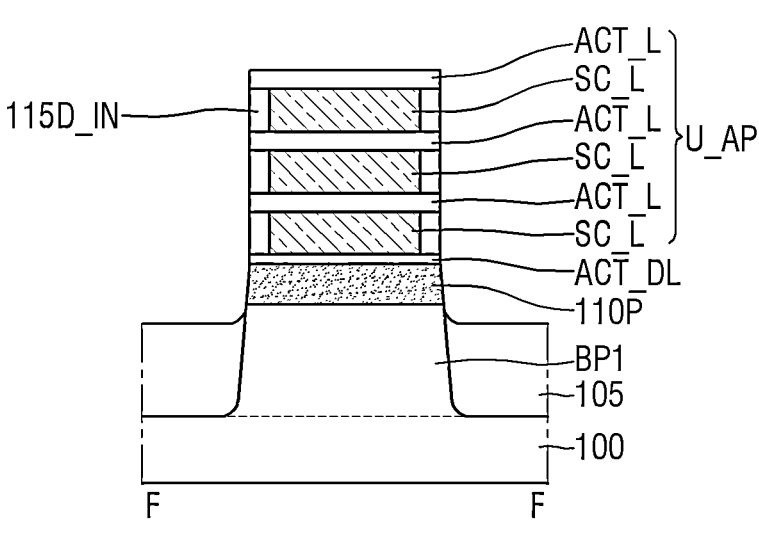
Figure 58:
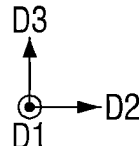

Referring to FIG. 56 to FIG. 58, the lower buffer pattern BBF may be replaced with the lower insulating line pattern 110P.

A scheme of forming the lower insulating line pattern 110P may be substantially the same as that as described above with reference to FIG. 40 to FIG. 45.

Figure 59:
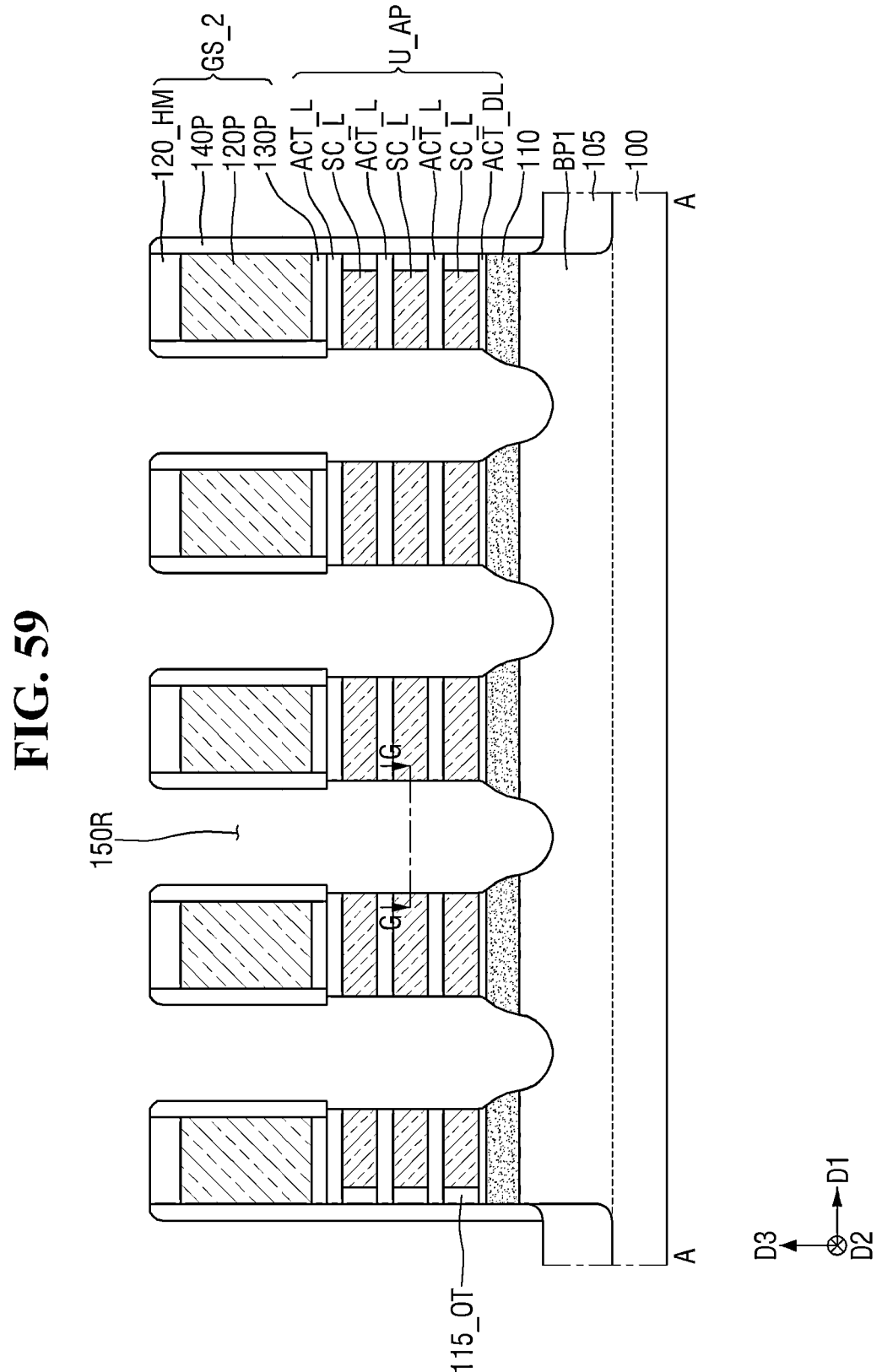
Figure 60:
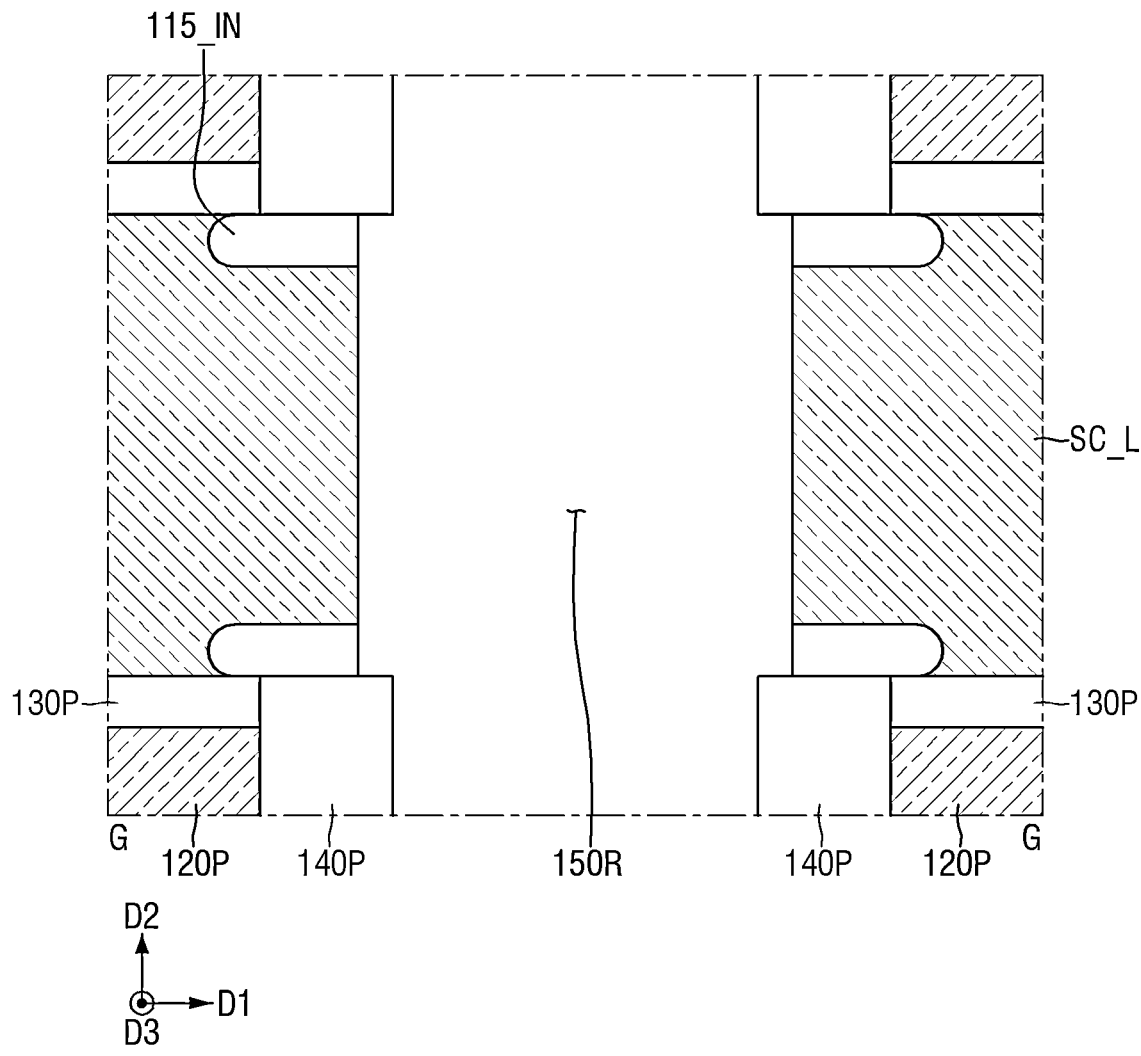

Referring to FIG. 59 and FIG. 60, the dummy gate spacer 140P is formed on a sidewall of the dummy gate electrode 120P.

Then, using the dummy gate structure GS_D as a mask, the first source/drain recess 150R is formed in the upper pattern structure U_AP and the lower insulating line pattern 110P.

While the first source/drain recess 150R is being formed (e.g., concurrently with the first source/drain recess 150R being formed), the connecting dummy insulating pattern 115D_IN non-overlapping the dummy gate structure GS_D in the third direction D3 may be removed. Thus, the connecting insulating pattern 115_IN may be formed between the active patterns ACT_L and ACT_DL adjacent to each other in the third direction D3.

Subsequently, the first source/drain recess (150R in FIG. 47) and the first source/drain pattern (150 in FIG. 48) may be formed.

In concluding the detailed description, those skilled in the art will appreciate that many variations and modifications may be made to some example embodiments without substantially departing from the principles of the present inventive concepts. Therefore, the example embodiments of the inventive concepts are used in a generic and descriptive sense only and not for purposes of limitation.

What is claimed is:

1. A semiconductor device, comprising:
a lower pattern extending in a first direction, the lower pattern protruding from a substrate in a second direction, the first direction extending in parallel to the substrate, the second direction extending perpendicular to the substrate;

a lower insulating pattern on the lower pattern, the lower insulating pattern in contact with an upper surface of the lower pattern;

a channel pattern on the lower insulating pattern;

a plurality of gate structures on the lower pattern, the plurality of gate structures spaced apart from each other in the first direction, wherein each of the plurality of gate structures includes a gate electrode and a gate insulating film; and a source/drain pattern on the lower pattern, the source/drain pattern connected to the channel pattern, wherein a vertical level of a lowermost portion of the source/drain pattern is lower than a vertical level of a bottom surface of the lower insulating pattern, wherein the gate electrode overlaps the lower insulating pattern in the second direction, wherein the source/drain pattern includes:

a lower filling semiconductor film on the lower pattern, and an upper filling semiconductor film on the lower filling semiconductor film, wherein the lower filling semiconductor film includes first impurities having a first conductivity type and the upper filling semiconductor film includes second impurities having a second conductivity type, wherein the second conductivity type is counter to the first conductivity type, wherein the source/drain pattern includes a bottom semiconductor liner film extending along the lower pattern between the lower filling semiconductor film and the lower pattern, wherein the bottom semiconductor liner film includes a silicon germanium film, wherein a vertical level of an outermost edge of the bottom semiconductor liner film is higher than a vertical level of the upper surface of the lower pattern, and wherein a vertical level of a center of the bottom semiconductor liner film is lower than the vertical level of the upper surface of the lower pattern.

2. The semiconductor device of claim 1, wherein a width of the lower insulating pattern in the first direction is greater than a width of the gate electrode in the first direction.

3. The semiconductor device of claim 1, wherein the source/drain pattern is in contact with the lower insulating pattern and the lower pattern.

4. The semiconductor device of claim 1, wherein a width of the lower insulating pattern in the first direction is greater than or equal to a width of the channel pattern in the first direction.

5. The semiconductor device of claim 1, wherein the lower insulating pattern includes an air gap or a seam pattern.

6. The semiconductor device of claim 1, wherein the channel pattern includes a plurality of sheet patterns spaced apart from each other in the second direction.

7. The semiconductor device of claim 6, wherein:

the plurality of sheet patterns includes a dummy sheet pattern and a normal sheet pattern, the dummy sheet pattern is in contact with the lower insulating pattern, the normal sheet pattern is spaced apart from the dummy sheet pattern in the second direction, and a thickness of the normal sheet pattern is greater than a thickness of the dummy sheet pattern.

8. The semiconductor device of claim 6, further comprising a connecting insulating pattern between adjacent sheet patterns of the plurality of sheet patterns in the second direction.

9. The semiconductor device of claim 1, wherein a width of an upper surface of the lower insulating pattern in the first direction is smaller than a width of the bottom surface of the lower insulating pattern in the first direction.

10. A semiconductor device, comprising:

a lower pattern extending in a first direction;

a field insulating film covering a sidewall of the lower pattern;

a lower insulating pattern on the lower pattern, the lower insulating pattern in contact with an upper surface of the lower pattern, wherein a vertical level of a bottom surface of the lower insulating pattern is higher than a vertical level of an upper surface of the field insulating film;

a plurality of sheet patterns on the lower insulating pattern and arranged in a second direction, the second direction extending perpendicular to the first direction;

a plurality of gate structures on the lower pattern and spaced apart from each other in the first direction, wherein each of the plurality of gate structures includes a gate electrode and a gate insulating film; and a source/drain pattern between adjacent gate structures of the plurality of gate structures, wherein a width of the upper surface of the lower pattern in a third direction is greater than or equal to a width of an upper surface of the lower insulating pattern in the third direction, the third direction extending parallel to the lower pattern and extending perpendicular to both the first direction and the second direction, wherein the gate electrode overlaps the lower insulating pattern in the second direction, wherein the source/drain pattern includes:

a lower filling semiconductor film on the lower pattern, and an upper filling semiconductor film on the lower filling semiconductor film, wherein the lower filling semiconductor film includes first impurities having a first conductivity type and the upper filling semiconductor film includes second impurities having a second conductivity type, wherein the second conductivity type is counter to the first conductivity type, wherein the source/drain pattern includes a bottom semiconductor liner film extending along the lower pattern between the lower filling semiconductor film and the lower pattern, wherein the bottom semiconductor liner film includes a silicon germanium film, wherein a vertical level of an outermost edge of the bottom semiconductor liner film is higher than a vertical level of the upper surface of the lower pattern, and wherein a vertical level of a center of the bottom semiconductor liner film is lower than the vertical level of the upper surface of the lower pattern.

11. The semiconductor device of claim 10, wherein the source/drain pattern is in contact with the lower insulating pattern and the lower pattern.

12. The semiconductor device of claim 10, wherein:

each gate structure of the plurality of gate structures includes an inner gate structure, the inner gate structure is between adjacent sheet patterns of the plurality of sheet patterns, and includes the gate electrode and the gate insulating film, and the source/drain pattern is in contact with the gate insulating film of the inner gate structure.

13. The semiconductor device of claim 10, wherein each gate structure of the plurality of gate structures includes a plurality of inner spacers disposed between adjacent sheet patterns of the plurality of sheet patterns.

14. The semiconductor device of claim 10, wherein the lower insulating pattern includes sidewalls opposite to the third direction, wherein the gate insulating film covers the sidewalls of the lower insulating pattern.

15. The semiconductor device of claim 10, wherein:

the plurality of sheet patterns includes a dummy sheet pattern and a normal sheet pattern, the dummy sheet pattern is in contact with the lower insulating pattern, the normal sheet pattern is spaced apart from the dummy sheet pattern in the second direction, and a thickness of the normal sheet pattern is greater than a thickness of the dummy sheet pattern.

16. The semiconductor device of claim 15, wherein a width of the lower insulating pattern in the first direction is greater than a width of the normal sheet pattern in the first direction.

17. The semiconductor device of claim 10, wherein:

a vertical level of an uppermost portion of the bottom semiconductor liner film is lower than a vertical level of the upper surface of the lower insulating pattern.

18. A semiconductor device, comprising:

a first lower pattern in a first area in which a PMOS is formed, wherein the first lower pattern extends in a first direction;

a second lower pattern, in a second area in which a NMOS is formed, wherein the second lower pattern extends in the first direction and is spaced from the first lower pattern in a second direction;

a first lower insulating pattern on the first lower pattern, the first lower insulating pattern in contact with an upper surface of the first lower pattern;

a second lower insulating pattern on the second lower pattern, the second lower insulating pattern in contact with an upper surface of the second lower pattern;

a plurality of first sheet patterns on the first lower insulating pattern and arranged in a third direction;

a plurality of second sheet patterns on the second lower insulating pattern and arranged in the third direction;

a plurality of gate structures on the first lower pattern and the second lower pattern, and spaced apart from each other in the first direction, wherein each of the plurality of gate structures includes a gate electrode and a gate insulating film;

a first source/drain pattern on the first lower pattern, the first source/drain pattern connected to the plurality of first sheet patterns; and a second source/drain pattern on the second lower pattern, the second source/drain pattern connected to the plurality of second sheet patterns, wherein a width of the first lower insulating pattern in the first direction is smaller than or equal to a width of the second lower insulating pattern in the first direction, wherein the second direction extends perpendicular to the first direction, and the third direction extends perpendicular to both the first direction and the second direction, wherein the first source/drain pattern includes:

a first lower filling semiconductor film on the first lower pattern, and a first upper filling semiconductor film on the first lower filling semiconductor film, wherein the first lower filling semiconductor film includes n-type impurities and the first upper filling semiconductor film includes p-type impurities, wherein the second source/drain pattern includes:

a second lower filling semiconductor film on the second lower pattern, and a second upper filling semiconductor film on the second lower filling semiconductor film, wherein the first source/drain pattern includes a first bottom semiconductor liner film extending along the first lower pattern between the first lower filling semiconductor film and the first lower pattern, wherein the first bottom semiconductor liner film includes a silicon germanium film, wherein a vertical level of an outermost edge of the first bottom semiconductor liner film is higher than a vertical level of the upper surface of the first lower pattern, and wherein a vertical level of a center of the first bottom semiconductor liner film is lower than the vertical level of the upper surface of the first lower pattern.

19. The semiconductor device of claim 18, wherein:

the second source/drain pattern further includes a second bottom semiconductor liner film extending along the second lower pattern between the second lower filling semiconductor film and the second lower pattern, a vertical level of an uppermost portion of the first bottom semiconductor liner film is lower than a vertical level of an upper surface of the first lower insulating pattern, a vertical level of an uppermost portion of the second bottom semiconductor liner film is lower than a vertical level of an upper surface of the second lower insulating pattern, the second bottom semiconductor liner film includes a silicon germanium film, and a thickness of the first bottom semiconductor liner film is greater than a thickness of the second bottom semiconductor liner film.

20. The semiconductor device of claim 18, wherein:

a vertical level of an uppermost portion of the first bottom semiconductor liner film is lower than a vertical level of an upper surface of the first lower insulating pattern, and the second source/drain pattern does not include a second bottom semiconductor liner film.

* * * * *